United States Patent
He et al.

(10) Patent No.: US 12,160,314 B2
(45) Date of Patent: Dec. 3, 2024

(54) FORWARD ERROR CORRECTION (FEC) CODE TYPE CONVERSION

(71) Applicant: Huawei Technologies Co., Ltd., Shenzhen (CN)

(72) Inventors: Xiang He, Beijing (CN); Xinyuan Wang, Beijing (CN); Jun Lin, Nanjing (CN); Zhongfeng Wang, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 160 days.

(21) Appl. No.: 17/525,189

(22) Filed: Nov. 12, 2021

(65) Prior Publication Data

US 2022/0077875 A1    Mar. 10, 2022

Related U.S. Application Data

(63) Continuation of application No. PCT/CN2019/096055, filed on Jul. 15, 2019.

(30) Foreign Application Priority Data

May 15, 2019    (WO) ................ PCT/CN2019/087058

(51) Int. Cl.
*H04L 1/00* (2006.01)
*H03M 13/00* (2006.01)
(Continued)

(52) U.S. Cl.
CPC ...... *H04L 1/0064* (2013.01); *H03M 13/1515* (2013.01); *H03M 13/2906* (2013.01); *H04L 1/0057* (2013.01); *H04L 1/0061* (2013.01)

(58) Field of Classification Search
CPC ............... H04W 52/48; H04B 7/15528; H04B 7/15521; H04L 1/0009; H04L 1/0064;
(Continued)

(56) References Cited

U.S. PATENT DOCUMENTS 5,699,367 A * 12/1997 Haartsen ............... H04L 1/1809
                                                              714/749
5,841,378 A    11/1998 Klayman et al.
(Continued)

FOREIGN PATENT DOCUMENTS

CN    1489308 A    4/2004
CN    1538315 A    10/2004
(Continued)

OTHER PUBLICATIONS

IEEE Std 802.3-2018, "IEEE Standard for Ethernet," IEEE Computer Society, Aug. 31, 2018, 5600 pages.
(Continued)

*Primary Examiner* — Justin R Knapp
(74) *Attorney, Agent, or Firm* — Conley Rose, P.C.

(57) ABSTRACT

A method includes: a first chip receives a first data stream from a second chip, where the first data stream is obtained through encoding by using a first forward error correction (FEC) code type; and the first chip re-encodes the first data stream at least once, to obtain a second data stream, where the second data stream is a concatenated FEC code stream obtained through encoding by using at least the first FEC code type and a second FEC code type.

58 Claims, 21 Drawing Sheets

(51) Int. Cl.
*H03M 13/15* (2006.01)
*H03M 13/29* (2006.01)

(58) Field of Classification Search
CPC ............... H04L 1/0057; H04L 1/0061; H03M 13/1515; H03M 13/2906
See application file for complete search history.

(56) References Cited

U.S. PATENT DOCUMENTS

| | | | |
|---|---|---|---|
| 7,418,644 B2 * | 8/2008 | Smith | H03M 13/3707 714/755 |
| 9,325,350 B2 * | 4/2016 | Prodan | H03M 13/2778 |
| 9,450,616 B2 | 9/2016 | Zhang et al. | |
| 10,630,430 B2 | 4/2020 | Kalhan et al. | |
| 10,804,999 B2 | 10/2020 | Kalhan | |
| 10,848,270 B2 | 11/2020 | Pan | |
| 10,903,937 B2 | 1/2021 | Smith et al. | |
| 2007/0104225 A1 | 5/2007 | Mizuochi et al. | |
| 2009/0122741 A1 | 5/2009 | Chang et al. | |
| 2009/0222709 A1 | 9/2009 | Lin et al. | |
| 2010/0146374 A1 | 6/2010 | Samuelson | |
| 2011/0173511 A1 | 7/2011 | Miyata et al. | |
| 2012/0020279 A1 | 1/2012 | Kim et al. | |
| 2012/0297266 A1 | 11/2012 | Xu et al. | |
| 2013/0216221 A1 | 8/2013 | Zhang et al. | |
| 2013/0311847 A1 | 11/2013 | Miyata | |
| 2014/0068385 A1 | 3/2014 | Zhang et al. | |
| 2014/0153625 A1 | 6/2014 | Vojcic et al. | |
| 2015/0162937 A1 | 6/2015 | Zhang et al. | |
| 2015/0180575 A1 | 6/2015 | Bruckman | |
| 2016/0080087 A1 | 3/2016 | Koike-Akino et al. | |
| 2016/0094311 A1 | 3/2016 | Su et al. | |
| 2016/0191277 A1 | 6/2016 | Li et al. | |
| 2017/0141912 A1 * | 5/2017 | Cech | G06F 21/755 |
| 2019/0068322 A1 | 2/2019 | Smith et al. | |
| 2019/0238212 A1 * | 8/2019 | Kalhan | H04W 52/48 |
| 2020/0021313 A1 | 1/2020 | Lu | |
| 2020/0177307 A1 | 6/2020 | Pan | |

FOREIGN PATENT DOCUMENTS

| | | |
|---|---|---|
| CN | 101288255 A | 10/2008 |
| CN | 101667887 A | 3/2010 |
| CN | 102111233 A | 6/2011 |
| CN | 102130742 A | 7/2011 |
| CN | 102870361 A | 1/2013 |
| CN | 103797742 A | 5/2014 |
| CN | 104115435 A | 10/2014 |
| CN | 104426631 A | 3/2015 |
| CN | 104541452 A | 4/2015 |
| CN | 106688201 A | 5/2017 |
| CN | 107786305 A | 3/2018 |
| CN | 108667553 A | 10/2018 |
| EP | 1002272 B1 | 9/2008 |
| EP | 2346197 A2 | 7/2011 |
| EP | 3293908 A1 | 3/2018 |
| EP | 3595208 A1 | 1/2020 |
| JP | 2011146932 A | 7/2011 |
| JP | 2017509170 A | 3/2017 |
| JP | 2018133726 A | 8/2018 |
| WO | 2001095502 A1 | 12/2001 |
| WO | 2012164929 A1 | 12/2012 |
| WO | 2015178315 A1 | 11/2015 |
| WO | 2018177152 A1 | 10/2018 |
| WO | 2019026981 A2 | 2/2019 |

OTHER PUBLICATIONS

IEEE Std 802.3bs, 2017, IEEE Standard for Ethernet, "Amendment 10: Media Access Control Parameters, Physical Layers, and Management Parameters for 200 Gb/s and 400 Gb/s Operation," IEEE Computer Society, 372 pages.

IEEE Std 802.3 , 2005, "Part 3: Carrier Sense Multiple Access with Collision Detection (CSMA/CD) Access Method and Physical Layer Specifications," IEEE Standard for Information technology—Telecommunications and information exchange between systems, Local and metropolitan area networks, Specific requirements, 2595 pages.

Liu, H., et al., 802.3cu, "Towards 400GBASE-FR4 Baseline Proposal," IEEE 802.3 100G/lane optical PHYs Study Group, Mar. 2019, 10 pages.

Stassar, P., IEEE P802.3ct, "Baseline considerations for 100G and 400G DWDM objectives," Task Force, Vancouver, Mar. 2019, 18 pages.

ITU-T G.975, Telecommunication Standardization Sector of ITU, Oct. 2000, "Series G: Transmission Systems and Media, Digital Systems and Networks Digital sections and digital line system, Optical fibre submarine cable systems, Forward error correction for submarine systems," Oct. 2000, 21 pages.

Mike A. Sluyski et al., "Implementation Agreement for 400ZR", IA # OIF-400ZR 0.10-Draft IA for 400ZR, Nov. 2, 2018, 80 pages.

Gary Nicholl et al., "Inverse RS-FEC Baseline Proposal," IEEE P802.3ct Task Force, San Diego, Mar. 2019, 8 pages.

* cited by examiner

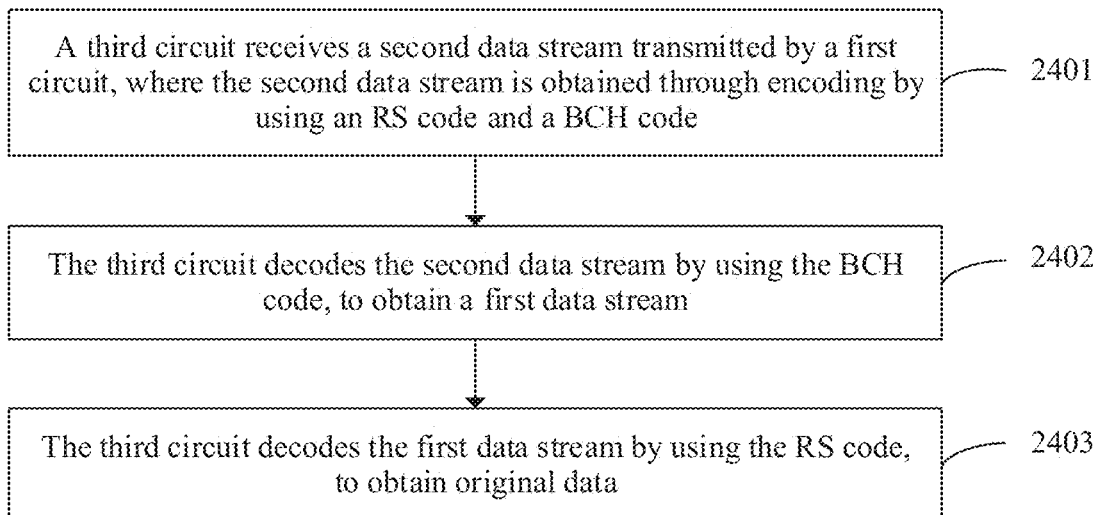

FORWARD ERROR CORRECTION (FEC) CODE TYPE CONVERSION

CROSS-REFERENCE TO RELATED APPLICATIONS

This is a continuation of Int'l Patent App. No. PCT/CN2019/096055, filed on Jul. 15, 2019, which claims priority to Int'l Patent App. No. PCT/CN2019/087058, filed on May 15, 2019, both of which are incorporated by reference.

FIELD

This disclosure relates to the field of communications technologies, and in particular, to a data transmission method, an encoding method, a decoding method, an apparatus, a device, and a storage medium.

BACKGROUND

A forward error correction (FEC) code can provide error correction protection for data that is being transmitted, so that a rate and a distance of transmitting data on a channel can be increased. In a data transmission process in which the FEC code is used, a sending device may encode original data by using a specific FEC code type, and send encoded data to a receiving device. The receiving device may decode the received data by using the same FEC code type, to obtain the original data.

In some scenarios, the FEC code type may need to be converted in the data transmission process. For example, to adapt to high-rate and/or long-distance data transmission, when an original FEC code type used by an original data transmission interface cannot meet a data transmission requirement, the FEC code type needs to be converted, so that the original FEC code type is replaced with a higher-gain FEC code type. However, an FEC code type conversion process usually increases a delay in the data transmission process and power consumption of a data transmission device. This affects data transmission efficiency.

In addition, an Ethernet interface is a widely used data transmission interface worldwide. As a rate is rapidly increased, FEC plays an increasingly important role in the Ethernet. As the rate and the transmission distance are continuously increased, a requirement for FEC becomes increasingly high.

SUMMARY

Embodiments provide a data transmission method, an encoding method, a decoding method, an apparatus, a device, and a storage medium, to resolve a problem in a related technology. Technical solutions are as follows.

According to a first aspect, an embodiment provides a data transmission method. The method includes: A first chip receives a first data stream sent by a second chip, where the first data stream is a data stream obtained through encoding by using an FEC code type; the first chip re-encodes the first data stream at least once, to obtain a second data stream, where the second data stream is a concatenated FEC code stream obtained through encoding by using at least the first FEC code type and a second FEC code type; and the first chip sends the second data stream to a third chip. It can be learned that, for the first data stream that is obtained through encoding by using the first FEC code type and that is sent by the second chip to the first chip, the first chip does not need to first decode the first data stream by using the first FEC code type and then re-encode original data into a higher-gain FEC code type. Instead, the first chip may re-encode the first data stream at least once by using at least the second FEC code type, to obtain the second data stream formed by concatenating at least the first FEC code type and the second FEC code type, so as to obtain a higher gain. Therefore, an FEC code type conversion process is simplified, both a delay and device power consumption that are required during FEC code type conversion are reduced, and data transmission efficiency is improved.

With reference to any implementation of the first aspect, in a first possible implementation of the first aspect, the first FEC code comprises: an RS code, a Bose-Chaudhuri-Hocquenghem (BCH) code, an extended BCH (eBCH) code, a Hamming Code, or an extended Hamming Code, a staircase code, an LDPC code, a Turbo code, or a turbo product code (TPC). It can be learned that the first chip may support encoding based on a plurality of different first FEC code types, to obtain a concatenated FEC code stream.

With reference to any implementation of the first aspect, in a second possible implementation of the first aspect, the second FEC code comprises: a BCH code, an eBCH code, a Hamming Code, or an extended Hamming Code, an RS code, a staircase code, an LDPC code, a Turbo code, or a TPC. It can be learned that the first chip may support encoding based on the first FEC code type and a plurality of different second FEC code types, to obtain a concatenated FEC code.

With reference to any implementation of the first aspect, in a third possible implementation of the first aspect, that the first chip re-encodes the first data stream at least once, to form a second data stream includes: The first chip distributes the first data stream, to form n third data streams, where data of a same codeword block in the first data stream is distributed to different third data streams; and the first chip re-encodes each of the plurality of third data streams at least once, to form the second data stream. It can be learned that the data in the same codeword block in the first data stream may be encoded into a plurality of different codeword blocks in the second data stream, so that the concatenated FEC code has a stronger error correction capability.

With reference to the third implementation of the first aspect, in a fourth possible implementation of the first aspect, k codeword blocks identified from the first data stream are distributed to the n third data streams, and data that belongs to the k codeword blocks in each of the third data streams is encoded into one codeword block in the second data stream; and a total data volume included in the k first codeword blocks in the first data stream is equal to a payload data volume included in n second codeword blocks in the second data stream. Thus, the n second codeword blocks may be directly decoded into the original data based on the second FEC code type and the first FEC code type. This helps perform decoding operations on a same chip based on the first FEC code type and the second FEC code type. In some embodiments, a total data volume included in the k first codeword blocks in the first data stream is not equal to a payload data volume included in n second codeword blocks in the second data stream.

With reference to the third implementation of the first aspect, in a fifth possible implementation of the first aspect, data in the first data stream is distributed by FEC symbol block, and data in a same FEC symbol block in the first data stream is encoded into a same codeword block in the second data stream. It can be learned that the first chip may perform distribution processing on the first data stream at a symbol block granularity.

With reference to the third implementation of the first aspect, in a sixth possible implementation of the first aspect, data in the first data stream is distributed by bit stream, and data in the third data stream is encoded by bit stream. It can be learned that the first chip may perform distribution processing on the first data stream at a bit granularity.

With reference to any implementation of the first aspect, in a seventh possible implementation of the first aspect, the first chip and the second chip are located in a first data transmission device, the third chip is located in a second data transmission device, the first chip is an electrical chip, the second chip is a component that uses an Ethernet interface, and the third chip is an electrical chip. It can be learned that the first data transmission device may encode, by using the electrical chip, the first data stream that is based on the first FEC code type and that is output by the component using the Ethernet interface into the second data stream formed by concatenating at least the first FEC code type and the second FEC code type, and then send the second data stream to the second data transmission device. In this way, data is transmitted between the first data transmission device and the second data transmission device by using the concatenated FEC code.

With reference to any possible implementation of the first aspect, in an eighth possible implementation of the first aspect, the first data stream is transmitted between the second chip and the first chip through a physical lane with interference. It can be learned that, for the first data stream in which an error occurs when the first data stream is transmitted through the physical lane with interference, the first chip may directly re-encode the first data stream at least once without performing decoding and error correction on the first data stream, to form the concatenated second data stream.

According to a second aspect, an embodiment provides a data transmission method. The method includes: A first chip receives a second data stream sent by a second chip, where the second data stream is a concatenated FEC code stream obtained through encoding by using at least a first FEC code type and a second FEC code type; the first chip decodes the second data stream at least once, to form a first data stream, where the first data stream is a data stream obtained through encoding by using the first FEC code type; and the first chip sends the first data stream to a third chip. It can be learned that, for the second data stream that is formed by concatenating at least the first FEC code type and the second FEC code type and that is sent by the second chip to the first chip, the first chip may decode the second data stream by using an FEC code type other than the first FEC code type, to form the first data stream that is obtained through encoding by using the first FEC code type, and send the first data stream to the third chip. In this way, the first chip does not need to decode the second data stream into original data, then re-encode the original data into a data stream that is based on the first FEC code type, and send the data stream to the third chip. Therefore, an FEC code type conversion process is simplified, both a delay and device power consumption that are required during FEC code type conversion are reduced, and data transmission efficiency is improved.

With reference to any possible implementation of the second aspect, in a first possible implementation of the second aspect, the first FEC code comprises: an RS code, a BCH code, an eBCH code, a Hamming Code, or an extended Hamming Code, a staircase code, an LDPC code, a Turbo code, or a TPC.

With reference to any possible implementation of the second aspect, in a second possible implementation of the second aspect, the second FEC code comprises: a BCH code, an eBCH code, a Hamming Code, or an extended Hamming Code, an RS code, a staircase code, an LDPC code, a Turbo code, or a TPC. It can be learned that the first chip may support decoding based on a plurality of different second FEC code types.

With reference to any possible implementation of the second aspect, in a third possible implementation of the second aspect, the first data stream is used to be decoded by the third chip based on the first FEC code type. It can be learned that the first chip may support decoding of a concatenated FEC code, to output a plurality of different first FEC code types.

With reference to any possible implementation of the second aspect, in a fourth possible implementation of the second aspect, the second chip is located in a first data transmission device, the first chip and the third chip are located in a second data transmission device, the first chip is an electrical chip, the second chip is an electrical chip, and the third chip is a component that uses an Ethernet interface. It can be learned that, for the second data stream that is formed by concatenating at least the first FEC code type and the second FEC code type and that is sent by the first data transmission device to the second data transmission device, the first data transmission device may decode, by using the electrical chip based on the second FEC code type, the second data stream into the first data stream that is based on the first FEC code type, and then send the first data stream that is based on the first FEC code type to the component that uses the Ethernet interface. In this way, data is transmitted between the first data transmission device and the second data transmission device by using the concatenated FEC code.

With reference to any possible implementation of the second aspect, in a fifth possible implementation of the second aspect, the first data stream is transmitted between the first chip and the third chip by using a physical medium. It can be learned that the first chip does not decode the second data stream into the original data. Instead, the first chip may decode, by using an FEC code type other than the first FEC code type, the second data stream into the first data stream obtained through encoding by using the first FEC code type. In this way, the first data stream is transmitted to the third chip by using a physical medium with interference, and the third chip decodes the first data stream to obtain the original data. The physical medium may be, for example, an optical fiber, an optical waveguide, a circuit, air, or the like.

According to a third aspect, an embodiment provides a data transmission apparatus applied to a first chip. The apparatus includes a receiver, an encoder, and a transmitter. The receiver is configured to receive a first data stream sent by a second chip, where the first data stream is a data stream obtained through encoding by using an FEC code type. The encoder is configured to re-encode the first data stream at least once, to obtain a second data stream, where the second data stream is a concatenated FEC code stream obtained through encoding by using at least the first FEC code type and a second FEC code type. The transmitter is configured to send the second data stream to a third chip.

With reference to any implementation of the third aspect, in a first possible implementation of the third aspect, the first FEC code comprises: an RS code, a BCH code, an eBCH code, a Hamming Code, or an extended Hamming Code, a staircase code, an LDPC code, a Turbo code, or a TPC.

With reference to any implementation of the third aspect, in a second possible implementation of the third aspect, the second FEC code comprises: a BCH code, an eBCH code, a Hamming Code, or an extended Hamming Code, an RS code, a staircase code, an LDPC code, a Turbo code, or a TPC.

With reference to any implementation of the third aspect, in a third possible implementation of the third aspect, the encoder is further configured to: distribute the first data stream, to form n third data streams, where data of a same codeword block in the first data stream is distributed to different third data streams; and re-encode each of the plurality of third data streams at least once, to form the second data stream.

With reference to the third implementation of the third aspect, in a fourth possible implementation of the third aspect, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

With reference to the third implementation of the third aspect, in a fifth possible implementation of the third aspect, data in the first data stream is distributed by FEC symbol block, and data in a same FEC symbol block in the first data stream is encoded into a same codeword block in the second data stream.

With reference to the third implementation of the third aspect, in a sixth possible implementation of the third aspect, data in the first data stream is distributed by bit stream, and data in the third data stream is encoded by bit stream.

With reference to any implementation of the third aspect, in a seventh possible implementation of the third aspect, the first chip and the second chip are located in a first data transmission device, the third chip is located in a second data transmission device, the first chip is an electrical chip, the second chip is a component that uses an Ethernet interface, and the third chip is an electrical chip.

With reference to any possible implementation of the third aspect, in an eighth possible implementation of the third aspect, the first data stream is transmitted between the second chip and the first chip by using a physical medium. It can be learned that, for the first data stream in which an error occurs when the first data stream is transmitted by using a physical medium with interference, the first chip may directly re-encode the first data stream at least once without performing decoding and error correction on the first data stream, to form the concatenated second data stream.

It may be understood that the data transmission apparatus provided in the third aspect corresponds to the data transmission method provided in the first aspect. Therefore, for technical effects of various possible implementations of the data transmission apparatus provided in the third aspect, refer to the description of the data transmission method provided in the first aspect.

According to a fourth aspect, an embodiment provides a data transmission apparatus applied to a first chip. The apparatus includes a receiver, a decoder, and a transmitter. The receiver is configured to receive a second data stream sent by a second chip, where the second data stream is a concatenated FEC code stream obtained through encoding by using at least a first FEC code type and a second FEC code type. The decoder is configured to decode the second data stream at least once, to form a first data stream, where the first data stream is a data stream obtained through encoding by using the first FEC code type. The transmitter is configured to send the first data stream to a third chip.

With reference to any possible implementation of the fourth aspect, in a first possible implementation of the fourth aspect, the first FEC code comprises: an RS code, a BCH code, an eBCH code, a Hamming Code, or an extended Hamming Code, a staircase code, an LDPC code, a Turbo code, or a TPC.

With reference to any possible implementation of the fourth aspect, in a second possible implementation of the fourth aspect, the second FEC code comprises: a BCH code, an eBCH code, a Hamming Code, or an extended Hamming Code, an RS code, a staircase code, an LDPC code, a Turbo code, or a TPC.

With reference to any possible implementation of the fourth aspect, in a third possible implementation of the fourth aspect, the first data stream is used to be decoded by the third chip based on the first FEC code type.

With reference to any possible implementation of the fourth aspect, in a fourth possible implementation of the fourth aspect, the second chip is located in a first data transmission device, the first chip and the third chip are located in a second data transmission device, the first chip is an electrical chip, the second chip is an electrical chip, and the third chip is a component that uses an Ethernet interface.

With reference to any possible implementation of the fourth aspect, in a fifth possible implementation of the fourth aspect, the first data stream is transmitted between the first chip and the third chip by using a physical medium. It can be learned that the first chip does not decode the second data stream into original data. Instead, the first chip may decode, by using an FEC code type other than the first FEC code type, the second data stream into the first data stream obtained through encoding by using the first FEC code type. In this way, the first data stream is transmitted to the third chip by using a physical medium with interference, and the third chip decodes the first data stream to obtain the original data.

It may be understood that the data transmission apparatus provided in the fourth aspect corresponds to the data transmission method provided in the second aspect. Therefore, for technical effects of various possible implementations of the data transmission apparatus provided in the fourth aspect, refer to the description of the data transmission method provided in the second aspect.

According to a fifth aspect, an embodiment further provides a communication method. The communication method includes the data transmission method according to any implementation of the first aspect and the data transmission method according to any implementation of the second aspect.

According to a sixth aspect, an embodiment further provides a communications system. The communications system includes the data transmission apparatus according to any implementation of the third aspect and the data transmission apparatus according to any implementation of the fourth aspect.

According to a seventh aspect, an embodiment further provides a network device. The network device includes the data transmission apparatus according to any implementation of the third aspect.

According to an eighth aspect, an embodiment further provides a network device. The network device includes the data transmission apparatus according to any implementation of the fourth aspect.

According to a ninth aspect, an embodiment further provides a computer program product. When the computer program product is run on a computer, the computer is enabled to perform the data transmission method according to any implementation of the first aspect or the data transmission method according to any implementation of the second aspect.

According to a tenth aspect, an embodiment further provides a computer-readable storage medium. The computer-readable storage medium stores instructions. When the instructions are run on a computer or a processor, the computer or the processor is enabled to perform the data transmission method according to any possible implementation of the first aspect or the data transmission method according to any possible implementation of the second aspect.

According to an eleventh aspect, a data encoding method is provided. The method includes: A first circuit receives a first data stream transmitted by a second circuit through an Ethernet interface, where the first data stream is obtained by encoding original data by using an RS code; and the first circuit performs BCH encoding on the first data stream, to obtain a second data stream. Two-level coding is implemented based on RS code and BCH code, so that a gain is higher, and a data transmission distance and a data transmission rate are increased.

With reference to the eleventh aspect, in a first possible implementation of the eleventh aspect, that a first circuit receives a first data stream transmitted by a second circuit through an Ethernet interface includes: The first circuit receives, from a plurality of physical lanes, the first data stream transmitted by the second circuit through the Ethernet interface; and the first circuit includes one or more BCH encoders, and that the first circuit performs BCH encoding on the first data stream, to obtain a second data stream includes: When a quantity of BCH encoders included in the first circuit is consistent with a quantity of physical lanes, where one BCH encoder is corresponds to one physical lane, the first circuit performs, by using the one or more BCH encoders, BCH encoding on the first data stream transmitted on a corresponding physical lane, to obtain the second data stream. When the quantity of BCH encoders is consistent with the quantity of physical lanes, the BCH encoders may be in a one-to-one correspondence with the physical lanes, so that a plurality of BCH encoders can perform encoding in parallel. This increases an encoding speed.

With reference to the eleventh aspect, in a second possible implementation of the eleventh aspect, that a first circuit receives a first data stream transmitted by a second circuit through an Ethernet interface includes: The first circuit receives, from a plurality of physical lanes, the first data stream transmitted by the second circuit through the Ethernet interface; and the first circuit includes one or more BCH encoders and further includes a scheduler, and that the first circuit performs BCH encoding on the first data stream, to obtain a second data stream includes: When a quantity of BCH encoders included in the first circuit is inconsistent with a quantity of physical lanes, the first circuit schedules, by using the scheduler, a corresponding BCH encoder to perform BCH encoding on the first data stream, to obtain the second data stream. No matter whether the quantity of BCH encoders is less than the quantity of physical lanes or the quantity of BCH encoders is greater than the quantity of physical lanes, the BCH encoder may be scheduled by using the scheduler, so as to connect the BCH encoder to a corresponding physical lane. In this way, BCH encoding is performed on the first data stream transmitted through the physical lane.

With reference to any possible implementation of the eleventh aspect, in a third possible implementation of the eleventh aspect, the performing BCH encoding on the first data stream includes: filling data in the first data stream into a corresponding BCH codeword, where a reference quantity of consecutive symbols included in each BCH codeword are from different RS codewords.

With reference to the third possible implementation of the eleventh aspect, in a fourth possible implementation of the eleventh aspect, after the data in the first data stream is interleaved based on the reference quantity of RS codewords, to obtain symbol stream data, the symbol stream data is output to a plurality of virtual lanes, the symbol stream data is bit-multiplexed based on the quantity of physical lanes, and bit-multiplexed symbol stream data is transmitted to the first circuit through the plurality of physical lanes. Because the first data stream on the plurality of physical lanes may arrive at the first circuit at different times, before the filling data in the first data stream into a corresponding BCH codeword, the method further includes: The first circuit demultiplexes the first data stream, to restore data on all virtual lanes, and aligns the data on all the virtual lanes, to obtain aligned data; and the filling data in the first data stream into a corresponding BCH codeword includes: filling the aligned data into the corresponding BCH codeword. Before BCH encoding is performed, the data on all the virtual lanes is first aligned, and then the aligned data is filled into the corresponding BCH codeword, so as to improve accuracy of BCH encoding.

With reference to the third or the fourth possible implementation of the eleventh aspect, in a fifth possible implementation of the eleventh aspect, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: sequentially filling the first half of data in each row of the first data stream into the first third quantity of BCH codewords in the second quantity of BCH codewords, and sequentially filling the second half of data in each row of the first data stream into the last third quantity of BCH codewords in the second quantity of BCH codewords, where the third quantity is half of the second quantity, and a first quantity of consecutive symbols included in each BCH codeword are from different RS codewords.

With reference to the fifth possible implementation of the eleventh aspect, in a sixth possible implementation of the eleventh aspect, the first target quantity is 544, the first quantity is 2, the second quantity is 32, and the second target quantity is 360. The filling data in the first data stream into a corresponding BCH codeword includes: sequentially filling the first half of data in each row of the first data stream into the first 16 BCH codewords in 32 BCH codewords, and sequentially filling the second half of data in each row of the first data stream into the last 16 BCH codewords in the 32 BCH codewords, where two consecutive symbols included in each BCH codeword are from different RS codewords.

With reference to the third or the fourth possible implementation of the eleventh aspect, in a seventh possible implementation of the eleventh aspect, the first data stream includes a first quantity of RS codewords, each RS codeword includes a first target quantity of symbols, the data in the first data stream is interleaved based on the first quantity of RS codewords, and symbols at the beginning or the end of each column of data in the first data stream are permuted. Each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: sequentially filling each column of data of the first data stream into the second quantity of BCH codewords, where a first quantity of consecutive symbols included in each BCH codeword are from different RS codewords.

With reference to the seventh possible implementation of the eleventh aspect, in an eighth possible implementation of the eleventh aspect, the first target quantity is 544, the first quantity is 2, the second quantity is 32, and the second target quantity is 360. The filling data in the first data stream into a corresponding BCH codeword includes: sequentially filling each column of data of the first data stream into 32 BCH codewords, where two consecutive symbols included in each BCH codeword are from different RS codewords.

With reference to the third or the fourth possible implementation of the eleventh aspect, in a ninth possible implementation of the eleventh aspect, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: de-interleaving the data in the first data stream, to obtain original RS codewords; interleaving the original RS codewords based on a fourth quantity of RS codewords, to obtain interleaved data, where the fourth quantity is greater than the first quantity; and sequentially filling each row of data of the interleaved data into the second quantity of BCH codewords, where a fourth quantity of consecutive symbols included in each BCH codeword are from different RS codewords.

In the fifth to ninth possible implementations of the eleventh aspect, the first target quantity may be determined based on an RS code type. For example, for RS (544, 514), the first target quantity is 544, and each RS codeword includes 544 symbols. The second target quantity may be determined based on the first target quantity. For RS (544, 514), BCH (360, 340) may be used, and the second target quantity is 360. For another example, for RS (528, 514), the first target quantity is 528, and each RS codeword includes 528 symbols. In addition, in the method provided in this embodiment, two-level coding based on RS code and BCH code is used. A specific RS code type and a specific BCH code type are not limited in this embodiment. In addition, the first target quantity of symbols and the second target quantity of symbols may be 10-bit symbols, or may be 1-bit symbols or symbols having another length. A length of a symbol is not limited in this embodiment.

With reference to any possible implementation of the eleventh aspect, in a tenth possible implementation of the eleventh aspect, after the first circuit performs BCH encoding on the first data stream, to obtain the second data stream, the method further includes: transmitting the second data stream to a third circuit by using a medium through the plurality of physical lanes, or transmitting the second data stream to the third circuit by using the medium through one physical lane in a time division multiplexing mode.

According to a twelfth aspect, a data decoding method is provided. The method includes: A third circuit receives second data streams transmitted by a first circuit, where the second data streams are obtained through encoding by using an RS code and a BCH code; decodes the second data streams by using the BCH code, to obtain a first data stream; and decodes the first data stream by using the RS code, to obtain original data.

The first circuit uses two-level coding that is based on RS code and BCH code. Therefore, a gain is increased, so that a data transmission distance can be longer and a data transmission rate can be higher. After data is transmitted to the third circuit, the third circuit decodes the data based on a corresponding RS code and BCH code, so that the data can be successfully decoded.

With reference to the twelfth aspect, in a first possible implementation of the twelfth aspect, that a third circuit receives second data streams transmitted by a first circuit includes: receiving, by using a medium, the second data streams transmitted by the first circuit through a plurality of physical lanes, or receiving, by using the medium, the second data streams transmitted by the first circuit through one physical lane in a time division multiplexing mode. The first circuit may flexibly use one or more physical lanes to transmit the second data streams, and the third circuit may receive the second data streams in a manner in which the first circuit sends the second data streams.

With reference to the first possible implementation of the twelfth aspect, in a second possible implementation of the twelfth aspect, before the decoding the second data streams by using the BCH code, to obtain a first data stream, the method further includes: demultiplexing the second data streams when the second data streams transmitted by the first circuit through one physical lane in a time division multiplexing mode are received by using the medium; and the decoding the second data streams by using the BCH code, to obtain a first data stream includes: decoding demultiplexed data streams by using the BCH code, to obtain the first data stream.

With reference to the second possible implementation of the twelfth aspect, in a third possible implementation of the twelfth aspect, before the decoding the second data streams by using the BCH code, to obtain a first data stream, the method further includes: aligning the demultiplexed second data streams; and the decoding demultiplexed second data streams by using the BCH code, to obtain the first data stream includes: decoding aligned second data streams by using the BCH code, to obtain the first data stream. Before BCH decoding is performed, the demultiplexed second data streams are first aligned, and then the aligned second data streams are decoded by using the BCH code, so as to ensure accuracy of BCH decoding.

According to a thirteenth aspect, a data encoding apparatus is provided. The apparatus includes: a receiving module configured to receive a first data stream transmitted by a second circuit through an Ethernet interface, where the first data stream is obtained by encoding original data by using an RS code; and an encoding module configured to perform BCH encoding on the first data stream, to obtain a second data stream.

With reference to the thirteenth aspect, in a first possible implementation of the thirteenth aspect, the receiving module is configured to receive, from a plurality of physical lanes, the first data stream transmitted by the second circuit through the Ethernet interface. The apparatus includes one or more BCH encoders, and the encoding module is configured to: when a quantity of included BCH encoders is consistent with a quantity of physical lanes, where one BCH encoder is corresponds to one physical lane, perform, by using the one or more BCH encoders, BCH encoding on the first data stream transmitted on a corresponding physical lane, to obtain the second data stream.

With reference to the thirteenth aspect, in a second possible implementation of the thirteenth aspect, the receiving module is configured to receive, from a plurality of physical lanes, the first data stream transmitted by the second circuit through the Ethernet interface. The apparatus includes one or more BCH encoders and further includes a scheduler, and the encoding module is configured to: when a quantity of BCH encoders included in the first apparatus is inconsistent with a quantity of physical lanes, schedule, by using the scheduler, a corresponding BCH encoder to perform BCH encoding on the first data stream, to obtain the second data stream.

With reference to any possible implementation of the thirteenth aspect, in a third possible implementation of the thirteenth aspect, the encoding module is configured to fill data in the first data stream into a corresponding BCH codeword, where a reference quantity of consecutive symbols included in each BCH codeword are from different RS codewords.

With reference to the third possible implementation of the thirteenth aspect, in a fourth possible implementation of the thirteenth aspect, after the data in the first data stream is interleaved based on the reference quantity of RS codewords, to obtain symbol stream data, the symbol stream data is output to a plurality of virtual lanes, the symbol stream data is bit-multiplexed based on the quantity of physical lanes, and bit-multiplexed symbol stream data is transmitted to the apparatus through the plurality of physical lanes. The apparatus further includes: a demultiplexing module configured to demultiplex the first data stream, to restore data on all virtual lanes; and an alignment module configured to align the data on all the virtual lanes, to obtain aligned data. The encoding module is configured to fill the aligned data into the corresponding BCH codeword.

With reference to the third or the fourth possible implementation of the thirteenth aspect, in a fifth possible implementation of the thirteenth aspect, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity. The encoding module is configured to: sequentially fill the first half of data in each row of the first data stream into the first third quantity of BCH codewords in the second quantity of BCH codewords, and sequentially fill the second half of data in each row of the first data stream into the last third quantity of BCH codewords in the second quantity of BCH codewords, where the third quantity is half of the second quantity, and a first quantity of consecutive symbols included in each BCH codeword are from different RS codewords.

With reference to the fifth possible implementation of the thirteenth aspect, in a sixth possible implementation of the thirteenth aspect, the first target quantity is 544, the first quantity is 2, the second quantity is 32, and the second target quantity is 360. The encoding module is configured to: sequentially fill the first half of data in each row of the first data stream into the first 16 BCH codewords in 32 BCH codewords, and sequentially fill the second half of data in each row of the first data stream into the last 16 BCH codewords in the 32 BCH codewords, where two consecutive symbols included in each BCH codeword are from different RS codewords.

With reference to the third or the fourth possible implementation of the thirteenth aspect, in a seventh possible implementation of the thirteenth aspect, the first data stream includes a first quantity of RS codewords, each RS codeword includes a first target quantity of symbols, the data in the first data stream is interleaved based on the first quantity of RS codewords, and symbols at the beginning or the end of each column of data in the first data stream are permuted. Each BCH encoder corresponds to a second quantity of BCH codewords, each BCH codeword includes a second target quantity of symbols, the second target quantity is determined based on the first target quantity, and the second quantity is determined based on the first quantity. The encoding module is configured to sequentially fill each column of data of the first data stream into the second quantity of BCH codewords, where a first quantity of consecutive symbols included in each BCH codeword are from different RS codewords.

With reference to the seventh possible implementation of the thirteenth aspect, in an eighth possible implementation of the thirteenth aspect, the first target quantity is 544, the first quantity is 2, the second quantity is 32, and the second target quantity is 360. The encoding module is configured to sequentially fill each column of data of the first data stream into 32 BCH codewords, where two consecutive symbols included in each BCH codeword are from different RS codewords.

With reference to the third or the fourth possible implementation of the thirteenth aspect, in a ninth possible implementation of the thirteenth aspect, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity. The encoding module is configured to: de-interleave the data in the first data stream, to obtain original RS codewords; interleave the original RS codewords based on a fourth quantity of RS codewords, to obtain interleaved data, where the fourth quantity is greater than the first quantity; and sequentially fill each row of data of the interleaved data into the second quantity of BCH codewords, where a fourth quantity of consecutive symbols included in each BCH codeword are from different RS codewords.

With reference to any possible implementation of the thirteenth aspect, in a tenth possible implementation of the thirteenth aspect, the apparatus further includes: a transmission module configured to: transmit the second data stream to a third circuit by using a medium through the plurality of physical lanes, or transmit the second data stream to the third circuit by using the medium through one physical lane in a time division multiplexing mode.

According to a fourteenth aspect, a data decoding apparatus is provided. The apparatus includes: a receiving module configured to receive second data streams transmitted by a first circuit, where the second data streams are obtained through encoding by using an RS code and a BCH code; a first decoding module configured to decode the second data streams by using the BCH code, to obtain a first data stream; and a second decoding module configured to decode the first data stream by using the RS code, to obtain original data.

With reference to the fourteenth aspect, in a first possible implementation of the fourteenth aspect, the receiving module is configured to: receive, by using a medium, the second data streams transmitted by the first circuit through a plurality of physical lanes, or receive, by using the medium, the second data streams transmitted by the first circuit through one physical lane in a time division multiplexing mode.

With reference to the first possible implementation of the fourteenth aspect, in a second possible implementation of the fourteenth aspect, the apparatus further includes: a demultiplexing module configured to demultiplex the second data streams when the second data streams transmitted by the first circuit through one physical lane in a time division multiplexing mode are received by using the medium. The first decoding module is configured to decode demultiplexed data streams by using the BCH code, to obtain the first data stream.

With reference to the second possible implementation of the fourteenth aspect, in a third possible implementation of the fourteenth aspect, the apparatus further includes: an alignment module configured to align the demultiplexed second data streams. The first decoding module is configured to decode aligned second data streams by using the BCH code, to obtain the first data stream.

According to any one of the eleventh to fourteenth aspects or the possible implementation of these aspects, the BCH code may be replaced with an eBCH code, a Hamming Code, or an extended Hamming Code; accordingly, the BCH encoder can replaced with an extended eBCH code encoder, a Hamming Code encoder, or an extended Hamming Code encoder.

According to a fifteenth aspect, a data transmission device is provided. The device includes a memory and a processor. The memory stores at least one instruction, and the at least one instruction is loaded and executed by the processor, to implement the method according to any possible implementation of the eleventh aspect or the twelfth aspect.

According to a sixteenth aspect, a communications apparatus is provided. The apparatus includes a transceiver, a memory, and a processor. The transceiver, the memory, and the processor communicate with each other through an internal connection path. The memory is configured to store instructions. The processor is configured to execute the instructions stored in the memory, to control the transceiver to receive a signal, and control the transceiver to send a signal. In addition, when the processor executes the instructions stored in the memory, the processor is enabled to perform the method according to any possible implementation of the eleventh aspect or the twelfth aspect.

Optionally, there are one or more processors, and there are one or more memories.

Optionally, the memory may be integrated with the processor, or the memory and the processor are separately disposed.

In a specific implementation process, the memory may be a non-transitory memory, such as a read-only memory (ROM). The memory and the processor may be integrated into one chip, or may be disposed in different chips. A type of the memory and a manner in which the memory and the processor are disposed are not limited in the embodiments.

According to a seventeenth aspect, a computer program (product) is provided. The computer program (product) includes computer program code; and when the computer program code is run by a computer, the computer is enabled to perform the method according to any possible implementation of the eleventh aspect or the twelfth aspect.

According to an eighteenth aspect, a readable storage medium is provided. The readable storage medium stores a program or instructions. When the program or the instructions is/are run on a computer, the method according to any possible implementation of the eleventh aspect or the twelfth aspect is performed.

According to a nineteenth aspect, a chip is provided. The chip includes a processor. The processor is configured to invoke and run instructions stored in a memory, so that a communications device on which the chip is installed performs the method according to any possible implementation of the eleventh aspect or the twelfth aspect.

According to a twentieth aspect, another chip is provided. The chip includes an input interface, an output interface, a processor, and a memory. The input interface, the output interface, the processor, and the memory are connected to each other through an internal connection path. The processor is configured to execute code in the memory, and when the code is executed, the processor is configured to perform the method according to any possible implementation of the eleventh aspect or the twelfth aspect.

BRIEF DESCRIPTION OF THE DRAWINGS

FIG. 23 is a schematic diagram of a BCH encoding process according to an embodiment;

FIG. 24 is a flowchart of a data decoding method according to an embodiment;

DETAILED DESCRIPTION

Figure 1:
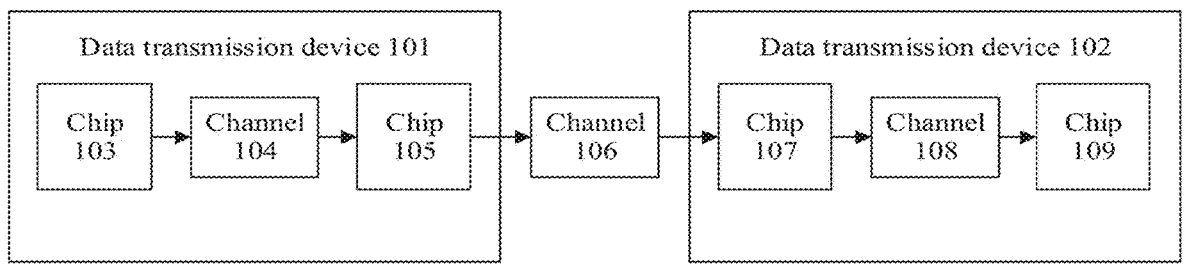
FIG. 1 is a schematic diagram of an example of a scenario according to an embodiment.

Terms used in implementations of this disclosure are merely used to explain embodiments, but are not intended to limit this disclosure.

In a data transmission process in which an FEC code is used, a sending device may encode original data by using a specific FEC code type, and then send an FEC code obtained through encoding to a receiving device. The receiving device may decode the received FEC code by using the same FEC code type, to obtain the original data. In this way, even if an error occurs at some locations in the FEC code on a transmission channel, the receiving device may obtain the original data that exists before the error occurs by performing reverse calculation based on a parity bit in the FEC code during decoding. This implements an error correction function.

In some scenarios, the FEC code type may need to be converted in the data transmission process. For example, as an enhanced FEC code type, a concatenated FEC code is a multi-level FEC code obtained by performing code type construction on one or more basic FEC code types. This can provide stronger error correction protection for transmitted data. Therefore, the concatenated FEC code may be used to transmit data between devices, to cope with noise introduced when the data is transmitted at a high rate or over a long distance. However, an original FEC code type used by an original data transmission interface of a device is a code type specified in a standard. For example, original Ethernet interfaces of many devices support only a Reed-Solomon (RS) code. When the device is applied to a data transmission scenario with a higher rate or a longer distance than that specified in the standard, the FEC code type specified in the standard cannot meet a requirement. Therefore, the device needs to convert to-be-transmitted data from the original FEC code type to a higher-gain FEC code type. Generally, when the FEC code type is converted, data encoded by using the original FEC code type needs to be decoded into original data, and then the original data is encoded by using a new FEC code type. However, such a conversion process not only causes additional power consumption to a data transmission device, but also increases a delay in the data transmission process.

In the embodiments, a concatenated FEC code is an FEC code type that can provide a high gain for high-rate and/or long-distance data transmission, and the concatenated FEC code is obtained by concatenating a plurality of levels of FEC code types. Therefore, in data transmission between two chips, when a chip receives a first data stream obtained through encoding by using a first FEC code type, the chip does not need to first decode the first data stream by using the first FEC code type and then re-encode original data into a concatenated FEC code. Instead, the chip may re-encode the first data stream at least once by using at least a second FEC code type, to obtain a second data stream formed by concatenating at least the first FEC code type and the second FEC code type, so as to obtain a higher gain. Therefore, an FEC code type conversion process is simplified, both a delay and device power consumption that are required during FEC code type conversion are reduced, and data transmission efficiency is improved.

For example, the embodiments may be applied to a scenario shown in FIG. 1. A chip 103 and a chip 105 are disposed in a data transmission device 101, and a chip 107 and a chip 109 are disposed in a data transmission device 102. It is assumed that both the chip 103 and the chip 109 support a first FEC code type, but a channel 106 between the data transmission device 101 and the data transmission device 102 needs to use a concatenated FEC code for data transmission. In this case, the chip 103 may encode original data by using the first FEC code type, to form a first data stream; and send the first data stream to the chip 105 through a channel 104. After receiving the first data stream, the chip 105 may re-encode the first data stream at least once by using at least a second FEC code type, to obtain a second data stream formed by concatenating at least the first FEC code type and the second FEC code type; and send the second data stream to the chip 107 through the channel 106. After receiving the second data stream, the chip 107 may decode the second data stream at least once by using the second FEC code type, to obtain the first data stream obtained through encoding by using the first FEC code type; and send the first data stream to the chip 109 through a channel 108. After receiving the first data stream, the chip 109 may decode the first data stream by using the first FEC code type, to obtain the original data. The first FEC code type may be an FEC code type such as an RS code supported by an Ethernet interface, and the second FEC code type may be a code type such as a BCH code. It should be noted that the channel 104, the channel 106, and the channel 108 may be all physical lanes with interference, and an error occurs when a data stream is transmitted on each of the channel 104, the channel 106, and the channel 108. In other words, an error occurs when the first data stream sent by the chip 103 to the chip 105 is transmitted on the channel 104, an error occurs when the second data stream sent by the chip 105 to the chip 107 is transmitted on the channel 106, and an error occurs when the first data stream sent by the chip 107 to the chip 109 is transmitted on the channel 108.

A "physical lane" and a "physical medium" are often interchangeable. A person skilled in the art may understand that the "physical lane" is a lane for transmitting data in the "physical medium".

It may be understood that the foregoing scenario is merely a scenario example provided in the embodiments, and the embodiments are not limited to this scenario.

With reference to the accompanying drawings, the following uses embodiments to describe in detail specific implementations of a data transmission method and apparatus in the embodiments.

Figure 2:
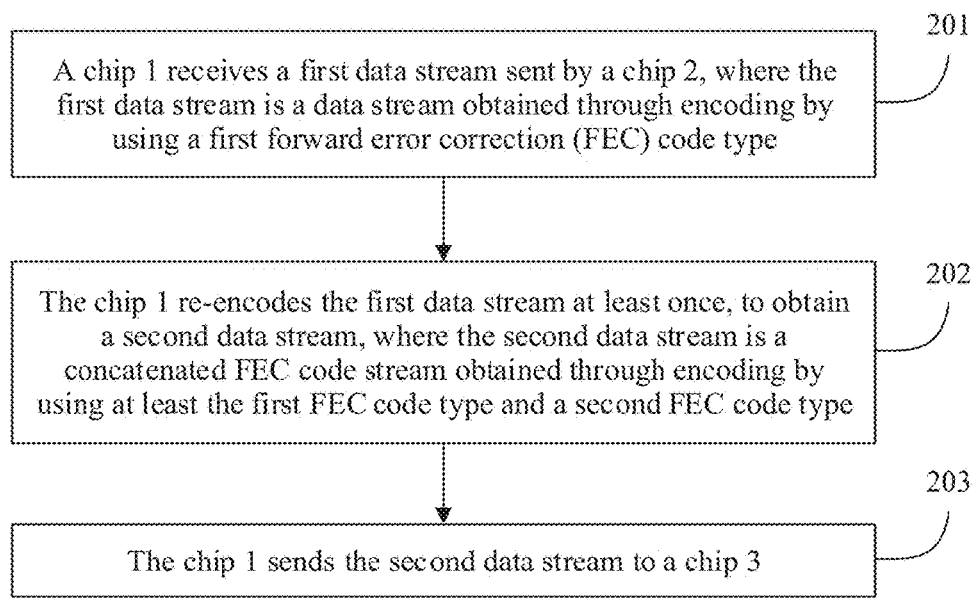
FIG. 2 is a schematic flowchart of a data transmission method according to an embodiment.

FIG. 2 is a schematic flowchart of a data transmission method 200 according to an embodiment. For example, the method may include the following steps.

201: A chip 1 receives a first data stream sent by a chip 2, where the first data stream is a data stream obtained through encoding by using an FEC code type.

In specific implementation, the chip 2 may encode original data by using the first FEC code type, to form the first data stream, and send the first data stream to the chip 1. Therefore, the first data stream received by the chip 1 is a data stream obtained through encoding by using the first FEC code type. In other words, the first data stream is a code stream including codeword blocks of the first FEC code type.

The first FEC code type may be a code type such as an RS code, a BCH code, an eBCH code, a Hamming Code, or an extended Hamming Code, a staircase code, a low-density parity check (LDPC) code, a Turbo code, or a TPC. For example, in an example scenario, assuming that the chip 2 communicates with the chip 1 through an Ethernet interface, the first FEC code type may be an RS code.

It may be understood that the codeword block of the first FEC code type includes an additional parity code provided for the original data, and the parity code is used to correct an error that occurs in a data transmission process. For example, the first FEC code type may be a systematic FEC code, that is, the codeword block of the first FEC code type may include the original data and the parity code provided for the original data.

The codeword block of the first FEC code type may be processed based on a finite field. The codeword block may be divided into a plurality of FEC symbol blocks, and processing on the codeword block may be performed at an FEC symbol block granularity. For example, in an RS code, a 5440-bit codeword block includes 5140-bit original data and a 300-bit parity code. If a Galois field (GFt) 210 is used for processing, and every 10 bits of data constitute one FEC symbol block, one codeword block includes 544 FEC symbol blocks, to be specific, original data including 514 FEC symbol blocks and a parity code including 30 FEC symbol blocks. For another example, in another RS code, a 5280-bit codeword block includes 5140-bit original data and a 140-bit parity code. If a GF 210 is used for processing, and every 10 bits of data constitute one FEC symbol block, one codeword block includes 528 FEC symbol blocks, to be specific, original data including 514 FEC symbol blocks and a parity code including 14 FEC symbol blocks. It may be understood that, for consecutive errors, also referred to as burst errors, multi-bit consecutive errors are equivalent to errors of only a small quantity of FEC symbol blocks. Therefore, processing an FEC codeword block at an FEC symbol block granularity provides a stronger FEC error correction capability.

It may be understood that the chip 1 and the chip 2 are two different chips, and data may be transmitted between the chip 1 and the chip 2 through a physical lane with interference. Therefore, an error occurs in the first data stream due to the interference when the first data stream sent by the chip 2 to the chip 1 is transmitted on the physical lane. It can be learned that the first data stream received by the chip 1 is a data stream in which an error has occurred.

202: The chip 1 re-encodes the first data stream at least once, to obtain a second data stream, where the second data stream is a concatenated FEC code stream obtained through encoding by using at least the first FEC code type and a second FEC code type.

In specific implementation, for the first data stream that is obtained through encoding by using the first FEC code type, the chip 1 does not need to first decode the first data stream by using the first FEC code type into original data. Instead, the chip 1 may re-encode the first data stream at least once by using at least the second FEC code type, so as to form the second data stream by concatenating at least the first FEC code type and the second FEC code type. In other words, the second data stream may be a concatenated FEC code stream that is obtained by concatenating the first FEC code type and the second FEC code type, that is, the second data stream is a two-level concatenated FEC code stream; or the second data stream may be a data stream that is obtained by concatenating one or more levels of concatenated FEC code streams based on concatenation of the first FEC code type and the second FEC code type, that is, the second data stream is a three-level concatenated FEC code stream or a concatenated FEC code stream with more than three levels.

It may be understood that, if the chip 2 sends the first data stream to the chip 1 through the physical lane with interference, the first data stream received by the chip 1 is a data stream in which an error has occurred. Therefore, the chip 1 does not decode the first data stream in which an error has occurred. Instead, the chip 1 directly re-encodes, at least once, the first data stream in which an error has occurred, so as to form the second data stream by concatenating a plurality of levels of FEC code stream.

The second FEC code type may be a code such as a BCH code, an eBCH code, a Hamming Code, or an extended Hamming Code, an RS code, a staircase code, an LDPC code, a Turbo code, or a TPC. It may be understood that the second FEC code type may be the same as the first FEC code type, or the second FEC code type may be different from the first FEC code type. For example, both the first FEC code and the second FEC code may be an RS code; or the first FEC code may be an RS code, and the second FEC code may be a BCH code.

It should be noted that the second data stream is a code stream including a codeword block of an FEC code type that is used for last-level coding. For example, if the second data stream is a data stream formed by concatenating the first FEC code type and the second FEC code type, the first FEC code type is used for first-level coding, and the second FEC code type is used for second-level coding, the second data stream is a code stream including a codeword block of the second FEC code type. Because the second data stream is obtained through encoding by using the second FEC code type based on the first data stream, the codeword block of the second FEC code type includes an additional parity code provided for the first data stream. If the second FEC code type is a systematic code, the codeword block of the second FEC code type includes data in the first data stream and a parity code provided for the data.

Figure 3:
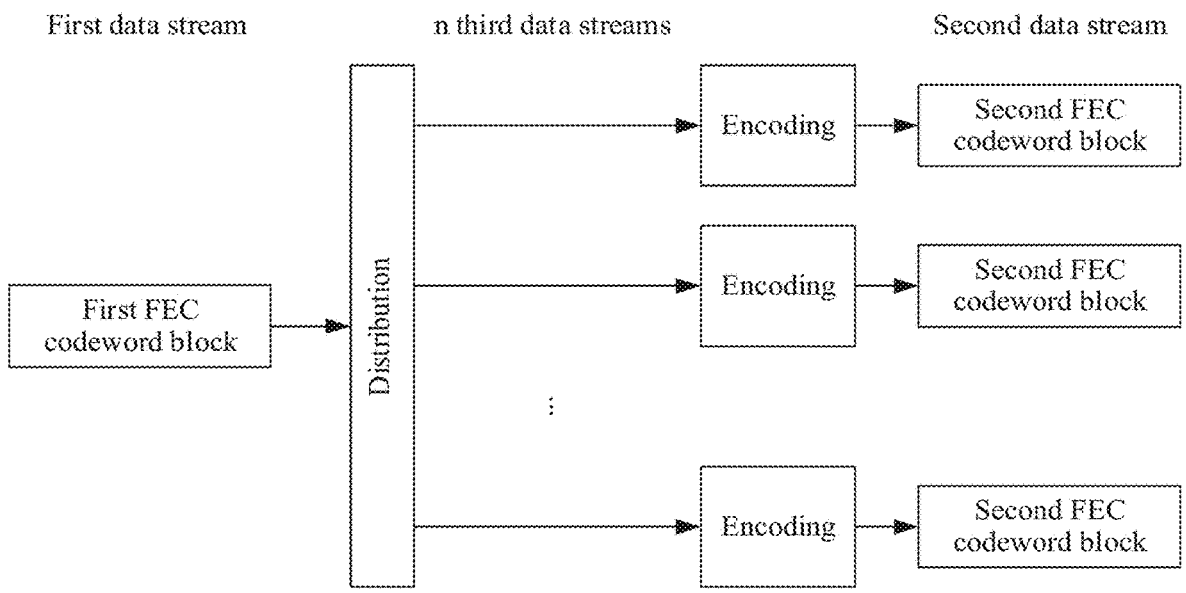
FIG. 3 is a schematic diagram of an example of a data distribution mode according to an embodiment.

In some implementations, to make an error correction capability stronger, data in a same codeword block in the first data stream may be encoded into a plurality of different codeword blocks in the second data stream. In this way, even if a small part of codeword blocks in the second data stream cannot be correctly decoded, correct decoding of the codeword block in the first data stream is not affected. In specific implementation, the chip 1 may distribute the first data stream to n different lanes in a distribution manner, to form n third data streams, so that data in a same codeword block in the first data stream is distributed to a plurality of different third data streams, where n represents a natural number greater than 1. Then, the chip 1 may re-encode each of the third data streams on the n lanes at least once, to form the second data stream. For example, in an example in FIG. 3, a first FEC codeword block is a codeword block in the first data stream, and data in the codeword block is distributed to third data streams on the n lanes. The third data stream on each lane is encoded into a second FEC codeword block, to form n second FEC code streams; and the second FEC code streams form the second data stream. The first FEC codeword block is a codeword block obtained through encoding by using the first FEC code type, the second FEC codeword block is a codeword block obtained through encoding by using the second FEC code type, and the second FEC code stream is a data stream including the second FEC codeword block.

It may be understood that the first data stream may be a data stream on one lane, or may include data streams on a plurality of lanes. In other words, the first data stream may be one code stream, or may include a plurality of code streams.

Figure 4:
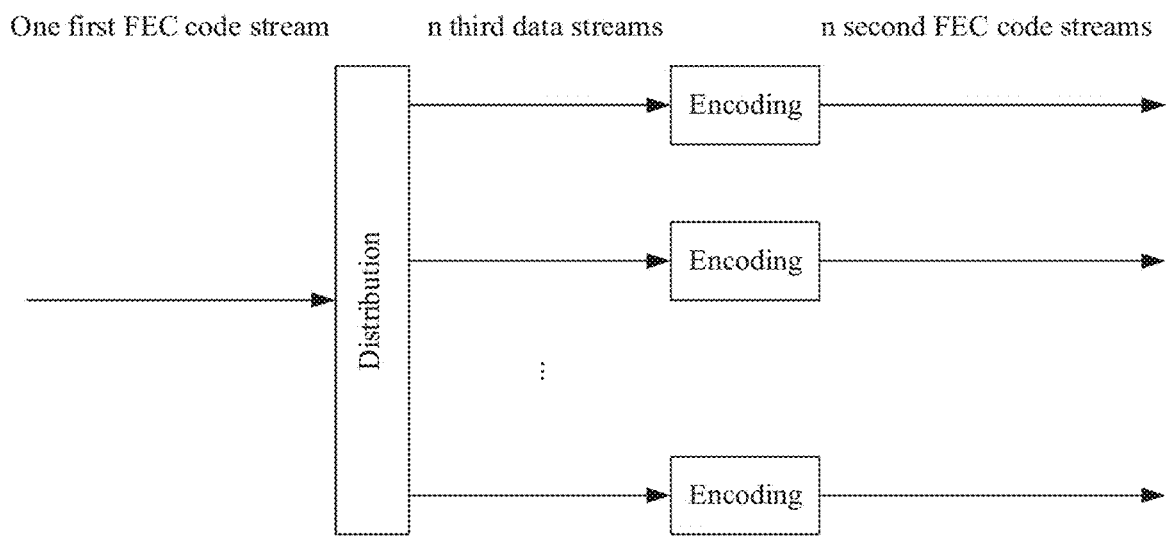
FIG. 4 is a schematic diagram of an example of a data distribution mode according to an embodiment.

If the first data stream is a data stream on one lane, the first data stream is distributed to form third data streams. This is equivalent to that one data stream is distributed to form a plurality of data streams. For example, in an example shown in FIG. 4, it is assumed that n is a natural number greater than 1, the first data stream is a first FEC code stream on one lane, and third data streams on the n lanes are formed after distribution processing. The third data stream on each lane is encoded into one second FEC code stream, and n FEC code streams form the second data stream. The first FEC code stream is a data stream including a first FEC codeword block, and the first FEC codeword block is a codeword block obtained through encoding by using the first FEC code type. The second FEC code stream is a data stream including a second FEC codeword block, and the second FEC codeword block is a codeword block obtained through encoding by using the second FEC code type.

Figure 5:
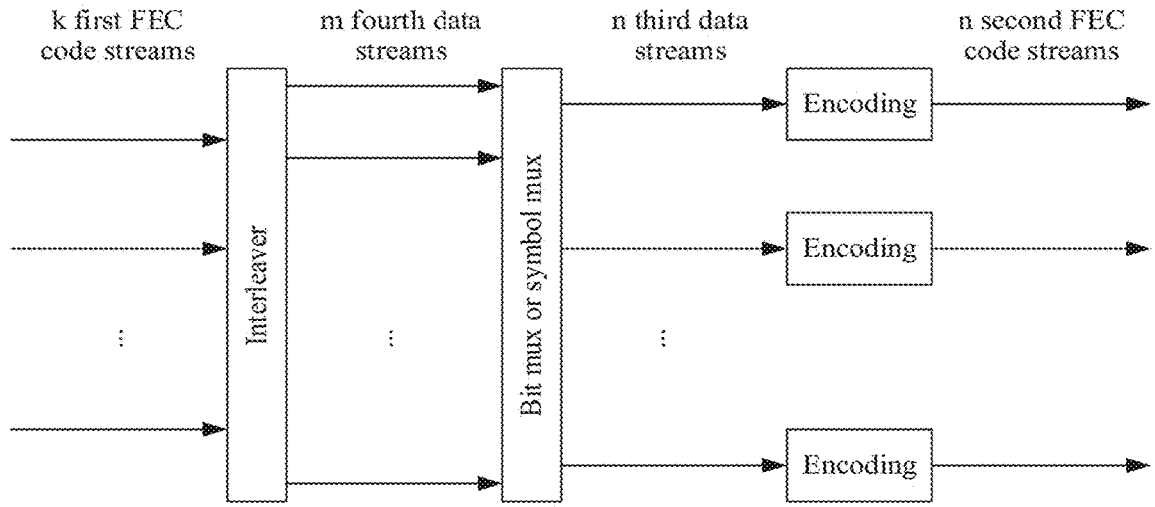
FIG. 5 is a schematic diagram of an example of a data distribution mode according to an embodiment.

If the first data stream includes data streams on a plurality of lanes, that the first data stream is distributed to form the third data stream is equivalent to that a plurality of data streams are distributed to form a plurality of data streams, and such distribution may be implemented according to a distribution policy such as an interleaving technology and/or a multiplexing technology. For example, in an example shown in FIG. 5, it is assumed that k, m, and n are all natural numbers greater than 1, the first data stream includes first FEC code streams on k lanes, the first data stream may be interleaved by an interleaver to form fourth data streams on m lanes, and then the fourth data streams on the m lanes may be multiplexed by a multiplexer such as a bit multiplexer or a symbol multiplexer, to form third data streams on the n lanes. The third data stream on each lane is then encoded into one second FEC code stream, and n FEC code streams form the second data stream. The first FEC code stream is a data stream including a first FEC codeword block, and the first FEC codeword block is a codeword block obtained through encoding by using the first FEC code type. The second FEC code stream is a data stream including a second FEC codeword block, and the second FEC codeword block is a codeword block obtained through encoding by using the second FEC code type.

It should be noted that a plurality of distribution manners may be used to distribute the first data stream to form the n third data streams.

In an example, the chip 1 may perform distribution processing on the first data stream at a bit granularity, that is, data in the first data stream may be distributed to the n third data streams by bit stream. During specific implementation, the chip 1 may obtain one-bit data from the first data stream, and select a lane for the data from the n lanes according to a distribution policy, so as to distribute the data to a third data stream on the lane. Correspondingly, the chip 1 may also perform encoding processing on the third data stream at a bit granularity, that is, data in the third data stream may be encoded by bit stream.

In another example, the chip 1 may perform distribution processing on the first data stream at an FEC symbol block granularity, that is, data in the first data stream may be distributed by FEC symbol block. During specific implementation, the chip 1 may identify an FEC symbol block from the first data stream, and select a lane for the FEC symbol block from the n lanes according to a distribution policy, so as to distribute the FEC symbol block to a third data stream on the lane. Correspondingly, the chip 1 may also encode the third data stream at an FEC symbol block granularity. During specific implementation, the chip 1 may identify a specific quantity of FEC symbol blocks from the third data stream and encode the FEC symbol blocks into a same codeword block in the second data stream. Therefore, data in a same FEC symbol block in the first data stream is encoded into a same codeword block in the second data stream. The FEC symbol block may be identified by using an alignment marker (AM).

In still another example, the chip 1 may perform distribution processing on the first data stream at a granularity of a plurality of codeword blocks. During specific implementation, the chip 1 may identify a plurality of codeword blocks from the first data stream, and distribute the plurality of codeword blocks to third data streams on the n lanes according to a distribution policy. The distribution policy may be implemented, for example, by using an interleaving technology and/or a multiplexing technology. In addition, the first data stream may be one code stream, that is, the plurality of codeword blocks may be identified from one code stream; or the first data stream may include a plurality of code streams, that is, the k codeword blocks may be identified from a plurality of code streams, for example, the first data stream includes k code streams, and the plurality of codeword blocks may be k codeword blocks obtained by identifying one codeword block from each code stream.

Figure 6:
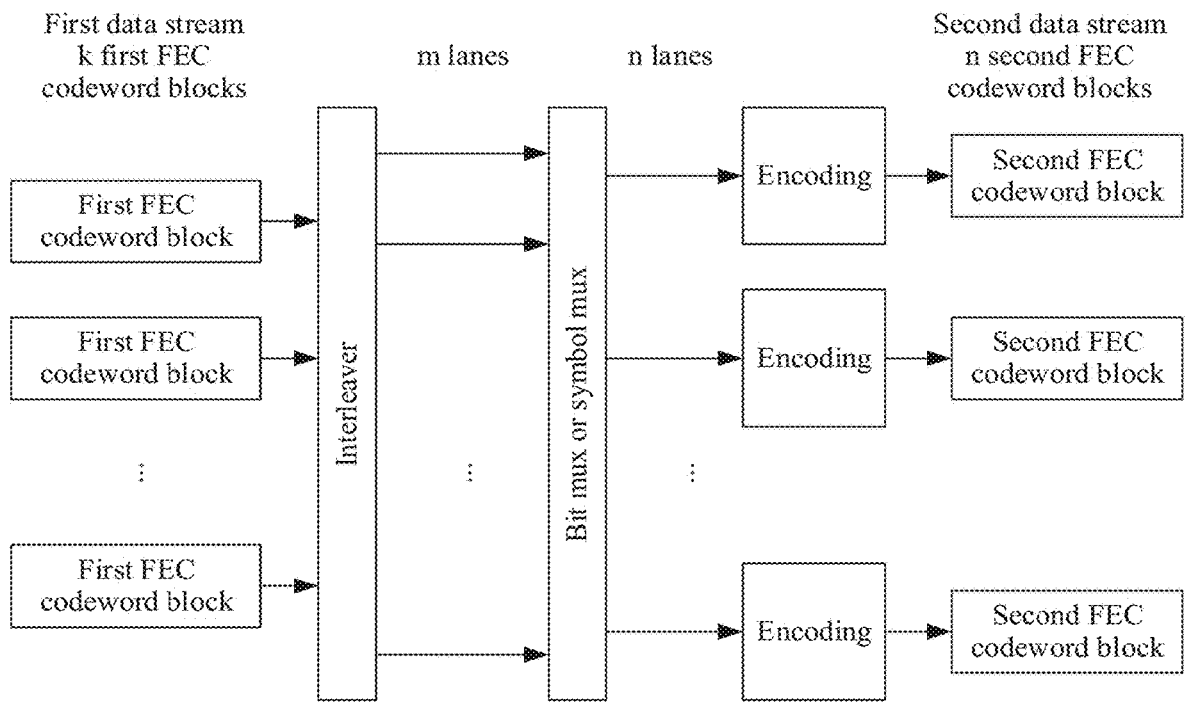
FIG. 6 is a schematic diagram of an example of a data distribution mode according to an embodiment.

To facilitate decoding of the second data stream into original data on a same chip, the chip 1 may use all data of the k codeword blocks in the first data stream as payloads of n codeword blocks in the second data stream, so that the k codeword blocks in the first data stream are encoded into the n codeword blocks in the second data stream. During specific implementation, the chip 1 may identify the k codeword blocks from the first data stream, and distribute the k codeword blocks to third data streams on the n lanes according to a distribution policy. Data of the k codeword blocks that is distributed to each lane may be encoded into one codeword block in the second data stream, so as to obtain the n codeword blocks in the second data stream through encoding on the n lanes. For example, in the example shown in FIG. 6, it is assumed that k, m, and n are all natural numbers greater than 1, and k first FEC codeword blocks identified from the first data stream are input into an interleaver. Data output by the interleaver to the m lanes is then input into a multiplexer such as a bit multiplexer or a symbol multiplexer, and the multiplexer outputs data on the n lanes. Data on each lane is then encoded into one second FEC codeword block, so that n second FEC codeword blocks in the second data stream are obtained. The first FEC codeword block is a codeword block obtained through encoding by using the first FEC code type, and may be identified from the first data stream by using the AM. The second FEC codeword block is a codeword block obtained through encoding by using the second FEC code type.

To enable the k codeword blocks in the first data stream to be encoded into the n codeword blocks in the second data stream, a total data volume included in the k codeword blocks in the first data stream needs to be equal to a payload data volume included in the n codeword blocks in the second data stream. For example, it is assumed that the first data stream is an RS code stream and the second data stream is a BCH code stream, an RS codeword block of the first data stream includes a 5140-bit payload and a 300-bit parity code, and a BCH codeword block of the second data stream includes a 340-bit payload and a 20-bit parity code. It can be learned that a total data volume of four RS codeword blocks is 21760 bits, and a payload data volume of 64 BCH codeword blocks is also 21760 bits. Therefore, the four RS codeword blocks of the first data stream may be encoded into the 64 BCH codeword blocks of the second data stream.

203: The chip 1 sends the second data stream to a chip 3.

After receiving the second data stream, the chip 3 may decode the second data stream. In this way, data is transmitted between the chip 1 and the chip 3 by using a concatenated FEC code.

In an example, the chip 3 may decode all FEC code types including the first FEC code type and the second FEC code type in the second data stream, to obtain the original data. In another example, the chip 3 may decode an FEC code type other than the first FEC code type in the second data stream, to obtain the first data stream, and send the first data stream to a chip 4. Then, the chip 4 decodes the first FEC code type in the first data stream, to obtain the original data. It may be understood that the chip 1 and the chip 3 are two different chips, and data may be transmitted between the chip 1 and the chip 3 through a physical lane with interference. Similarly, the chip 3 and the chip 4 are two different chips, and data may be transmitted between the chip 3 and the chip 4 through a physical lane. Therefore, an error occurs in the second data stream due to the interference of the physical lane when the second data stream sent by the chip 1 to the chip 3 is transmitted on the physical lane. The chip 3 does not decode or correct the second data stream in which an error has occurred into the original data. Instead, the chip 3 decodes the second data stream that is obtained by concatenating FEC into the first data stream that is obtained through encoding by using the first FEC code type; and sends the first data stream to the chip 4. When the first data stream sent by the chip 3 to the chip 4 is transmitted on the physical lane, an error occurs again due to the interference. In this case, the chip 4 decodes and corrects the first data stream into the original data. It can be learned that the first data stream received by the chip 1 is a data stream in which an error has occurred.

For the concatenated FEC codes in the second data stream, decoding of each level of FEC code type may be implemented by identifying a codeword block of the level of FEC code type and performing reverse calculation on the identified codeword block. For example, if the second data stream is formed by concatenating the first FEC code type and the second FEC code type, when the second data stream is decoded, a codeword block of the second FEC code type may be identified from the second data stream in a manner such as the AM, a self-synchronization technology, or the like, and reverse calculation is performed on the codeword block of the second FEC code type, to obtain the first data stream; and then a codeword block of the first FEC code type may be identified from the first data stream in a manner such as a fixed mapping relationship between the codeword block of the second FEC code type and the codeword block of the first FEC code type, the AM, or the like, and reverse calculation is performed on the codeword block of the first FEC code type, to obtain the original data.

Figure 7:
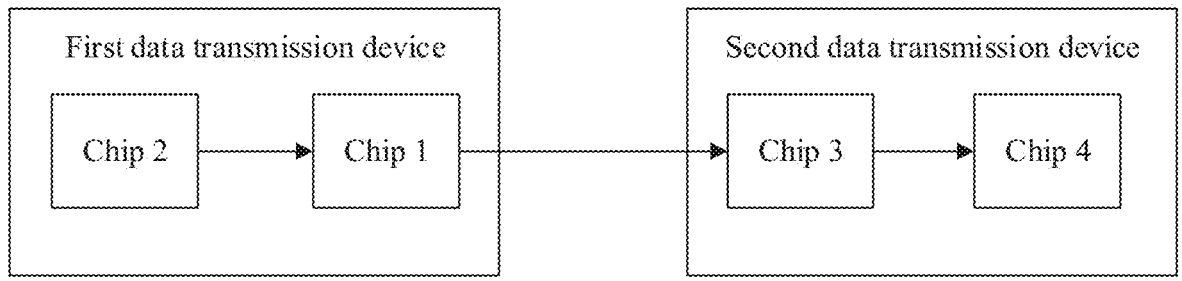
FIG. 7 is a schematic diagram of a network structure in an example scenario according to an embodiment.

In an example scenario, as shown in FIG. 7, the chip 1 and the chip 2 may be two chips located in a first data transmission device, and the chip 3 and the chip 4 may be two chips located in a second data transmission device. Data needs to be transmitted between the first data transmission device and the second data transmission device by using a concatenated FEC code, but the chip 2 and the chip 4 support only the first FEC code type but do not support the concatenated FEC code. Therefore, the chip 1 encodes a data stream output by the chip 2 to form a concatenated FEC code stream, and sends the concatenated FEC code stream to the chip 3. The chip 3 decodes the concatenated FEC code stream into a data stream that is based on the first FEC code type, and then outputs the data stream that is based on the first FEC code type to the chip 4. In this way, data can be transmitted between the chip 1 and the chip 3 by using the concatenated FEC code, so that data transmission is implemented between the first data transmission device and the second data transmission device by using the concatenated FEC code. The chip 1 may be an electrical chip, for example, may be a relay electrical chip or an electrical chip of an optical module, for example, a digital signal processing (DSP) chip. The chip 2 may be a chip that uses an Ethernet interface, for example, a physical layer (PHY) chip. The chip 3 may be an electrical chip, for example, may be a relay electrical chip or an electrical chip of an optical module, for example, a DSP chip. The chip 4 may be a chip that uses an Ethernet interface, for example, a PHY chip.

It should be noted that the concatenated FEC code provided in this embodiment achieves a relatively good error correction effect in simulation verification. It is assumed that simulation verification is performed in the example scenario shown in FIG. 7. Additive white Gaussian noise (AWGN) is inserted into a channel between the chip 2 and the chip 1, a channel between the chip 1 and the chip 3, and a channel between the chip 3 and the chip 4, to form a simulation environment. In the simulation environment, the chip 2 sends a data stream that is based on the first FEC code type to the chip 1; the chip 1 converts the data stream that is based on the first FEC code type into a concatenated FEC code stream, and then sends the concatenated FEC code stream to the chip 3; and the chip 3 converts the concatenated FEC code stream into the data stream that is based on the first FEC code type, and then sends the data stream that is based on the first FEC code type to the chip 4. In this case, the chip 4 can correctly decode the received data stream that is based on the first FEC code type. If the chip 2 sends the data stream that is based on the first FEC code type to the chip 1, the chip 1 directly sends the data stream that is based on the first FEC code type to the chip 3, and the chip 3 directly sends the data stream that is based on the first FEC code type to the chip 4, the chip 4 cannot correctly decode the received data stream that is based on the first FEC code type.

A result of simulation verification performed in the foregoing simulation environment shows that, in comparison with that the chip 1 first decodes the code stream that is based on the first FEC code type and then performs multi-level coding, to form the concatenated FEC code stream, that the chip 1 does not decode the code stream that is based on the first FEC code type, but instead, the chip 1 re-encodes, by using the second FEC code type, the code stream that is based on the first FEC code type, to form the concatenated FEC code stream can reduce a delay of 60 to 100 ns, and achieve a net coding gain (NCG) of more than 9 dB.

In this embodiment, for the first data stream that is obtained through encoding by using the first FEC code type and that is sent by the chip 2 to the chip 1, the chip 1 does not need to first decode the first data stream by using the first FEC code type and then re-encode original data into a concatenated FEC code. Instead, the chip 1 may re-encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 8:
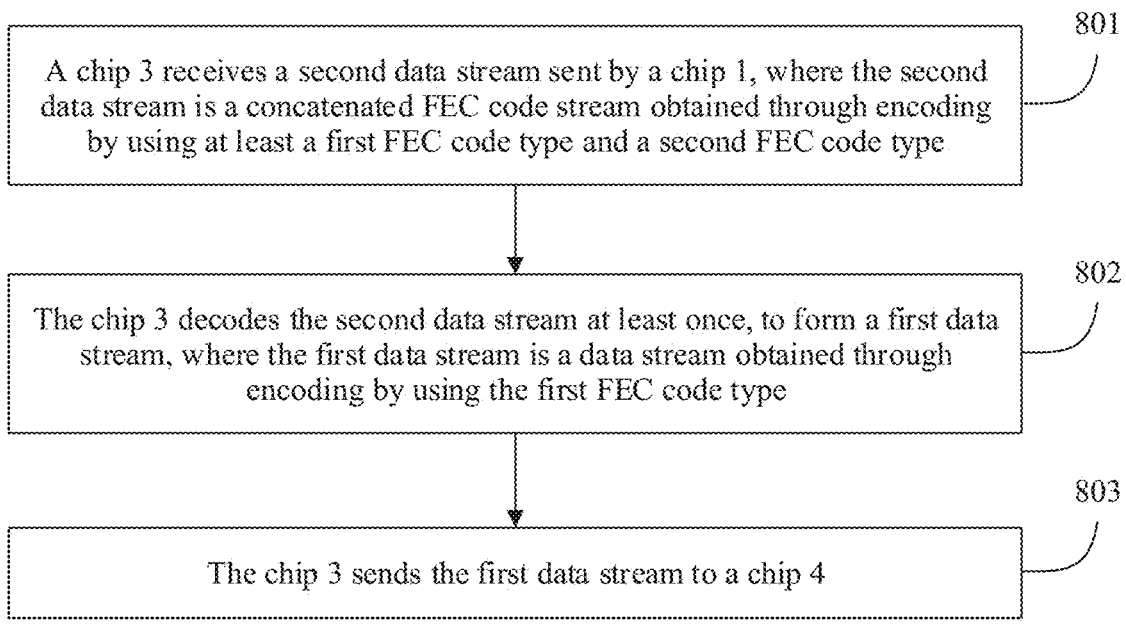
FIG. 8 is a schematic flowchart of a data transmission method according to an embodiment.

FIG. 8 is a schematic flowchart of a data transmission method 800 according to an embodiment. For example, the method may include the following steps.

801: A chip 3 receives a second data stream sent by a chip 1, where the second data stream is a concatenated FEC code stream obtained through encoding by using at least a first FEC code type and a second FEC code type.

802: The chip 3 decodes the second data stream at least once, to form a first data stream, where the first data stream is a data stream obtained through encoding by using the first FEC code type.

803: The chip 3 sends the first data stream to a chip 4.

After receiving the first data stream, the chip 4 may decode the first data stream based on the first FEC code type, to obtain original data.

The first FEC code type may be a code type such as an RS code, a BCH code, an eBCH code, a Hamming Code, or an extended Hamming Code, a staircase code, an LDPC code, a Turbo code, or a TPC. The second FEC code type may be a code type such as a BCH code, an eBCH code, a Hamming Code, or an extended Hamming Code, an RS code, a staircase code, an LDPC code, a Turbo code, or a TPC.

In an example scenario, the chip 1 may be located in a first data transmission device, the chip 3 and the chip 4 may be located in a second data transmission device, the chip 3 and the chip 1 may be electrical chips, for example, relay electrical chips or electrical chips of optical modules, and the chip 4 may be a chip that uses an Ethernet interface.

It may be understood that this embodiment corresponds to a process of decoding the second data stream, and the embodiment shown in FIG. 2 corresponds to a process of encoding the second data stream. Therefore, for various specific implementations related to this embodiment, for example, specific implementations of the first data stream, the second data stream, the first FEC code type, the second FEC code type, the chip 1, the chip 3, and the chip 4, refer to the description of the embodiment shown in FIG. 2. That is, the method in the embodiment corresponding to FIG. 8 is a decoding solution reverse to the encoding solution described in the embodiment corresponding to FIG. 2. A person skilled in the art may understand that details are not described.

In this embodiment, for the second data stream that is formed by concatenating at least the first FEC code type and the second FEC code type and that is sent by the chip 1 to the chip 3, the chip 3 may decode the second data stream by using an FEC code type other than the first FEC code type, to form the first data stream that is obtained through encoding by using the first FEC code type, and send the first data stream to the chip 4. In this way, the chip 3 does not need to decode the second data stream into original data, then re-encode the original data into a data stream that is based on the first FEC code type, and send the data stream to the chip 4. Therefore, an FEC code type conversion process is simplified, both a delay and device power consumption that are required during FEC code type conversion are reduced, and data transmission efficiency is improved.

Figure 9:
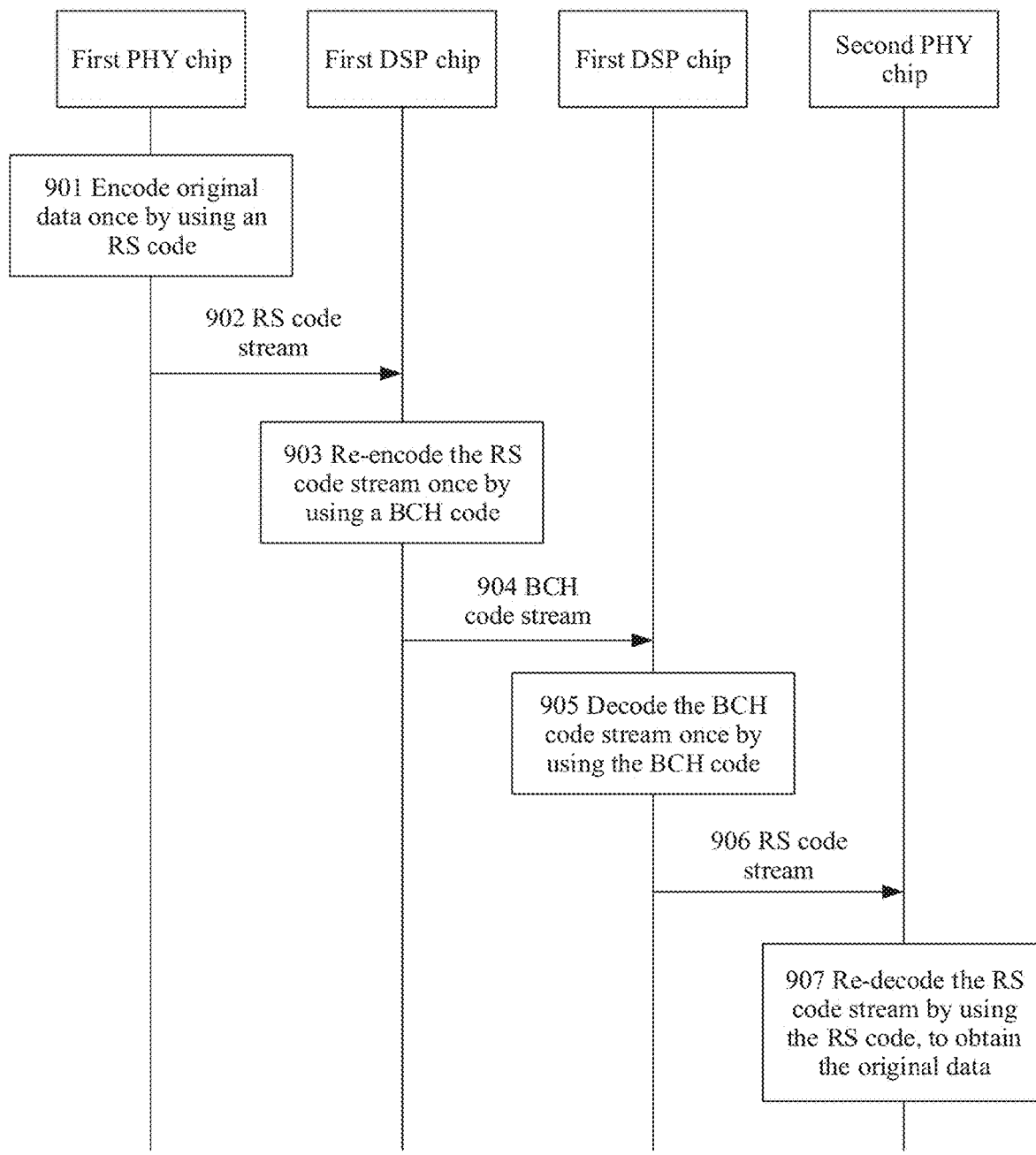
FIG. 9 is a schematic flowchart of a data transmission method according to an embodiment.

The following describes, by using a specific scenario example, an example in which the data transmission method provided in the embodiments is applied to a specific scenario. In this specific scenario example, a first data transmission device includes a first PHY layer chip and a first optical module, and the first optical module has a first DSP chip; and a second data transmission device includes a second PHY layer chip and a second optical module, and the second optical module has a second DSP chip. Data is transmitted between the first data transmission device and the second data transmission device by using a concatenated FEC code, and the first PHY layer chip and the second PHY layer chip support an RS code but do not support the concatenated FEC code. In this specific scenario, as shown in FIG. 9, a data transmission method 900 between the first data transmission device and the second data transmission device may include, for example, the following steps.

901: The first PHY chip encodes original data once by using an RS code, to form an RS code stream.

902: The first PHY chip sends the RS code stream to the first DSP.

903: The first DSP re-encodes the RS code stream once by using a BCH code, to form a BCH code stream.

The BCH code stream is actually a concatenated FEC code stream formed by concatenating the RS code and the BCH code.

904: The first DSP sends the BCH code stream to the second DSP.

905: The second DSP decodes the BCH code stream once by using the BCH code, to form the RS code stream.

906: The second DSP sends the RS code stream to the second PHY chip.

907: The second PHY chip re-decodes the RS code stream by using the RS code, to obtain the original data.

In this embodiment, the first DSP does not need to first decode the RS code stream by using the RS code and then re-encode the original data into the concatenated FEC code stream. Instead, the first DSP may re-encode the RS code stream at least once by using the BCH code, to form the concatenated FEC code stream obtained by concatenating the RS code and the BCH code. In this way, data can be transmitted between the first DSP and the second DSP by using the concatenated FEC code stream. In addition, the second DSP does not need to decode the concatenated FEC code stream into the original data and then re-encode the original data into the RS code stream. Instead, the second DSP may decode the concatenated FEC code stream once by using the BCH code, to form the RS code stream. In this way, the second PHY chip can receive the RS code stream.

Therefore, an FEC code type conversion process is simplified, both a delay and device power consumption that are required during FEC code type conversion are reduced, and data transmission efficiency is improved.

Figure 10:
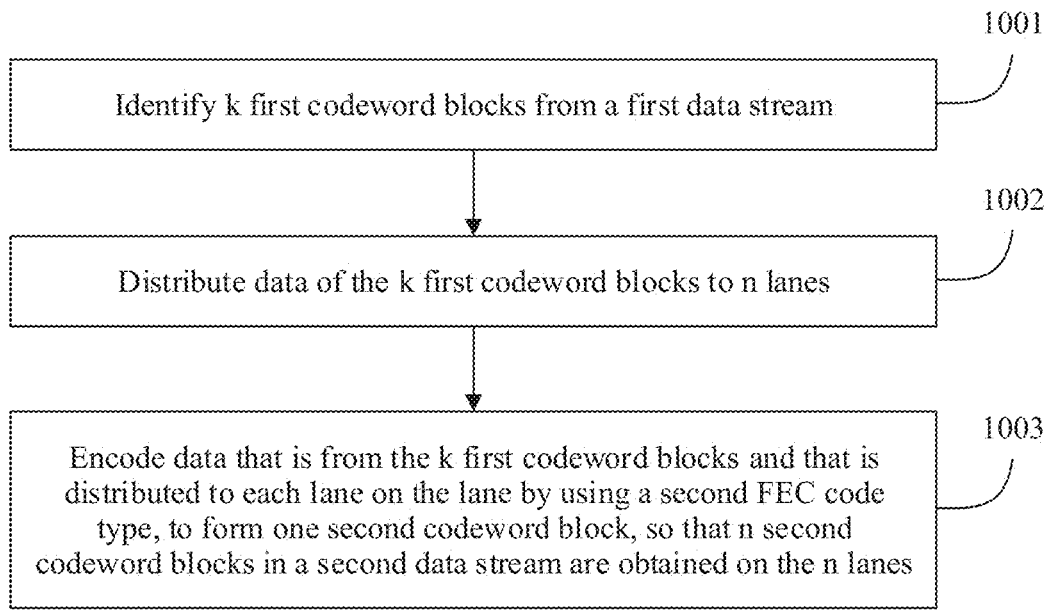
FIG. 10 is a schematic flowchart of an encoding method according to an embodiment.

FIG. 10 is a schematic flowchart of an encoding method 1000 according to an embodiment. The method 1000 is used to encode k codeword blocks of a first FEC code type by using a second FEC code type, to form n codeword blocks of the second FEC code type. Specifically, the method 1000 may include the following steps.

1001: Identify k first codeword blocks from a first data stream.

The first data stream is a data stream obtained through encoding by using the first FEC code type. Therefore, the first codeword block in the first data stream is a codeword block of the first FEC code type. The first codeword block may be identified from the first data stream by using an AM.

1002: Distribute data of the k first codeword blocks to n lanes.

A distribution policy may be implemented by using an interleaving technology and/or a multiplexing technology. For example, k first FEC codeword blocks may be input into an interleaver, data output by the interleaver to m lanes is then input into a multiplexer such as a bit multiplexor or a symbol multiplexer, and the multiplexer outputs data on the n lanes.

1003: Encode data that is from the k first codeword blocks and that is distributed to each lane on the lane by using the second FEC code type, to form one second codeword block, so that n second codeword blocks in a second data stream are obtained on the n lanes.

On each lane, the data from the k first codeword blocks is encoded into one second codeword block as a payload, that is, the payload of the second codeword block is the data that is from the k first codeword blocks and that is distributed to the lane. Therefore, all payloads of the n second codeword blocks that are obtained through encoding on the n lanes are all data of the k first codeword blocks, that is, a total data volume of the k first codeword blocks needs to be equal to a payload data volume of the n second codeword blocks.

In this embodiment, the n second codeword blocks may be directly decoded into original data based on the second FEC code type and the first FEC code type. This helps perform decoding operations on a same chip based on the first FEC code type and the second FEC code type. In some embodiments, a total data volume included in the k first codeword blocks in the first data stream is not equal to a payload data volume included in n second codeword blocks in the second data stream.

Figure 11:
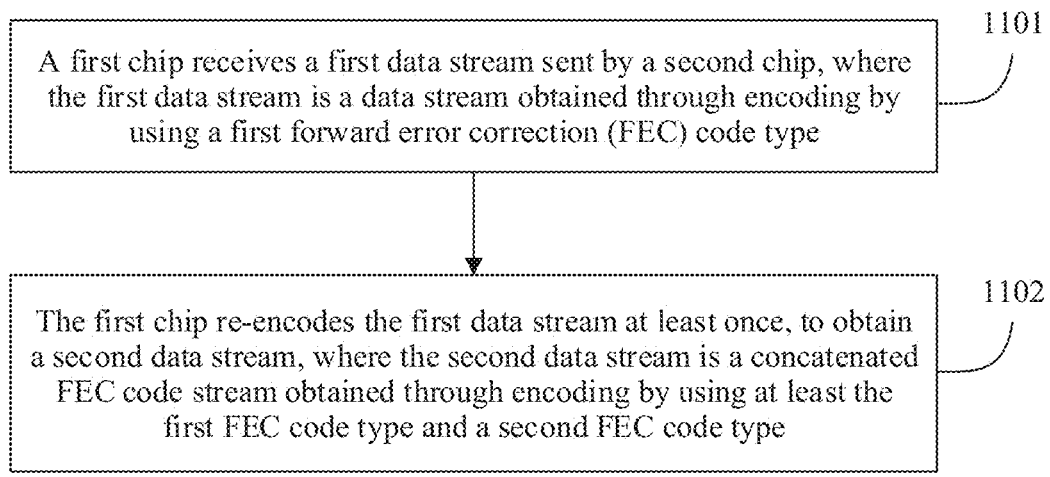
FIG. 11 is a schematic flowchart of a data transmission method according to an embodiment.

FIG. 11 is a schematic flowchart of a data transmission method 1100 according to an embodiment. The method 1100 includes the following steps.

1101: A first chip receives a first data stream sent by a second chip, where the first data stream is a data stream obtained through encoding by using a first FEC code type.

1102: The first chip re-encodes the first data stream at least once, to obtain a second data stream, where the second data stream is a concatenated FEC code stream obtained through encoding by using at least the first FEC code type and a second FEC code type.

In some possible implementations, the first FEC code type is specifically: an RS code, a BCH code, an eBCH code, a Hamming Code, or an extended Hamming Code, a staircase code, an LDPC code, a Turbo code, or a TPC.

In some possible implementations, the second FEC code type is specifically: a BCH code, an eBCH code, a Hamming Code, or an extended Hamming Code, an RS code, a staircase code, an LDPC code, a Turbo code, or a TPC.

In some possible implementations, that the first chip re-encodes the first data stream at least once, to form a second data stream includes: the first chip distributes the first data stream, to form n third data streams, where data of a same codeword block in the first data stream is distributed to different third data streams; and the first chip re-encodes each of the plurality of third data streams at least once, to form the second data stream.

In some possible implementations, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

In some possible implementations, data in the first data stream is distributed by FEC symbol block, and data in a same FEC symbol block in the first data stream is encoded into a same codeword block in the second data stream.

In some possible implementations, data in the first data stream is distributed by bit stream, and data in the third data stream is encoded by bit stream.

In some possible implementations, the first chip and the second chip are located in a same data transmission device, the first chip is an electrical chip, and the second chip is a chip that uses an Ethernet interface.

It may be understood that the first chip is the chip 1 mentioned in the data transmission method 200, the second chip is the chip 2 mentioned in the data transmission method 200, and a third chip is the chip 3 mentioned in the data transmission method. Therefore, for various specific implementations of operations performed by the first chip, the second chip, and the third chip in this embodiment, refer to the descriptions of the chip 1, the chip 2, and the chip 3 in the data transmission method 200 shown in FIG. 2. Details are not described again in this embodiment.

In this embodiment, for the first data stream that is obtained through encoding by using the first FEC code type and that is sent by the chip 2 to the chip 1, the chip 1 does not need to first decode the first data stream by using the first FEC code type and then re-encode original data into a concatenated FEC code. Instead, the chip 1 may re-encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 12:
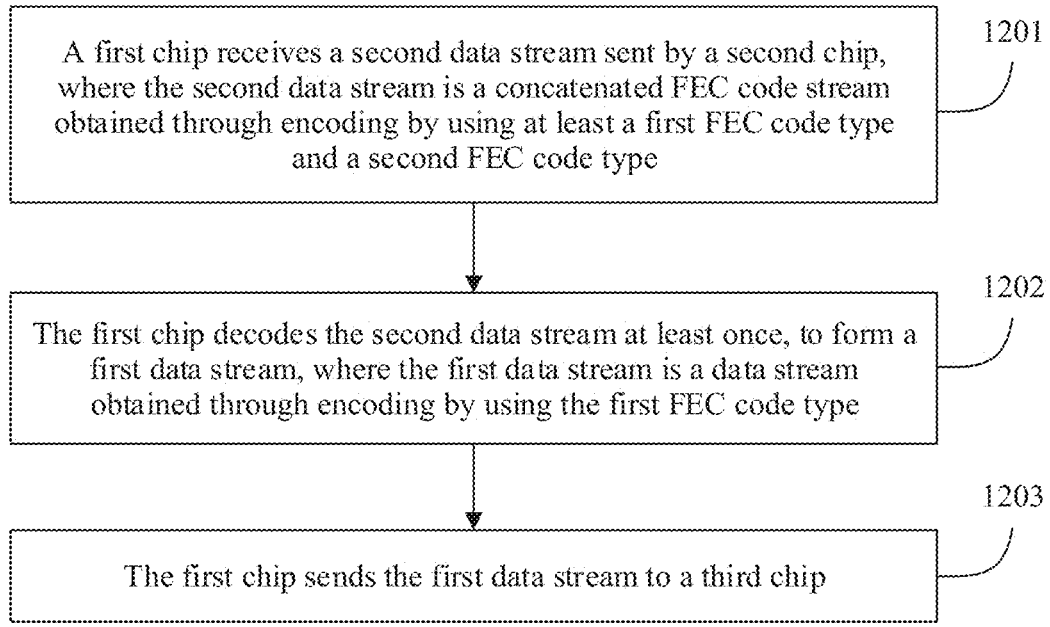
FIG. 12 is a schematic flowchart of a data transmission method according to an embodiment.

FIG. 12 is a schematic flowchart of a data transmission method 1200 according to an embodiment. The method 1200 includes the following steps.

1201: A first chip receives a second data stream sent by a second chip, where the second data stream is a concatenated FEC code stream obtained through encoding by using at least a first FEC code type and a second FEC code type.

1202: The first chip decodes the second data stream at least once, to form a first data stream, where the first data stream is a data stream obtained through encoding by using the first FEC code type.

1203: The first chip sends the first data stream to a third chip.

In some possible implementations, the first FEC code type is specifically: an RS code, a BCH code, an eBCH code, a Hamming Code, or an extended Hamming Code, a staircase code, an LDPC code, a Turbo code, or a TPC.

In some possible implementations, the second FEC code type is specifically: a BCH code, an eBCH code, a Hamming Code, or an extended Hamming Code, an RS code, a staircase code, an LDPC code, a Turbo code, or a TPC.

In some possible implementations, the first data stream is used to be decoded by the third chip based on the first FEC code type.

In some possible implementations, the second chip is located in a first data transmission device, the first chip and the third chip are located in a second data transmission device, the first chip is an electrical chip, the second chip is an electrical chip, and the third chip is a chip that uses an Ethernet interface.

It may be understood that the first chip is the chip 3 mentioned in the data transmission method 200, the second chip is the chip 1 mentioned in the data transmission method 200, and the third chip is the chip 4 mentioned in the data transmission method 200. Therefore, for various specific implementations of operations performed by the first chip, the second chip, and the third chip in this embodiment, refer to the descriptions of the chip 3, the chip 1, and the chip 4 in the data transmission method 200 shown in FIG. 2. Details are not described again in this embodiment.

In this embodiment, for the second data stream that is formed by concatenating at least the first FEC code type and the second FEC code type and that is sent by the second chip to the first chip, the first chip may decode the second data stream by using an FEC code type other than the first FEC code type, to form the first data stream that is obtained through encoding by using the first FEC code type, and send the first data stream to the third chip. In this way, the first chip does not need to decode the second data stream into original data, then re-encode the original data into a data stream that is based on the first FEC code type, and send the data stream to the third chip. Therefore, an FEC code type conversion process is simplified, both a delay and device power consumption that are required during FEC code type conversion are reduced, and data transmission efficiency is improved.

Figure 13:
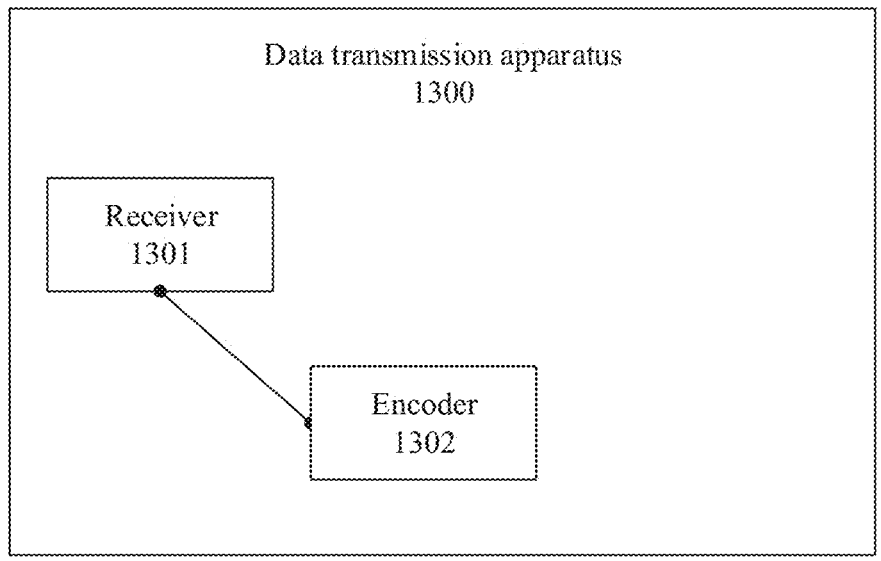
FIG. 13 is a schematic diagram of a structure of a data transmission apparatus according to an embodiment.

FIG. 13 is a schematic diagram of a structure of a data transmission apparatus 1300 according to an embodiment. The apparatus 1300 is a first chip and includes: a receiver 1301 configured to receive a first data stream sent by a second chip, where the first data stream is a data stream obtained through encoding by using a first FEC code type; and an encoder 1302 configured to re-encode the first data stream at least once, to obtain a second data stream, where the second data stream is a concatenated FEC code stream obtained through encoding by using at least the first FEC code type and a second FEC code type.

In some possible implementations, the first FEC code type is specifically: an RS code, a BCH code, an eBCH code, a Hamming Code, or an extended Hamming Code, a staircase code, an LDPC code, a Turbo code, or a TPC.

In some possible implementations, the second FEC code type is specifically: a BCH code, an eBCH code, a Hamming Code, or an extended Hamming Code, an RS code, a staircase code, an LDPC code, a Turbo code, or a TPC.

In some possible implementations, the encoder 1302 is further configured to: distribute the first data stream, to form n third data streams, where data of a same codeword block in the first data stream is distributed to different third data streams; and re-encode each of the plurality of third data streams at least once, to form the second data stream.

In some possible implementations, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

In some possible implementations, data in the first data stream is distributed by FEC symbol block, and data in a same FEC symbol block in the first data stream is encoded into a same codeword block in the second data stream.

In some possible implementations, data in the first data stream is distributed by bit stream, and data in the third data stream is encoded by bit stream.

In some possible implementations, the first chip and the second chip are located in a same data transmission device, the first chip is an electrical chip, and the second chip is a component that uses an Ethernet interface.

It may be understood that the apparatus 1300 shown in FIG. 13 is the chip 1 mentioned in the embodiment shown in FIG. 2. Therefore, for various specific implementations of the apparatus 1300 in this embodiment, refer to the description of the chip 1 in the embodiment shown in FIG. 2. Details are not described again in this embodiment.

In this embodiment, for the first data stream that is obtained through encoding by using the first FEC code type and that is sent by the second chip to the first chip, the first chip does not need to first decode the first data stream by using the first FEC code type and then re-encode original data into a concatenated FEC code. Instead, the first chip may re-encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 14:
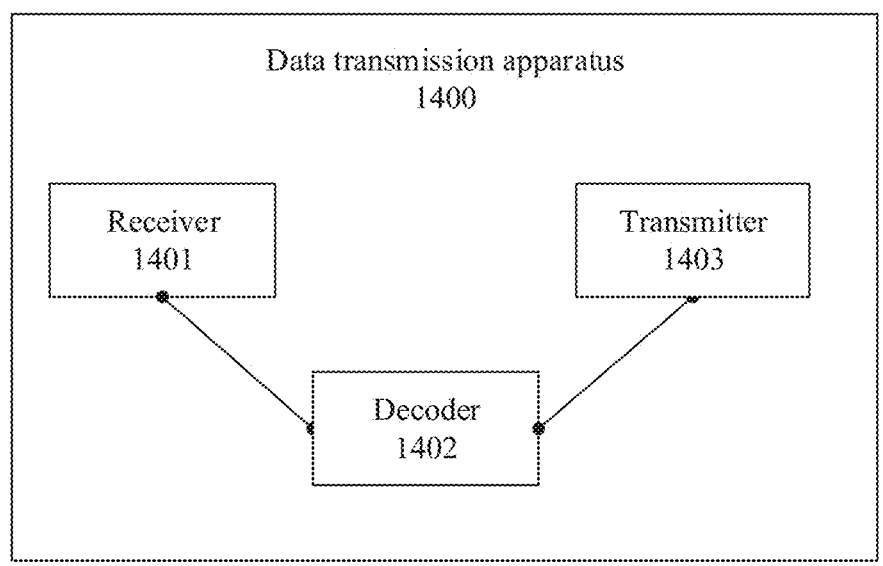
FIG. 14 is a schematic diagram of a structure of a data transmission apparatus according to an embodiment.

FIG. 14 is a schematic diagram of a structure of a data transmission apparatus 1400 according to an embodiment. The apparatus 1400 is specifically a first chip and includes: a receiver 1401 configured to receive a second data stream sent by a second chip, where the second data stream is a concatenated FEC code stream obtained through encoding by using at least a first FEC code type and a second FEC code type; a decoder 1402 configured to decode the second data stream at least once, to form a first data stream, where the first data stream is a data stream obtained through encoding by using the first FEC code type; and a transmitter 1403 configured to send the first data stream to a third chip.

In some possible implementations, the first FEC code type is specifically: an RS code, a BCH code, an eBCH code, a Hamming Code, or an extended Hamming Code, a staircase code, an LDPC code, a Turbo code, or a TPC.

In some possible implementations, the second FEC code type is specifically: a BCH code, an eBCH code, a Hamming Code, or an extended Hamming Code, an RS code, a staircase code, an LDPC code, a Turbo code, or a TPC.

In some possible implementations, the first data stream is used to be decoded by the third chip based on the first FEC code type.

In some possible implementations, the second chip is located in a first data transmission device, the first chip and the third chip are located in a second data transmission device, the first chip is an electrical chip, the second chip is an electrical chip, and the third chip is a component that uses an Ethernet interface.

It may be understood that the apparatus 1400 shown in FIG. 14 is the chip 3 mentioned in the embodiment shown in FIG. 2. Therefore, for various specific implementations of the apparatus 1400 in this embodiment, refer to the description of the chip 3 in the embodiment shown in FIG. 2. Details are not described again in this embodiment.

In this embodiment, for the second data stream that is formed by concatenating at least the first FEC code type and the second FEC code type and that is sent by the first chip to the receiver 1401, the decoder 1402 may decode the second data stream by using an FEC code type other than the first FEC code type, to form the first data stream that is obtained through encoding by using the first FEC code type, and send the first data stream to the third chip. In this way, the chip 1 does not need to decode the second data stream into original data, then re-encode the original data into a data stream that is based on the first FEC code type, and send the data stream to the third chip. Therefore, an FEC code type conversion process is simplified, both a delay and device power consumption that are required during FEC code type conversion are reduced, and data transmission efficiency is improved.

In addition, an embodiment further provides a communication method. The communication method includes the foregoing data transmission method 1100 and the foregoing data transmission method 1200.

In addition, an embodiment further provides a communications system. The communications system includes the foregoing data transmission apparatus 1300 and the foregoing data transmission apparatus 1400.

In addition, an embodiment further provides a network device. The network device includes the foregoing data transmission apparatus 1300 or 1400.

In addition, an embodiment further provides a data transmission system. The data transmission system includes the foregoing network device.

In addition, an embodiment further provides a computer program product including instructions. When the computer program product is run on a computer, the computer is enabled to perform the data transmission method 1100 or 1200 in the method embodiments.

In addition, an embodiment further provides a computer-readable storage medium. The computer-readable storage medium stores instructions; and when the instructions are run on a computer or a processor, the computer or the processor is enabled to perform the data transmission method 1100 or 1200 in the method embodiments in the embodiments.

In a data transmission process, a data transmission rate and a data transmission distance are limited by a lane loss and noise. However, FEC provides error correction protection for data that is being transmitted, so that a transmission capability of a lane gradually approaches a Shannon limit. This can increase a rate and a distance of transmitting data on the lane. In this disclosure, a multi-level FEC code concatenation manner is used to further increase a gain, so as to increase a data transmission rate and a data transmission distance. The Shannon limit refers to the maximum rate of error-free data that can theoretically be transferred over the channel if the link is subject to random data transmission errors, for a particular noise level. This is proved by Shannon theorem.

FEC is an error control manner, and a principle of FEC is to provide an additional parity bit for transmitted data by using a method. There are a plurality of types of FEC codes, such as an RS-FEC code, a BCH FEC code, an eBCH code, a Hamming Code, or an extended Hamming Code, a Fire code, a Turbo code, and an LDPC code. These FEC codes can obtain different gains based on different code lengths and different overhead ratios.

In addition, there are different calculation methods for different FEC codes. In some FEC codes, original data is not changed and only a parity bit is added. Such an FEC code is called a systematic code (systematic FEC). For the systematic code, a parity code and original data are sent together on the lane to a receive end. When the parity code and the original data are transmitted on the lane, an error may occur in some locations in the original data or the parity code, and the original data that exists before the errors occur may be obtained at the receive end through reverse calculation.

FEC is widely applied to a data transmission technology because FEC can increase the data transmission rate and the data transmission distance. Ethernet interfaces are widely used data transmission interfaces worldwide. As a rate is rapidly increased, FEC plays an important role in the Ethernet. For example, for a 10 Gigabit Ethernet (GbE) interface, an FEC code is added, and the FEC code is a cyclic code, has a data length of 2080 bits, and has a parity bit of 32 bits. The FC Fire Code (2112, 2080) consists of 2080 information bits and 32 parity bits. The encoding can correct common errors occurring in backplane transmission. For example, a length of a code block of the Fire code includes 2080 bits of data and 32 bits of a parity code. Based on an error correction capability of the Fire code, common errors that the Fire code can correct are burst errors up to 11 bits at most. In a process of formulating the 100 GbE standard, a stronger FEC code such as RS-FEC is introduced in the industry. For example, KR4 FEC and KP4 FEC are both RS-FEC, and code types of the KR4 FEC and the KP4 FEC are respectively RS (528, 514) and RS (544, 514). The KR4 FEC and the KP4 FEC are both calculated based on a GF (210) field. Each symbol includes 10-bit data, and all calculation is performed based on symbols. Each codeword of the KP4 FEC includes 514 FEC symbols corresponding to original data information and 30 FEC symbols corresponding to a parity bit, that is, 5140-bit original data information and a 300-bit parity bit. Each codeword of the KR4 FEC includes 514 FEC symbols corresponding to original data information and 14 FEC symbols corresponding to a parity bit, that is, 5140-bit original data information and a 140-bit parity bit. An advantage of using an FEC symbol is that an error correction capability is strong for consecutive errors (also referred to as burst errors). For example, 20-bit consecutive errors do not extend to more than three symbols. For a decoder, the 20-bit consecutive errors are only three error symbols at most.

The KP4 FEC is used as an example. The KP4 FEC has a net gain, or net coding gain (NCG), of about 6.5 dB when a post-correction bit error ratio Post-FEC BER=$1 \times 10^{-13}$. That is, when the FEC is used, if data reaches this bit error ratio (BER), a required signal-to-noise ratio (SNR) is lower than an SNR required when the FEC is not used. For example, it is generally considered in the industry that the required signal-to-noise ratio is about 6.5 dB lower than the SNR required when the FEC is not used. This greatly increases a distance over which a signal can be transmitted.

However, as a rate and a transmission distance are continuously increased, a requirement for FEC becomes increasingly high. On the other hand, stronger FEC often requires more parity bits, and consequently, data requires higher bandwidth. A serializer/deserializer rate is limited, and different designs may even have different frequency requirements. This also imposes limitations on selection of FEC. For example, on an interface of a transmission rate of 100 Gb/s, a rate of 103.125 G or 106.25 G is usually used in the industry.

For the KR4 FEC and the KP4 FEC that are mentioned above, RS (544, 514) is also used on a 400 GbE interface. A manner in which two codewords are interleaved for retransmission is used to cope with burst errors. In this manner, there is a relatively high probability that burst errors occurring on a link can be allocated to two FEC symbols, and then allocated to two codewords, to reduce a quantity of incorrect symbols in each codeword. This manner can enhance FEC performance and correct an error that cannot be corrected by using a single codeword. Interleaving is particularly effective for a lane on which burst errors occur. However, when an Ethernet interface is connected to an optical module, a design of the optical module needs to be considered. Therefore, no complicated data processing is required on the optical module side.

In view of this, an embodiment provides a data encoding method. The method may be applied to a current Ethernet interface and an Ethernet interface that may emerge in the future. For example, the Ethernet interfaces to which this disclosure is applied include an electrical interface or an optical interface of a rate such as 10GBASE-T, 100GBASE-LR4, or 200GBASE-SR4, further include an attachment unit interface (AUI), and also include an interface of a rate such as 100GBASE-CR1 or 400GBASE-KR4. In addition, the method provided in this embodiment is applicable to either a single-segment lane or a multi-segment lane. A difference between a single-segment lane and a multi-segment lane lies in whether data passes through an active circuit or data is propagated all through mediums in an entire data transmission process. If the data is transmitted from a transmit end to a receive end all through passive mediums, such as a PCB circuit board and an optical fiber, the lane is considered as a single-segment lane. If the data is transmitted from a transmit end to a receive end through another circuit, a photoelectric conversion apparatus, or the like, the another circuit, the photoelectric conversion apparatus, or the like is used as a demarcation point to divide the lane into a plurality of lane segments. Different lanes may have different lane features, including burst error behavior.

Figure 15:
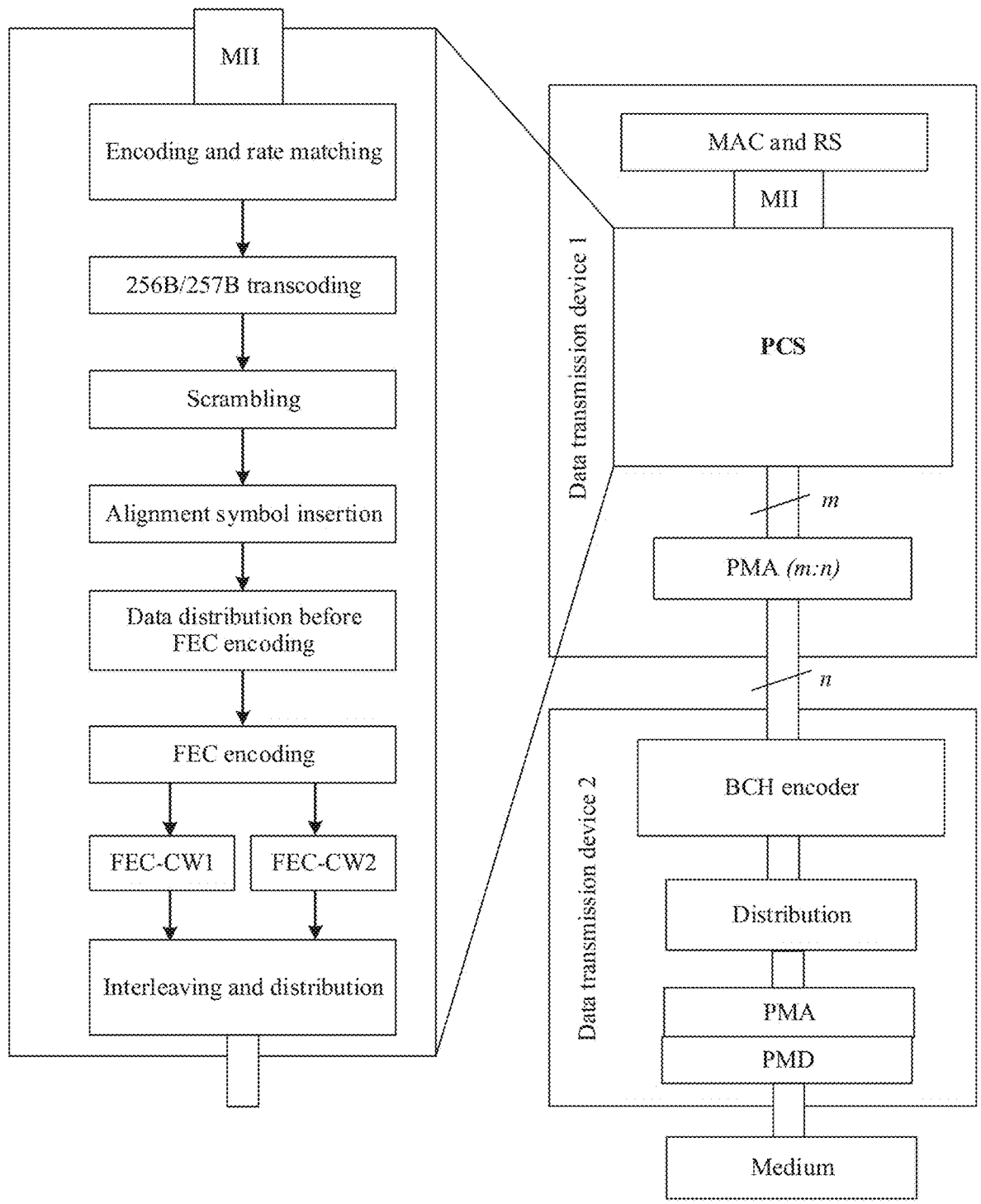
FIG. 15 is a schematic diagram of an implementation environment according to an embodiment.

Refer to FIG. 15. An implementation environment of the data encoding method includes a second circuit and a first circuit. The second circuit may be disposed in a data transmission device 1, and the first circuit may be disposed in a data transmission device 2. For example, the second circuit is used as a data transmit end, and the first circuit is a data receive end. The second circuit includes a circuit that supports an Ethernet interface, for example, a circuit that supports a standard 400 GbE interface.

The second circuit obtains RS original data received from a media access control (MAC) layer, and transmits the RS original data to a physical coding sublayer (PCS) through a media independent interface (MII). After encoding and rate matching is performed on the original data at the PCS, 256B (bits)/257B transcoding is performed on the original data. After the transcoding, scrambling and alignment symbol insertion are sequentially performed on transcoded data. The alignment symbol insertion is to insert an AM into scrambled data, and perform alignment by using the AM. AMs of different virtual lanes may be different, so that data on different virtual lanes can be distinguished based on the AMs. During subsequent encoding, a boundary of an FEC codeword or a boundary of an FEC symbol may be determined through AM alignment. After alignment, data distribution is performed before FEC encoding, to distribute data to a corresponding RS encoder. The second circuit includes one or more RS encoders. The 400 GbE interface is used as an example. After FEC encoding is performed on the RS original data received by the MAC layer of the second circuit, two RS (544, 514) codewords, for example, an FEC-CW1 and an FEC-CW2 in FIG. 15, are obtained. Then, the two RS codewords are interleaved. On the 400 GbE interface, RS (544, 514) FEC is used to cope with a burst error. Two encoders are used for encoding, and results are interleaved for retransmission, so that burst errors occurring on a physical lane can be allocated to two FEC symbols, and then allocated to two codewords, to reduce a quantity of incorrect symbols in each codeword. This manner can enhance FEC performance and correct an error that cannot be corrected by using a single codeword. Therefore, interleaving brings a significant effect for a lane on which burst errors occur. In addition, in a possible implementation, the PCS may perform functions such as encoding, transcoding, and AM insertion by using an IEEE 802.3 standard, for example, the IEEE 802.3-2005 standard or an IEEE 802.3 standard of another version. For other rates, such as 25 GbE, 50 GbE, and 100 GbE, sequences of encoding, transcoding, scrambling, and AM insertion are different. For details, refer to the IEEE 802.3-2018 standard.

Further, after the two RS codewords are interleaved, interleaved data is distributed to a virtual lane (which is referred to as a PCS lane in the standard, or may be referred to as a logical lane). 16 virtual lanes are used as an example. A 16×25 G output mode, an 8×50 G output mode, or a 4×100 G output mode is supported. The interleaved data is transmitted to a physical medium attachment sublayer (PMA) through the virtual lane, and the PMA performs bit multiplexing, so that data transmitted on a plurality of virtual lanes is multiplexed onto one or more physical lanes. FIG. 15 is used as an example. A quantity of virtual lanes is m, a quantity of physical lanes is n, and m: n multiplexing (MUX) is implemented at the PMA. Values of m and n are not limited in this embodiment, that is, the quantity of virtual lanes and the quantity of physical lanes are not limited in this embodiment. Specifications for multiplexing at the PMA may be determined based on the quantity of physical lanes, so that data is multiplexed onto the physical lane in a bit stream manner. For example, the IEEE 802.3bs standard has defined 400 GbE BASE-LR8, which uses eight parallel optical lanes, and each optical lane supports a rate of 50 Gbps. The "rate of 50 Gbps" herein is a rate for transmitting a payload. A rate for transmitting a payload and an overhead is 53.125 Gbps. The 802.3bs standard also defines 400GBASE-DR4, which uses four parallel optical lanes, and each optical lane supports a rate of 100 Gbps. The "rate of 100 Gbps" herein is a rate for transmitting a payload, excluding an overhead, such as an FEC overhead. A rate for transmitting a payload and an overhead is approximately 106.25 Gbps. In the 802.3cu project, four wavelengths are multiplexed onto one optical lane in WDM mode, and each wavelength carries a rate of 100 Gbps. In this disclosure, unless otherwise limited, the "transmission rate" refers to a rate at which a payload is transmitted.

After multiplexing from the virtual lane to the physical lane is performed, the second circuit transmits a first data stream to the first circuit through the physical lane, that is, transmits the first data stream to the first circuit through the Ethernet interface. The first data stream is RS-encoded data. After receiving the first data stream, the first circuit may perform BCH encoding on the first data stream by using a BCH encoder, to obtain a second data stream. Then, the second data stream is distributed to a logic lane, and is transmitted to a medium through the PMA and a physical media dependent (PMD) layer. The medium transmits the second data stream to another receive end, for example, a third circuit. The medium includes but is not limited to an optical fiber, a backplane, a copper cable, or the like.

In the implementation environment shown in FIG. 15, a lane for transmitting data in the second circuit is a virtual lane, and a physical lane for transmitting the first data stream between the second circuit and the first circuit is a first segment of lane. As the data receive end, the first circuit may not identify a boundary of an FEC codeword or an FEC symbol. After receiving the first data stream, the first circuit uses the first data stream as original data, and performs BCH encoding by bit stream. For example, the method is applicable to a case in which many random errors exist on the second segment of lane.

In an optional implementation environment, in a case in which the second circuit transmits the first data stream to the first circuit through a plurality of physical lanes, a skew exists in data between the plurality of physical lanes. For example, when the first data stream arrives at the first circuit from the second circuit through a circuit board or a cable, times at which simultaneously sent data arrives at the first circuit on all physical lanes are different. Therefore, in the method provided in this embodiment, before BCH encoding is performed on the first data stream, the data is first re-aligned. In this case, the implementation environment may be shown in FIG. 16. Based on the solution shown in FIG. 15, in the first circuit, before the BCH encoder processes the first data stream, the data received from the plurality of physical lanes is aligned at the PMA layer. For example, the first data stream constituted by the data received from the plurality of physical lanes is demultiplexed, to restore data on all virtual lanes. That is, data received from n physical lanes is converted into m groups of data, and then the m groups of data are aligned. For example, refer to the foregoing description of FIG. 15. Before the first data stream is transmitted to the first circuit, data on different virtual lanes is distinguished by using AMs. Therefore, before BCH encoding is performed on the first data stream, data on all virtual lanes can be aligned based on AMs, to obtain aligned data. Then, before FEC encoding is performed on an aligned first data stream, data distribution is performed to distribute data to a corresponding BCH encoder for BCH encoding.

Figure 16:
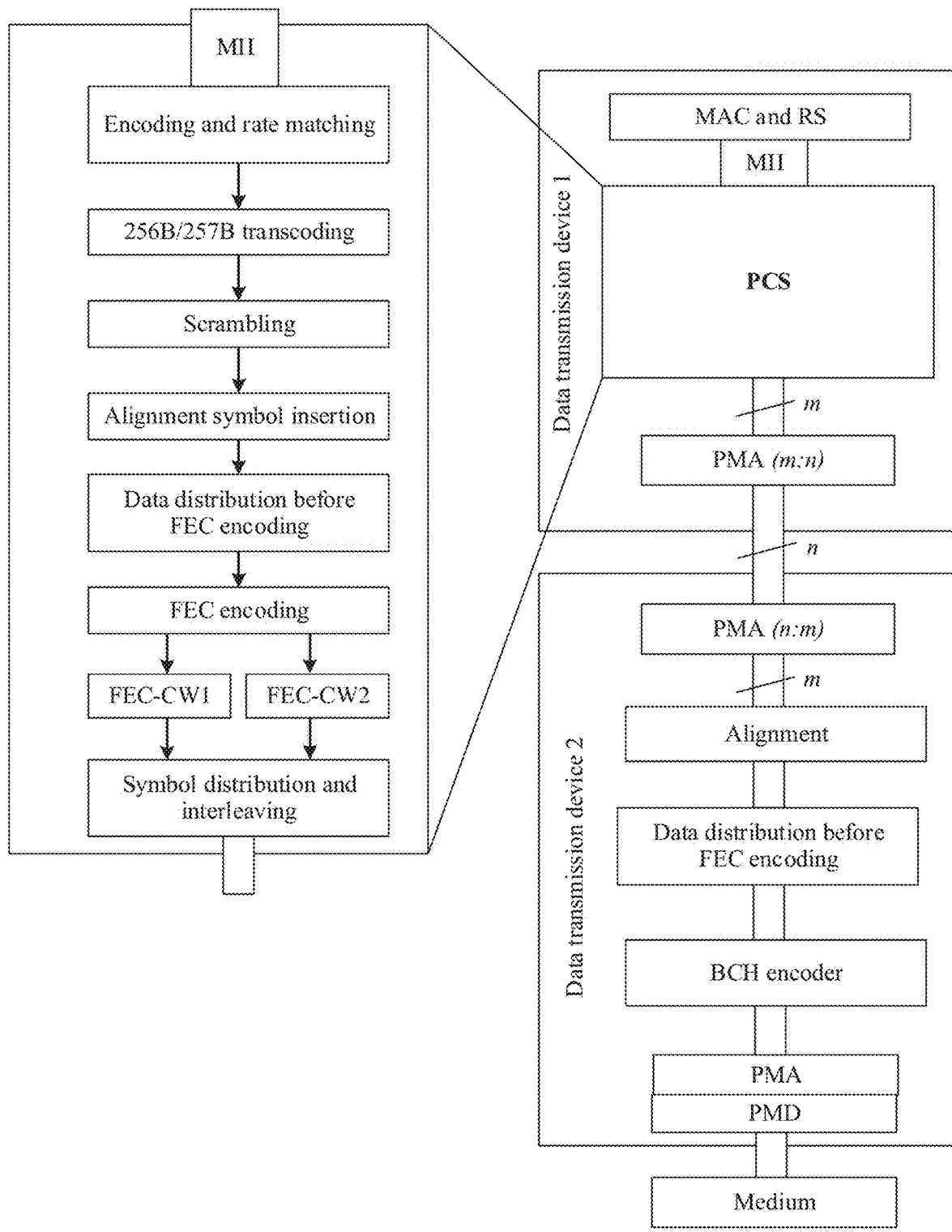
FIG. 16 is a schematic diagram of an implementation environment according to an embodiment.
Figure 17:
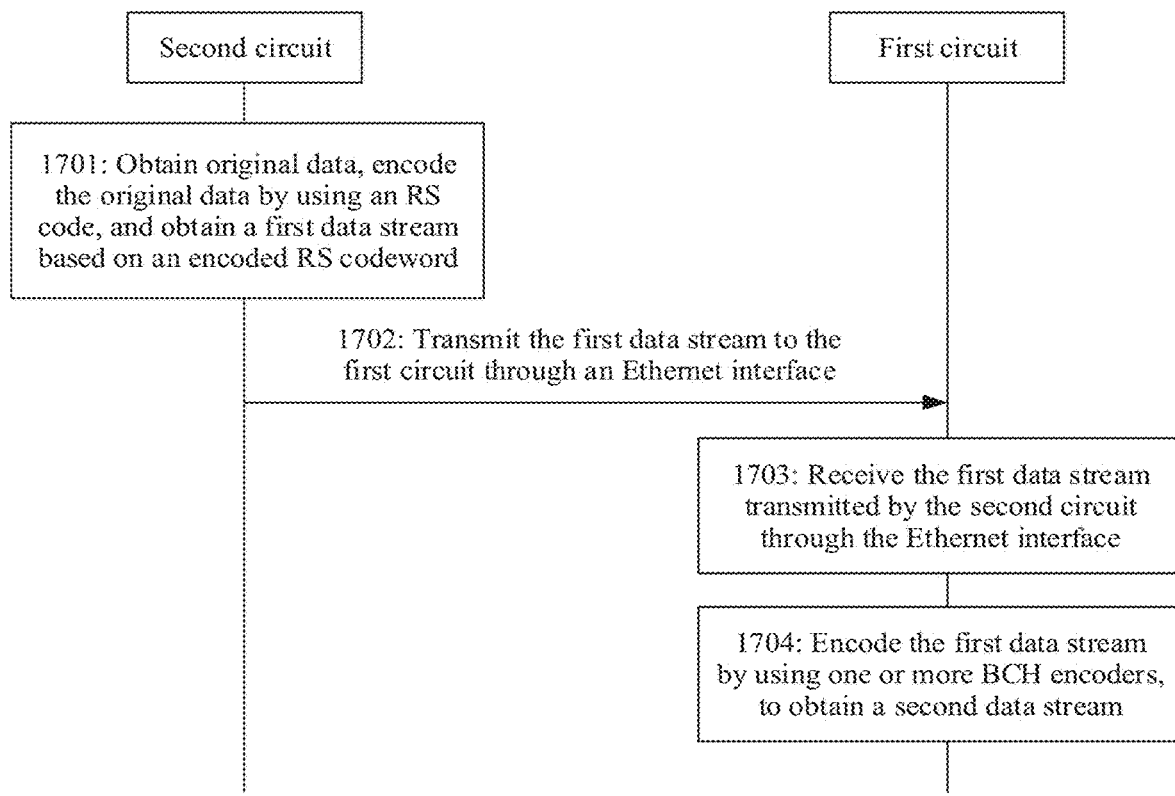
FIG. 17 is a flowchart of a data encoding method according to an embodiment.

Regardless of the implementation environment shown in FIG. 15 or the implementation environment shown in FIG. 16, for a data transmission process between the first circuit and the second circuit, an embodiment provides a data encoding method, and the method may be applied to the first circuit and the second circuit. Refer to FIG. 17. The method includes the following several steps.

Step 1701: The second circuit obtains original data, encodes the original data by using an RS code, and obtains a first data stream based on an encoded RS codeword.

As described in the description of the implementation environment shown in FIG. 15, the second circuit obtains the original data used for RS encoding from a MAC layer. The original data is transmitted from an MII to a PCS. After encoding and rate matching is performed on the original data at the PCS, 256B (bits)/257B transcoding is performed on the original data. After the transcoding, scrambling and alignment symbol insertion are sequentially performed on transcoded data. After alignment, data distribution is performed before FEC encoding, to distribute data to a corresponding RS encoder. The RS encoder encodes the original data to obtain an RS codeword, so as to obtain the first data stream based on an encoded RS codeword.

Step 1702: The second circuit transmits the first data stream to the first circuit through an Ethernet interface.

As described in the description of the implementation environment shown in FIG. 15, after two RS codewords are obtained through encoding by the RS encoder, the two RS codewords are interleaved, and interleaved data is distributed to a virtual lane. Data is transmitted to a PMA through the virtual lane, and the PMA performs bit multiplexing, so that the data on the virtual lane is multiplexed onto one or more physical lanes. In other words, when transmitting the first data stream to the first circuit through the Ethernet interface, the second circuit may transmit the first data stream through one or more physical lanes.

Step 1703: The first circuit receives the first data stream transmitted by the second circuit through the Ethernet interface.

Based on the foregoing manner in which the second circuit transmits the first data stream, in a possible implementation, that the first circuit receives the first data stream transmitted by the second circuit through the Ethernet interface includes: The first circuit receives, from a plurality of physical lanes, the first data stream transmitted by the second circuit through the Ethernet interface.

Step 1704: The first circuit performs BCH encoding on the first data stream, to obtain a second data stream.

After receiving the first data stream, the first circuit may perform FEC encoding on the first data stream again, for example, perform BCH encoding, to increase a gain by using a concatenated coding scheme. In a possible implementation, the first circuit includes one or more BCH encoders, and the first circuit receives the first data stream through one or more physical lanes. A quantity of BCH encoders is consistent with a quantity of physical lanes. After the first circuit receives the first data stream, each physical lane sends, to a BCH encoder connected to the physical lane, the first data stream transmitted on the physical lane; and the BCH encoder performs BCH encoding.

Figure 18:
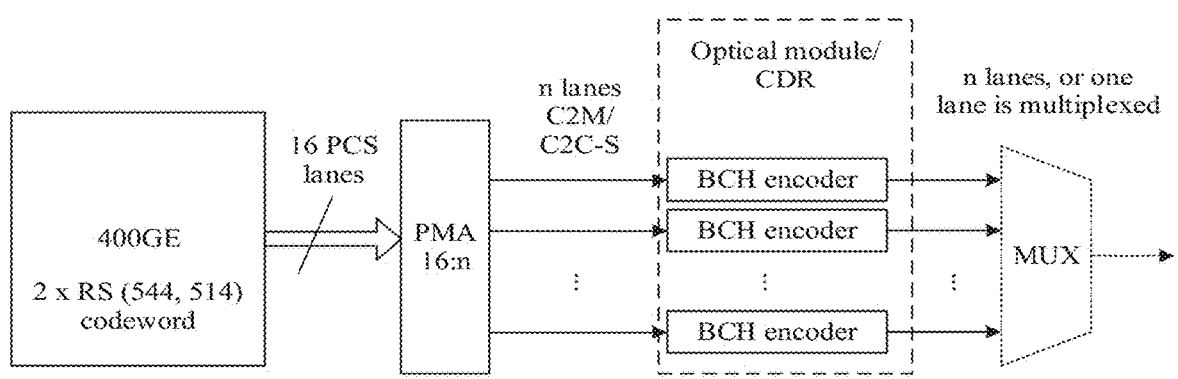
FIG. 18 is a schematic diagram of a data transmission process according to an embodiment.

A data transmission implementation environment shown in FIG. 18 is used as an example. In FIG. 18, an example in which the second circuit supports a 400 GbE interface and performs RS encoding on the original data based on RS (544, 514) defined in the 802.3bs standard is used. The second circuit performs RS encoding by using an RS encoder, to obtain two RS (544, 514) codewords. Data is transmitted to the PMA through 16 virtual lanes, and the PMA multiplexes the data based on a specification of 16: n, that is, multiplexes the data from the 16 virtual lanes onto n physical lanes, for example, a chip-to-module (C2M) or chip-to-chip-short (C2C-S) connection. The first circuit includes an optical module or a clock and data recovery (CDR) module. The CDR module may be a circuit, and the CDR module is also referred to as a retiming circuit (retimer) in the industry. The first circuit includes BCH encoders whose quantity is consistent with the quantity of physical lanes. After receiving a first data stream transmitted by a physical lane connected to each BCH encoder, the BCH encoder encodes the first data stream, and obtains a second data stream based on encoded data. As shown in FIG. 18, after the data is interleaved based on two RS (544, 514) codewords, the PMA performs 16:4 multiplexing. The first data stream is directly output through four physical lanes, and the first data stream from the four physical lanes may be respectively fed into four BCH encoders. Encoding is performed by bit stream in a time division multiplexing mode. Then, the second data stream is transmitted to another circuit, such as a third circuit, through the n physical lanes. Alternatively, the second data stream is transmitted to another circuit in a link multiplexing manner by multiplexing one physical lane.

A light FEC encoder, such as a BCH encoder, is added to the optical module to implement concatenated coding, and a further gain can be obtained in a concatenated manner, so that a data transmission distance can be further increased or a single-wavelength rate can be higher. The light FEC encoder, that is, the BCH encoder, may use a BCH (360, 340) encoding scheme. Certainly, another type of BCH encoder may alternatively be used. This is not limited in this embodiment.

In addition to a case in which the quantity of BCH encoders is consistent with the quantity of physical lanes, there is a case in which the quantity of BCH encoders included in the first circuit is less than the quantity of physical lanes. In this case, that the first circuit performs BCH encoding on the first data stream, to obtain a second data stream includes: The first circuit performs BCH encoding on the first data stream by using one or more BCH encoders in a time division multiplexing mode, to obtain the second data stream. Because the quantity of BCH encoders included in the first circuit is less than the quantity of physical lanes, one or more BCH encoders are multiplexed in a time division multiplexing mode, to implement BCH encoding on all of the first data stream.

In a possible implementation, when the quantity of BCH encoders included in the first circuit is inconsistent with the quantity of physical lanes, the first circuit further includes a scheduler, and that the first circuit performs BCH encoding on the first data stream, to obtain a second data stream includes: The first circuit schedules, by using the scheduler, a corresponding BCH encoder to perform BCH encoding on the first data stream, to obtain the second data stream. Because the quantity of BCH encoders is greater than or less than the quantity of physical lanes, a BCH encoder for encoding may be selected through scheduling by using the scheduler from a plurality of BCH encoders. In other words, the scheduler is configured to connect a physical lane to a corresponding BCH encoder, and the BCH encoder performs BCH encoding on the first data stream. In this case, the first circuit may further include a buffer. The first data stream transmitted on the physical lane is first stored in the buffer, and then the corresponding BCH encoder is scheduled by using the scheduler to perform BCH encoding.

Figure 19:
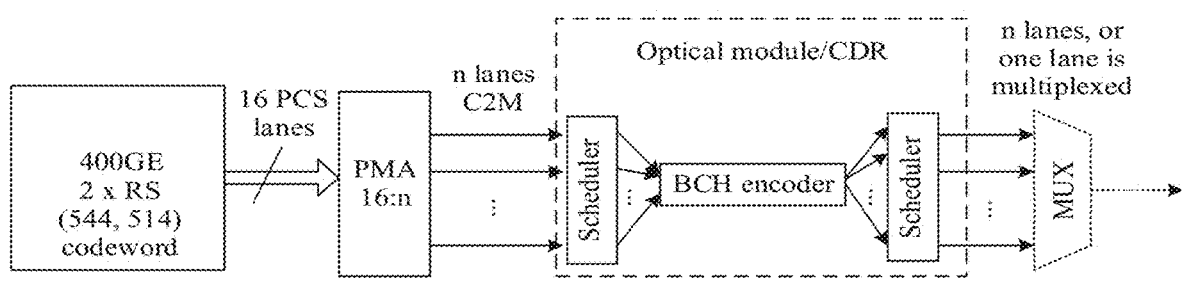
FIG. 19 is a schematic diagram of a data transmission process according to an embodiment.

A data transmission implementation environment shown in FIG. 19 is used as an example. In FIG. 19, an example in which the second circuit supports a 400 GbE interface and performs RS encoding on the original data based on RS (544, 514) defined in the 802.3bs standard is still used. The second circuit performs RS encoding by using an RS encoder, to obtain two RS (544, 514) codewords. Data is transmitted to the PMA through 16 virtual lanes, and the PMA multiplexes the data based on a specification of 16: n, that is, multiplexes the data from the 16 virtual lanes onto n physical lanes, for example, a C2M or C2C-S connection. The first circuit is an optical module or a CDR module, and includes one BCH encoder. The scheduler is used to schedule the BCH encoder to encode a first data stream transmitted on a physical lane, and obtains a second data stream based on encoded data. Then, the second data stream is transmitted to another circuit, for example, a third circuit, through the n physical lanes through scheduling by using the scheduler. Alternatively, the second data stream is transmitted to another circuit in a link multiplexing manner by multiplexing one physical lane.

Further, regardless of a structure shown in FIG. 18 or FIG. 19, in a possible implementation, the performing BCH encoding on the first data stream includes: filling data in the first data stream into a corresponding BCH codeword, where a reference quantity of consecutive symbols included in each BCH codeword are from different RS codewords.

It should be understood that if the first data stream is transmitted through only one physical lane, there is no data skew. Therefore, BCH encoding is directly performed on the first data stream without a need to identify a codeword boundary or a symbol boundary and change any existing or future manner of outputting data through an Ethernet interface. In addition to the foregoing examples shown in FIG. 18 and FIG. 19, the method provided in this embodiment may be flexibly extended to supporting any quantity of physical lanes. For example, in an 8×50 G solution, data on each physical lane may flow to one BCH encoder, or a relatively small quantity of BCH encoders (1, 2, 4, or the like) are used in a time division multiplexing mode. For another example, in a 1×100 G manner, a first data stream on one physical lane is fed into one BCH encoder for an encoding operation. This manner does not change any existing or future manner of outputting data through an Ethernet interface, but is merely placed in a data stream as an enhanced apparatus to perform secondary encoding, so that a higher gain can be obtained.

However, in the case in which the first data stream is carried by a plurality of physical lanes, skew between the lanes may cause the data blocks of the first data stream sent at the same time to arrive with different delays, so deskew of the data may be needed before encoding the first data stream. In a possible implementation, after the data in the first data stream is interleaved based on the reference quantity of RS codewords, to obtain symbol stream data, the symbol stream data is output to a plurality of virtual lanes, the symbol stream data is bit-multiplexed based on the quantity of physical lanes, and bit-multiplexed symbol stream data is transmitted to the first circuit through the plurality of physical lanes; before the filling data in the first data stream into a corresponding BCH codeword, the method further includes: The first circuit demultiplexes the first data stream, to restore data on all virtual lanes, and aligns the data on all the virtual lanes, to obtain aligned data; and the filling data in the first data stream into a corresponding BCH codeword includes: filling the aligned data into the corresponding BCH codeword.

Regardless of whether an alignment operation needs to be performed, manners of filling data in the first data stream into the corresponding BCH codeword include but are not limited to the following three manners.

Manner 1: For example, the first data stream includes a first quantity of RS codewords, each RS codeword includes a first target quantity of symbols, and the data in the first data stream is interleaved based on the first quantity of RS codewords; and each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: sequentially filling the first half of data in each row of the first data stream into the first third quantity of BCH codewords in the second quantity of BCH codewords, and sequentially filling the second half of data in each row of the first data stream into the last third quantity of BCH codewords in the second quantity of BCH codewords, where the third quantity is half of the second quantity, and a first quantity of consecutive symbols included in each BCH codeword are from different RS codewords. The first quantity may be determined based on an RS code type, or determined based on a scenario or experience. This is not limited in this embodiment.

For example, the first target quantity is 544, the first quantity is 2, the second quantity is 32, and the second target quantity is 360. The filling data in the first data stream into a corresponding BCH codeword includes: sequentially filling the first half of data in each row of the first data stream into the first 16 BCH codewords in 32 BCH codewords, and sequentially filling the second half of data in each row of the first data stream into the last 16 BCH codewords in the 32 BCH codewords, where two consecutive symbols included in each BCH codeword are from different RS codewords.

Figure 20:
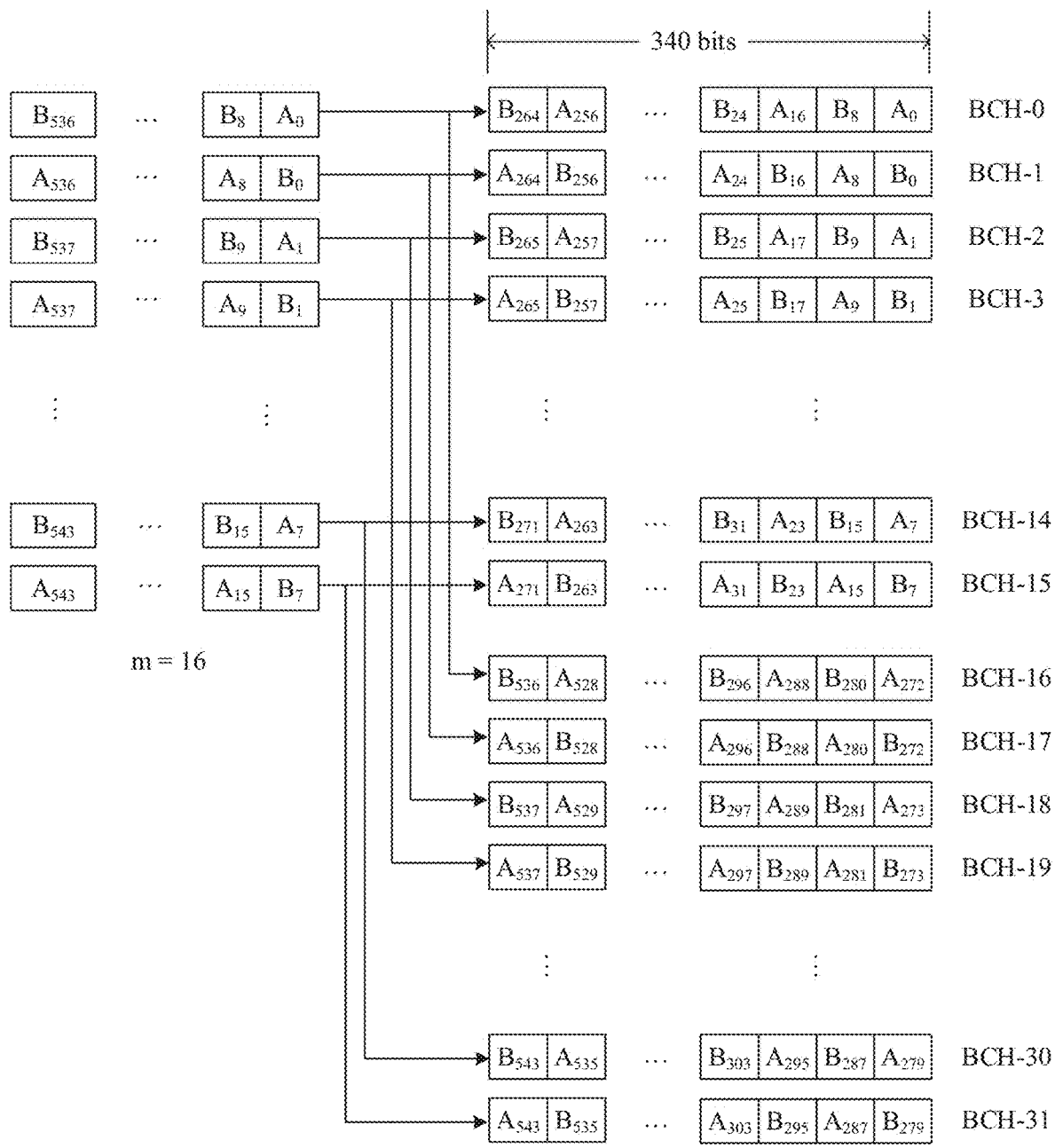
FIG. 20 is a schematic diagram of a BCH encoding process according to an embodiment.

A BCH encoding process shown in FIG. 20 is used as an example. FIG. 20 is a schematic diagram of the BCH encoding process in Manner 1. As shown in FIG. 20, an Ethernet interface of the second circuit has 16 virtual lanes, that is, m=16. The first data stream includes two RS codewords, and each RS codeword has 544 symbols. For example, A and B respectively represent the two RS codewords. Subscripts of A and B respectively represent different symbols in the codewords. After the data in the first data stream is interleaved based on two RS codewords, interleaved data is shown on the left side of FIG. 20. Data on the 16 virtual lanes is filled into the BCH codewords on the right side, for example, the first row of data A0B8A16B24 . . . . A528B536 in the first data stream is divided into two parts. The first part is sequentially filled into the first codeword of the 32 BCH codewords, that is, BCH-0. The second part is sequentially filled into the 17th codeword of the 32 BCH codewords, that is, BCH-16. The second row data of the first data stream is divided into two parts. The first part is sequentially filled into the second codeword of the 32 BCH codewords, that is, BCH-1. The second part is sequentially filled into the 18th codeword of the 32 BCH codewords, that is, BCH-17. The rest may be deduced by analogy, until all data in the first data stream is filled into corresponding BCH codewords. In addition, in this manner, two consecutive symbols included in each BCH codeword are from different RS codewords.

Manner 2: For example, the first data stream includes a first quantity of RS codewords, each RS codeword includes a first target quantity of symbols, the data in the first data stream is interleaved based on the first quantity of RS codewords, and symbols at the beginning or the end of each column of data in the first data stream are permuted; and each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: sequentially filling each column of data of the first data stream into the second quantity of BCH codewords, where a first quantity of consecutive symbols included in each BCH codeword are from different RS codewords.

For example, the first target quantity is 544, the first quantity is 2, the second quantity is 32, and the second target quantity is 360. The filling data in the first data stream into a corresponding BCH codeword includes: sequentially filling each column of data of the first data stream into 32 BCH codewords, where two consecutive symbols included in each BCH codeword are from different RS codewords.

Figure 21:
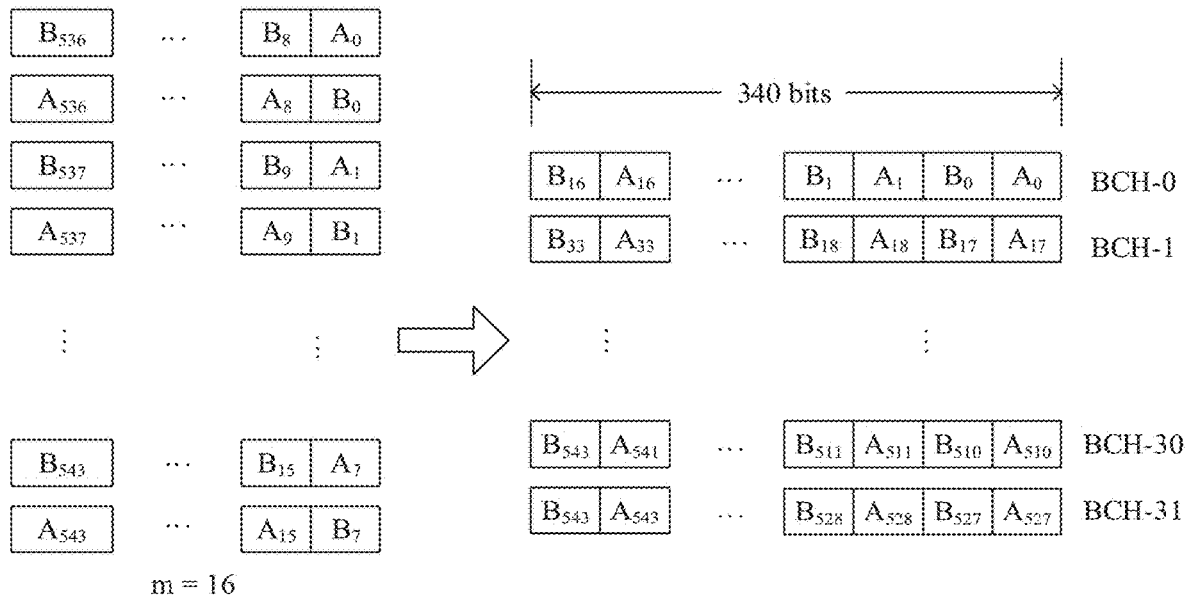
FIG. 21 is a schematic diagram of a BCH encoding process according to an embodiment.

A BCH encoding process shown in FIG. 21 is used as an example. FIG. 21 is a schematic diagram of the BCH encoding process in Manner 2. As shown in FIG. 21, an Ethernet interface of the second circuit has 16 virtual lanes, that is, m=16. The first data stream includes two RS codewords, and each RS codeword has 544 symbols. For example, A and B respectively represent the two RS codewords. Subscripts of A and B respectively represent different symbols in the codewords. After the data in the first data stream is interleaved based on two RS codewords, interleaved data is shown on the left side of FIG. 21. It can be learned from FIG. 21 that, starting from the second column in the first data stream, symbols at the beginning of each column of data are permuted. In this way, it is ensured that two consecutive symbols included in each BCH codeword are from different RS codewords when each column of data is sequentially filled into one of the 32 BCH codewords. For example, A0B0A1B1 . . . . A16B16 is sequentially filled into BCH-0, and A17B17A18B18 . . . . A33B33 is sequentially filled into BCH-1. The rest may be deduced by analogy. In this way, the data in the first data stream is filled into the corresponding BCH codeword. Certainly, FIG. 21 is described by using merely an example in which symbols at the beginning of the second column are permuted. In addition, symbols at the end of each column may be permuted.

It should be noted that Manner 1 and Manner 2 are merely used as examples to implement that two consecutive symbols included in each BCH codeword are from different RS codewords. In addition, another manner may alternatively be used to implement that two consecutive symbols included in each BCH codeword are from different RS codewords, that is, a case in which two consecutive symbols are from a same RS codeword does not exist. This is not limited in this embodiment.

In addition, both Manner 1 and Manner 2 are used to implement BCH encoding when the first circuit does not modify an interleaving manner after the data in the first data stream is interleaved. Then, to increase an interleaving depth, in the method provided in this embodiment, the first circuit may further re-interleave the data in the first data stream after receiving the first data stream. For details of a BCH encoding method in this manner, refer to Manner 3 in the following.

Manner 3: The first data stream includes a first quantity of RS codewords, each RS codeword includes a first target quantity of symbols, and the data in the first data stream is interleaved based on the first quantity of RS codewords; and each BCH encoder corresponds to a second quantity of BCH codewords, each BCH codeword includes a second target quantity of symbols, the second target quantity is determined based on the first target quantity, and the second quantity is determined based on the first quantity. The filling data in the first data stream into a corresponding BCH codeword includes: de-interleaving the data in the first data stream, to obtain original RS codewords; interleaving the original RS codewords based on a fourth quantity of RS codewords, to obtain interleaved data, where the fourth quantity is greater than the first quantity; and sequentially filling each row of data of the interleaved data into the second quantity of BCH codewords, where a fourth quantity of consecutive symbols included in each BCH codeword are from different RS codewords.

Because the data in the first data stream has been interleaved, according to the method provided in this embodiment, after the first data stream is obtained, the data in the first data stream is first de-interleaved, to obtain the original RS codewords. Then, re-interleaving is performed. More codewords are used for interleaving. This increases the interleaving depth. Then, each row of data of re-interleaved data is sequentially filled into the second quantity of BCH codewords. In this manner, the fourth quantity may be determined based on an RS code type, or determined based on a scenario or experience. This is not limited in this embodiment. Because a re-interleaving depth is greater than the previous interleaving depth in the first data stream, the fourth quantity is greater than the first quantity. In addition, the first circuit may be disposed with a buffer, so as to perform interleaving after the first circuit receives a fourth quantity of codewords.

Figure 22:
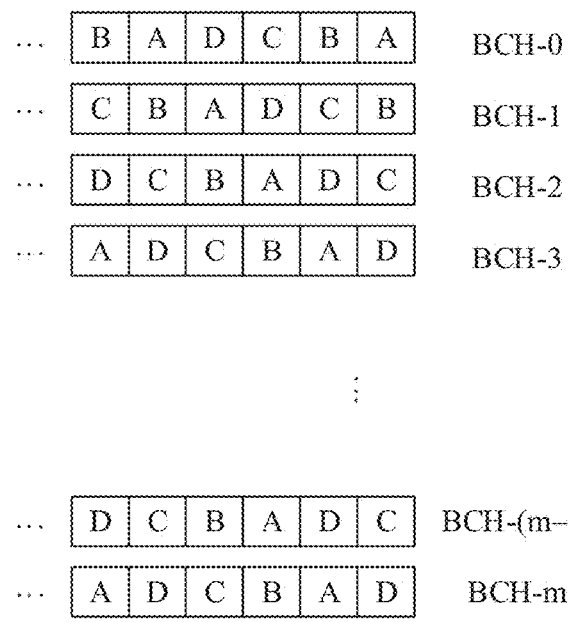
FIG. 22 is a schematic diagram of a BCH encoding process according to an embodiment.

For example, the first target quantity is 544, the first quantity is 2, the fourth quantity is 4, and the second target quantity is 360. The first circuit further de-interleaves the first data stream, to restore original RS-FEC codewords. In this way, more RS-FEC codewords can be accumulated for stronger interleaving, for example, four codewords are used for interleaving. When receiving the first data stream, the first circuit buffers the first data stream, and performs interleaving after receiving all four codewords. BCH encoding processes shown in FIG. 22 and FIG. 23 are used as examples. FIG. 22 and FIG. 23 are schematic diagrams of the BCH encoding process in Manner 3. FIG. 22 and FIG. 23 shows examples of two interleaving manners respectively. A, B, C, and D represent symbols from different RS-FEC codewords. Because letters A to D in FIG. 22 and FIG. 23 do not have subscript numbers, the letters A to D only represent different symbols from different codewords. Four RS codewords are used for interleaving, so that any four consecutive symbols are from different RS codewords.

It should be noted that, in the foregoing three implementations of filling data in the first data stream into a corresponding BCH codeword, the first target quantity may be determined based on an RS code type. For example, for RS (544, 514), the first target quantity is 544, and each RS codeword includes 544 symbols. The second target quantity may be determined based on the first target quantity. For RS (544, 514), BCH (360, 340) may be used, and the second target quantity is 360. For another example, for RS (528, 514), the first target quantity is 528, and each RS codeword includes 528 symbols. In addition, in the method provided in this embodiment, two-level coding based on RS code and BCH code is used. A specific RS code type and a specific BCH code type are not limited in this embodiment. In other words, for different code types, the first target quantity and the second target quantity may alternatively have other values. In addition, the first target quantity of symbols and the second target quantity of symbols may be 10-bit symbols, or may be 1-bit symbols or symbols having another length. A length of a symbol is not limited in this embodiment.

In addition, no matter which manner is used to fill the data in the first data stream into the corresponding BCH codeword, for a BCH encoding scheme, a polynomial $p(x)=x^{10}+x^3+x+1$ may be used. In other words, the BCH encoder may perform encoding according to the polynomial $p(x)=x^{10}+x^3+x+1$, to obtain the second data stream. Certainly, in addition to the polynomial P(x), another polynomial used for BCH encoding may alternatively be used. This is not limited in this disclosure.

In a possible implementation, after the first circuit performs BCH encoding on the first data stream, to obtain the second data stream, the method further includes: transmitting the second data stream to the third circuit by using a medium through the plurality of physical lanes, or transmitting the second data stream to the third circuit by using the medium through one physical lane in a time division multiplexing mode. The medium includes but is not limited to an optical fiber, a backplane, or a copper cable. A 100 GbE Ethernet port is used as an example. Data may be sent in a manner that one wavelength carries a rate of 100 Gbps, and is transmitted through an optical fiber. Alternatively, one electrical port transmits a signal at a rate of 100 Gbps through a backplane or a copper cable. Alternatively, an 800 GbE port that may emerge in the future is used as an example. There may be various solutions such as 8×100 G and 4×200 G, and transmission may be performed through an optical fiber, a backplane, or a copper cable.

Refer to FIG. 24. An embodiment provides a data decoding method. The method may be applied to a third circuit, and the third circuit is configured to decode the second data stream that is obtained by performing encoding by using the encoding method shown in FIG. 17. As shown in FIG. 24, the method includes the following several steps.

Block 2401: The third circuit receives second data streams transmitted by a first circuit, where the second data streams are obtained through encoding by using an RS code and a BCH code.

In a possible implementation, that the third circuit receives second data streams transmitted by a first circuit includes: receiving, by using a medium, the second data streams transmitted by the first circuit through a plurality of physical lanes, or receiving, by using the medium, the second data streams transmitted by the first circuit through one physical lane in a time division multiplexing mode. The medium includes but is not limited to an optical fiber, a backplane, or a copper cable. Because the first circuit uses the encoding method shown in FIG. 17 to perform BCH encoding on a first data stream that is obtained through encoding by using the RS code, the second data streams are obtained through encoding by using the RS code and the BCH code.

Block 2402: The third circuit decodes the second data streams by using the BCH code, to obtain the first data stream.

The BCH code used by the third circuit to decode the second data streams is consistent with a code type used by the first circuit to perform BCH encoding on the first data stream, so as to ensure that the third circuit can successfully decode the second data streams to obtain the first data stream.

The first circuit may transmit the second data streams through one physical lane in a time division multiplexing mode, or through a plurality of physical lanes. Therefore, in a possible implementation, before the decoding the second data streams by using the BCH code, to obtain a first data stream, the method further includes: demultiplexing the second data streams when the second data streams transmitted by the first circuit through one physical lane in a time division multiplexing mode are received by using the medium; and the decoding the second data streams by using the BCH code, to obtain a first data stream includes: decoding demultiplexed data streams by using the BCH code, to obtain the first data stream.

For a manner in which the second data streams are transmitted through a plurality of physical lanes, to avoid a skew when data in the second data streams reaches the third circuit, in a possible implementation, before the decoding the second data streams by using the BCH code, the method further includes: aligning the demultiplexed second data streams; and the decoding demultiplexed second data streams by using the BCH code, to obtain the first data stream includes: decoding aligned second data streams by using the BCH code, to obtain the first data stream. Because an AM character is not changed during BCH encoding, when the demultiplexed second data streams are to be aligned, an existing AM character in the second data streams may be reused to align the demultiplexed second data streams.

Block 2403: The third circuit decodes the first data stream by using the RS code, to obtain original data.

The RS code used by the third circuit to decode the first data stream is consistent with an RS code type used for encoding data in the first data stream, so as to ensure that the third circuit can successfully decode the first data stream to obtain the original data.

Figure 25:
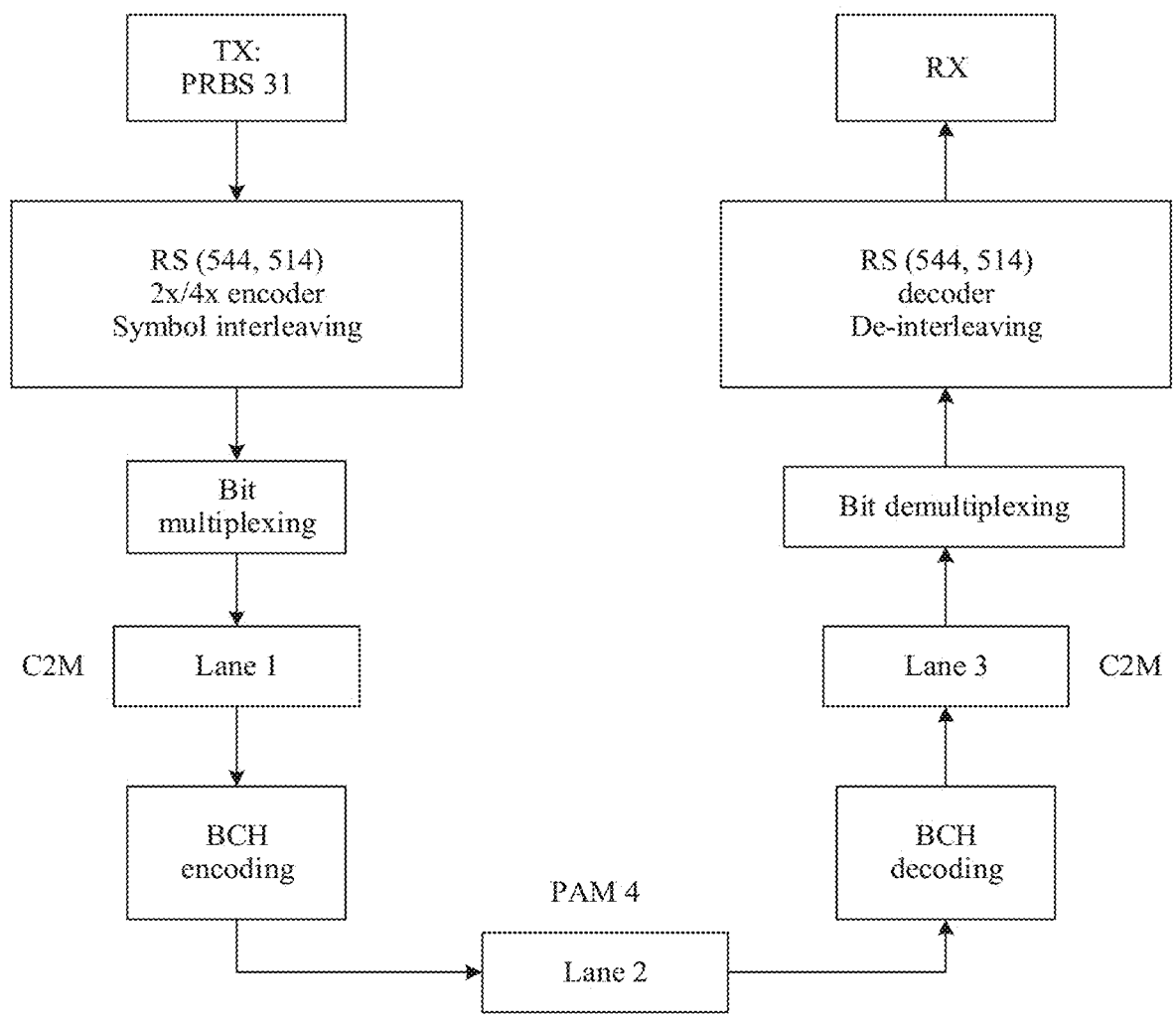
FIG. 25 is a schematic diagram of a data transmission process according to an embodiment.

Based on the foregoing data encoding method and data decoding method, in this embodiment, modeling is performed to verify the solution on a field-programmable gate array (FPGA). As shown in FIG. 25, that a pseudorandom binary sequence (PRBS) 31 is used as original data is used as an example. The PRBS 31 is a type of test data for generating a pseudo-random sequence as a system input. The original data is encoded at an encoder side based on RS (544, 514). Then, a result of interleaving four RS codewords is used as an example, and a first data stream obtained after interleaving is transmitted through a lane 1 in a bit multiplexing manner to a BCH encoder for BCH encoding, to obtain a second data stream. Then, the second data stream is transmitted to a decoder side through a lane 2. The decoder side first performs BCH decoding on the second data stream, to obtain the first data stream. Then, after the first data stream is transmitted through a lane 3, bit demultiplexing is performed, and de-interleaving is performed on demultiplexed data. RS decoding is performed by using an RS (544, 514) decoder, to obtain the original data.

Figure 26:
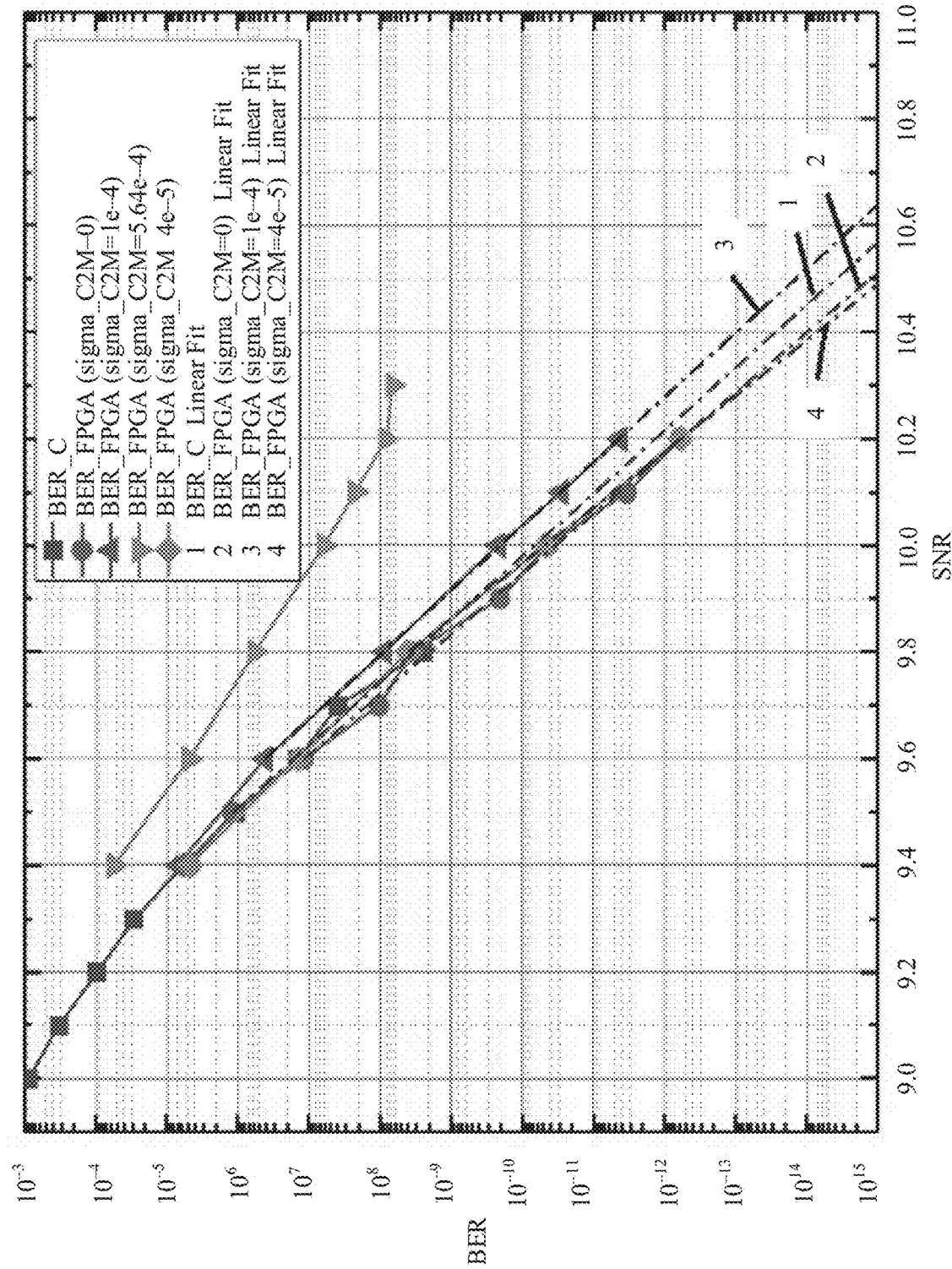
FIG. 26 is a schematic diagram of an experimental result of interleaving by using four codewords according to an embodiment.

According to the foregoing interleaving process, a gain is increased. As shown in a comparison diagram in FIG. 26, in comparison with RS-FEC provided in the 802.3bs standard, in the 1E-15 post FEC BER region, a concatenated coding scheme provided in this embodiment can increase a 2 dB net gain. On an electrical interface or an optical interface, an extra net gain can greatly increase a signal transmission distance.

Figure 27:
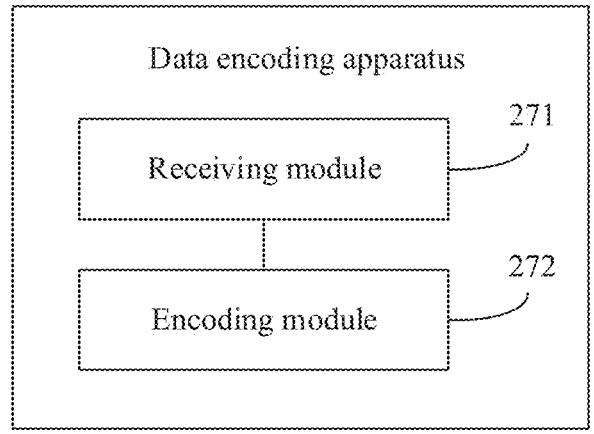
FIG. 27 is a schematic diagram of a structure of a data encoding apparatus according to an embodiment.

Refer to FIG. 27. An embodiment provides a data encoding apparatus. The apparatus is configured to perform the foregoing data encoding method. As shown in FIG. 27, the apparatus includes: a receiving module 271 configured to receive a first data stream transmitted by a second circuit through an Ethernet interface, where the first data stream is obtained by encoding original data by using an RS code; and an encoding module 272 configured to perform BCH encoding on the first data stream, to obtain a second data stream.

In a possible implementation, the receiving module 271 is configured to receive, from a plurality of physical lanes, the first data stream transmitted by the second circuit through the Ethernet interface; and the apparatus includes one or more BCH encoders, and the encoding module 272 is configured to: when a quantity of included BCH encoders is consistent with a quantity of physical lanes, where one BCH encoder is corresponds to one physical lane, perform, by using the one or more BCH encoders, BCH encoding on the first data stream transmitted on a corresponding physical lane, to obtain the second data stream.

In a possible implementation, the receiving module 271 is configured to receive, from a plurality of physical lanes, the first data stream transmitted by the second circuit through the Ethernet interface; and the apparatus includes one or more BCH encoders and further includes a scheduler, and the encoding module 272 is configured to: when a quantity of BCH encoders included in the apparatus is inconsistent with a quantity of physical lanes, schedule, by using the scheduler, a corresponding BCH encoder to perform BCH encoding on the first data stream, to obtain the second data stream.

In a possible implementation, the encoding module 272 is configured to fill data in the first data stream into a corresponding BCH codeword, where a reference quantity of consecutive symbols included in each BCH codeword are from different RS codewords.

Figure 28:
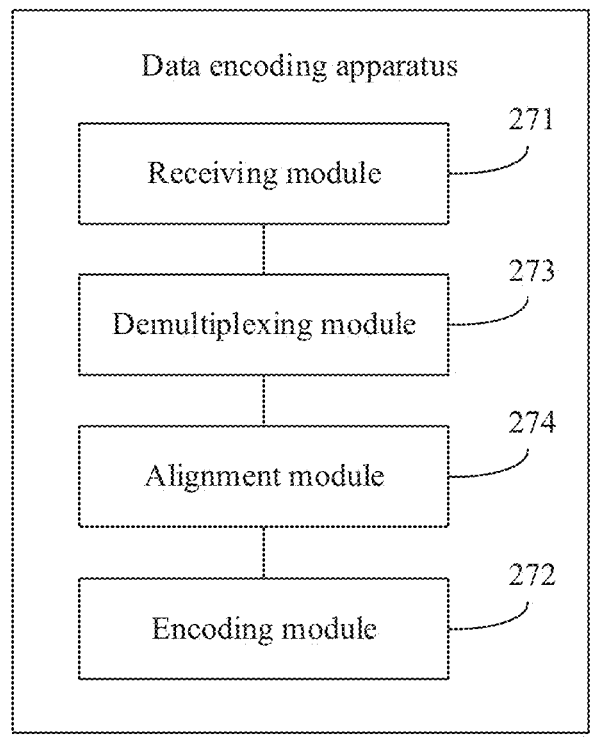
FIG. 28 is a schematic diagram of a structure of a data encoding apparatus according to an embodiment.

In a possible implementation, after the data in the first data stream is interleaved based on the reference quantity of RS codewords, to obtain symbol stream data, the symbol stream data is output to a plurality of virtual lanes, the symbol stream data is bit-multiplexed based on the quantity of physical lanes, and bit-multiplexed symbol stream data is transmitted to the data encoding apparatus through the plurality of physical lanes;

Refer to FIG. 28. The data encoding apparatus further includes: a demultiplexing module 273 configured to demultiplex the first data stream, to restore data on all virtual lanes; and an alignment module 274 configured to align the data on all the virtual lanes, to obtain aligned data, where the encoding module 272 is configured to fill the aligned data into the corresponding BCH codeword.

In a possible implementation, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity.

The encoding module 272 is configured to: sequentially fill the first half of data in each row of the first data stream into the first third quantity of BCH codewords in the second quantity of BCH codewords, and sequentially fill the second half of data in each row of the first data stream into the last third quantity of BCH codewords in the second quantity of BCH codewords, where the third quantity is half of the second quantity, and a first quantity of consecutive symbols included in each BCH codeword are from different RS codewords.

In a possible implementation, the first target quantity is 544, the first quantity is 2, the second quantity is 32, and the second target quantity is 360.

The encoding module 272 is configured to: sequentially fill the first half of data in each row of the first data stream into the first 16 BCH codewords in 32 BCH codewords, and sequentially fill the second half of data in each row of the first data stream into the last 16 BCH codewords in the 32 BCH codewords, where two consecutive symbols included in each BCH codeword are from different RS codewords.

In a possible implementation, the first data stream includes a first quantity of RS codewords, each RS codeword includes a first target quantity of symbols, the data in the first data stream is interleaved based on the first quantity of RS codewords, and symbols at the beginning or the end of each column of data in the first data stream are permuted. Each BCH encoder corresponds to a second quantity of BCH codewords, each BCH codeword includes a second target quantity of symbols, the second target quantity is determined based on the first target quantity, and the second quantity is determined based on the first quantity.

The encoding module 272 is configured to sequentially fill each column of data of the first data stream into the second quantity of BCH codewords, where a first quantity of consecutive symbols included in each BCH codeword are from different RS codewords.

In a possible implementation, the first target quantity is 544, the first quantity is 2, the second quantity is 32, and the second target quantity is 360.

The encoding module 272 is configured to sequentially fill each column of data of the first data stream into 32 BCH codewords, where two consecutive symbols included in each BCH codeword are from different RS codewords.

In a possible implementation, the first data stream includes a first quantity of RS codewords, each RS codeword includes a first target quantity of symbols, and the data in the first data stream is interleaved based on the first quantity of RS codewords. Each BCH encoder corresponds to a second quantity of BCH codewords, each BCH codeword includes a second target quantity of symbols, the second target quantity is determined based on the first target quantity, and the second quantity is determined based on the first quantity.

The encoding module 272 is configured to: de-interleave the data in the first data stream, to obtain original RS codewords; interleave the original RS codewords based on a fourth quantity of RS codewords, to obtain interleaved data, where the fourth quantity is greater than the first quantity; and sequentially fill each row of data of the interleaved data into the second quantity of BCH codewords, where a fourth quantity of consecutive symbols included in each BCH codeword are from different RS codewords.

Figure 29:
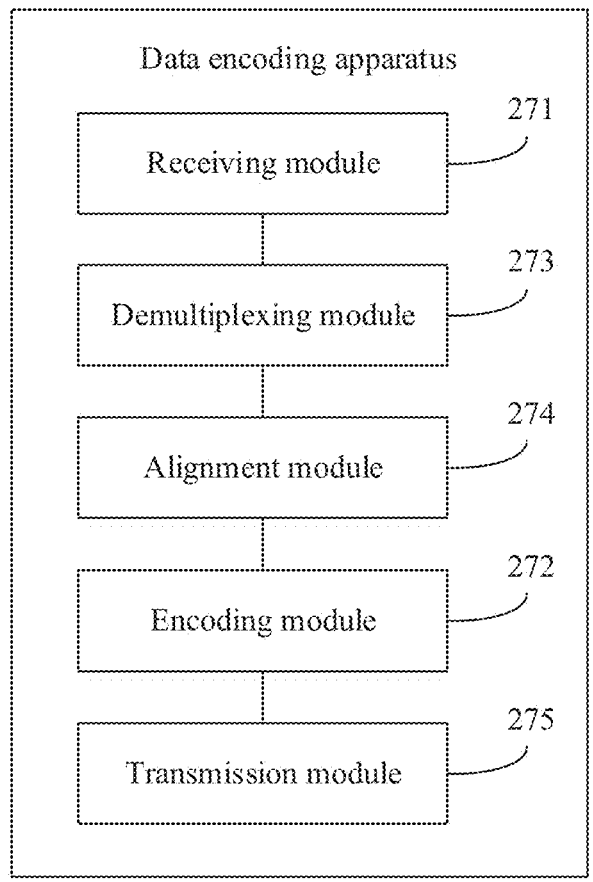
FIG. 29 is a schematic diagram of a structure of a data encoding apparatus according to an embodiment.

Refer to FIG. 29. The data encoding apparatus further includes: a transmission module 275 configured to: transmit the second data stream to a third circuit by using a medium through the plurality of physical lanes, or transmit the second data stream to the third circuit by using the medium through one physical lane in a time division multiplexing mode.

Figure 30:
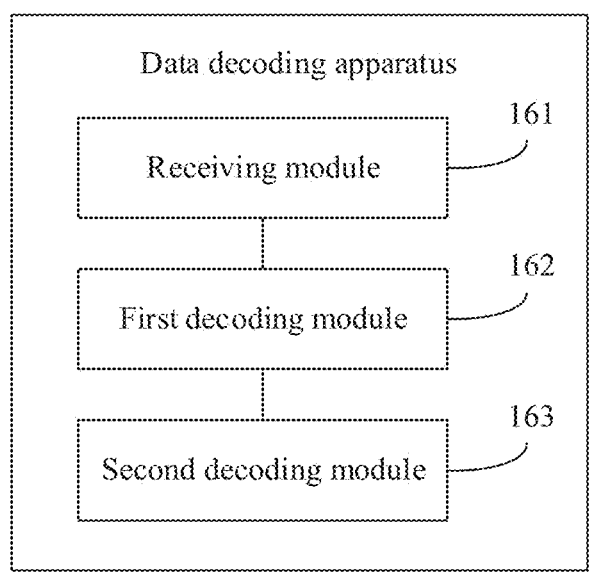
FIG. 30 is a schematic diagram of a structure of a data decoding apparatus according to an embodiment.

Refer to FIG. 30. An embodiment provides a data decoding apparatus. The apparatus is configured to perform the foregoing data decoding method. As shown in FIG. 30, the apparatus includes: a receiving module 161 configured to receive second data streams transmitted by a first circuit, where the second data streams are obtained through encoding by using an RS code and a BCH code; a first decoding module 162 configured to decode the second data streams by using the BCH code, to obtain a first data stream; and a second decoding module 163 configured to decode the first data stream by using the RS code, to obtain original data.

In a possible implementation, the receiving module 161 is configured to: receive, by using a medium, the second data streams transmitted by the first circuit through a plurality of physical lanes, or receive, by using the medium, the second data streams transmitted by the first circuit through one physical lane in a time division multiplexing mode.

Figure 31:
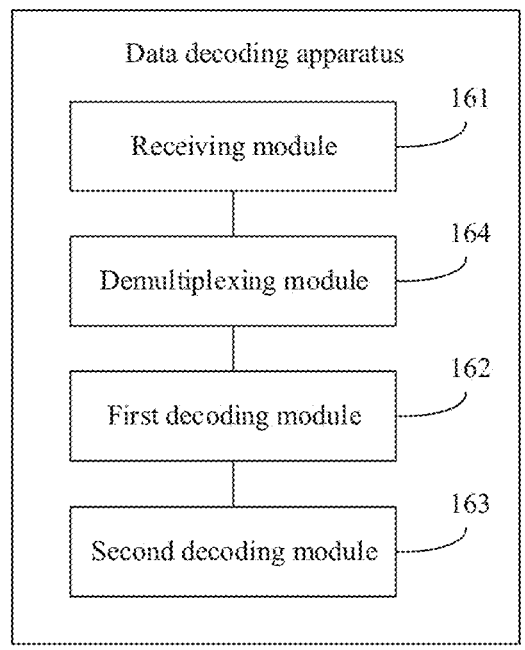
FIG. 31 is a schematic diagram of a structure of a data decoding apparatus according to an embodiment.

In a possible implementation, as shown in FIG. 31, the data decoding apparatus further includes: a demultiplexing module 164 configured to demultiplex the second data streams when the second data streams transmitted by the first circuit through one physical lane in a time division multiplexing mode are received by using the medium, where the first decoding module 162 is configured to decode demultiplexed data streams by using the BCH code, to obtain the first data stream.

Figure 32:
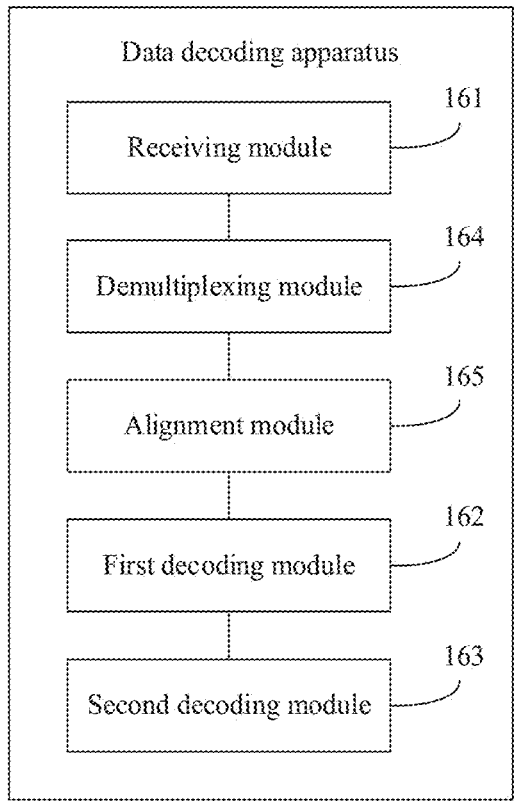
FIG. 32 is a schematic diagram of a structure of a data decoding apparatus according to an embodiment.

In a possible implementation, as shown in FIG. 32, the data decoding apparatus further includes: an alignment module 165 configured to align the demultiplexed second data streams, where the first decoding module 162 is configured to decode aligned second data streams by using the BCH code, to obtain the first data stream.

It should be understood that, when the apparatus provided in the foregoing implements functions of the apparatus, division into the foregoing functional modules is merely used as an example for description. During actual application, the foregoing functions may be allocated to different functional modules for implementation based on a requirement. In other words, a device is divided into different functional modules in terms of an inner structure, to implement all or a part of the functions described above. In addition, the apparatus in the foregoing embodiments and the method embodiments are based on a same concept. For a specific implementation process, refer to the method embodiments, and details are not described herein again.

It should be noted that the first circuit, the second circuit, the third circuit, the data encoding apparatus, and the data decoding apparatus may be implemented in one or more chips.

Figure 33:
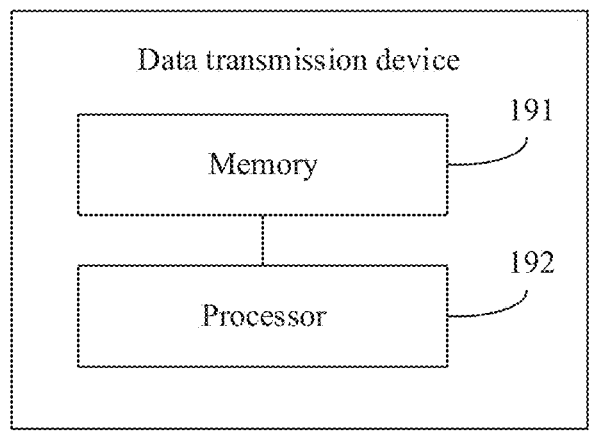
FIG. 33 is a schematic diagram of a structure of a data transmission device according to an embodiment.

Based on a same concept, an embodiment further provides a data transmission device. Refer to FIG. 33. The device includes a memory 191 and a processor 192. The memory 191 stores at least one instruction, and the at least one instruction is loaded and executed by the processor 192, to implement either of the foregoing data encoding method and data decoding method provided in the embodiments.

Figure 34:
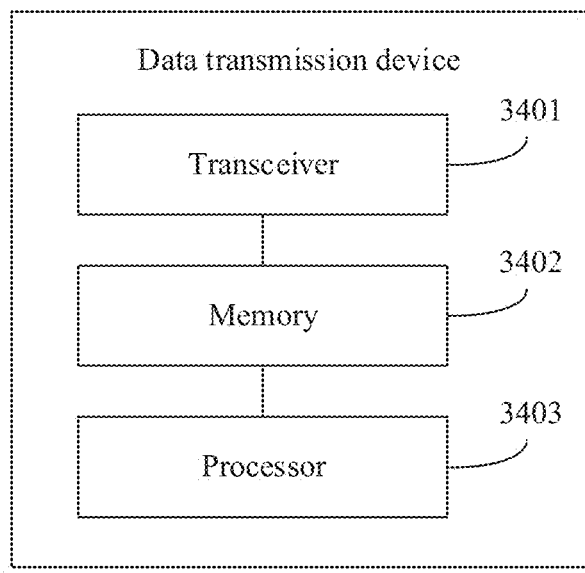
FIG. 34 is a schematic diagram of a structure of a data transmission device according to an embodiment.

An embodiment further provides a data transmission device. Refer to FIG. 34. The device includes a transceiver 3401, a memory 3402, and a processor 3403. The transceiver 3401, the memory 3402, and the processor 3403 communicate with each other through an internal connection path. The memory 3402 is configured to store instructions. The processor 3403 is configured to execute the instructions stored in the memory, to control the transceiver 3401 to receive a signal, and control the transceiver 3401 to send a signal. In addition, when the processor 3403 executes the instructions stored in the memory 3402, the processor 3403 is enabled to perform either of the foregoing data encoding method and data decoding method.

An embodiment further provides a data transmission system. The system includes the data encoding apparatus shown in any one of FIG. 27 to FIG. 29 and the data decoding apparatus shown in any one of FIG. 30 to FIG. 32.

The data encoding apparatus and the data decoding apparatus in this embodiment may be personal computers (PCs), servers, or network devices. For example, the data encoding device and the data decoding device may be routers, switches, servers, or the like.

An embodiment further provides a computer-readable storage medium. The storage medium stores at least one instruction, and the instruction is loaded and executed by a processor, to implement either of the foregoing data encoding method and data decoding method provided in the embodiments.

An embodiment further provides a circuit. The circuit includes a processor. The processor is configured to invoke and run instructions stored in a memory, so that a communications device that is installed with the circuit performs either of the foregoing data encoding method and data decoding method.

An embodiment further provides a circuit. The circuit includes an input interface, an output interface, a processor, and a memory. The input interface, the output interface, the processor, and the memory are connected to each other through an internal connection path. The processor is configured to execute code in the memory, and when the code is executed, the processor is configured to perform either of the foregoing data encoding method and data decoding method.

It should be understood that the processor may be a central processing unit (CPU), or may be another general-purpose processor, a DSP, an application-specific integrated circuit (ASIC), an FPGA, or another programmable logic device, a discrete gate or transistor logic device, or a discrete hardware component, or the like. The general-purpose processor may be a microprocessor, any conventional processor, or the like. It should be noted that the processor may be a processor that supports an Advanced RISC Machines (ARM) architecture.

Further, in an optional embodiment, there are one or more processors, and there are one or more memories. Optionally, the memory may be integrated with the processor, or the memory and the processor are separately disposed. The memory may include a ROM and a random-access memory (RAM), and provide instructions and data to the processor. The memory may further include a non-volatile RAM. For example, the memory may further store information about a device type.

In some embodiments, in the case where the first level FEC is RS and the second level FEC is BCH code, the BCH code may be replaced with an eBCH code, a Hamming Code, or an extended Hamming Code; accordingly, the BCH encoder can replaced with an extended eBCH code encoder, a Hamming Code encoder, or an extended Hamming Code encoder.

The memory may be a volatile memory or a nonvolatile memory, or may include both a volatile memory and a nonvolatile memory. The nonvolatile memory may be a ROM, a programmable ROM (PROM), an erasable PROM (EPROM), an electrically erasable PROM (EEPROM), or a flash memory. The volatile memory may be a RAM and is used as an external cache. For example but not limitation, many forms of RAMs are available, for example, a static RAM (SRAM), a dynamic RAM (DRAM), a synchronous DRAM (SDRAM), a double data rate SDRAM (DDR SDRAM), an enhanced SDRAM (ESDRAM), a SynchLink DRAM (SLDRAM), and a direct Rambus RAM (DR RAM).

This disclosure provides a computer program. When the computer program is executed by a computer, a processor or the computer is enabled to perform corresponding steps and/or procedures in the foregoing method embodiments.

All or a part of the foregoing embodiments may be implemented by using software, hardware, firmware, or any combination thereof. When the software is used to implement the embodiments, all or a part of the embodiments may be implemented in a form of a computer program product. The computer program product includes one or more computer instructions. When the computer program instructions are loaded and executed on the computer, the procedures or functions according to this disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by the computer, or a data storage device, for example, a server or a data center, integrating one or more usable mediums. The usable medium may be a magnetic medium (for example, a floppy disk, a hard disk, or a magnetic tape), an optical medium (for example, a digital versatile disc (DVD), a semiconductor medium (for example, a solid-state drive (SSD), or the like.

Ordinal numbers such as "1", "2", "3", "first", "second", and "third" in the embodiments are used to distinguish between a plurality of objects, but are not used to limit a sequence of the plurality of objects.

It can be learned from the foregoing descriptions of the implementations that, a person skilled in the art may clearly understand that a part or all of the steps of the methods in the foregoing embodiments may be implemented by using software and a universal hardware platform. Based on such an understanding, the technical solutions of this disclosure may be implemented in a form of a software product. The computer software product may be stored in a storage medium, for example, a ROM/RAM, a magnetic disk, or an optical disc, and include several instructions for instructing a computer device (which may be a personal computer, a server, or a network communications device such as a router) to perform the methods described in the embodiments or some parts of the embodiments.

The embodiments in this specification are all described in a progressive manner, for same or similar parts in the embodiments, refer to these embodiments, and each embodiment focuses on a difference from other embodiments. Especially, the apparatus embodiment is basically similar to the method embodiment, and therefore is described briefly. For related parts, refer to the description part of the method embodiment. The described device and system embodiments are merely examples. The modules described as separate parts may or may not be physically separate, and parts displayed as modules may or may not be physical modules, may be located in one position, or may be distributed on a plurality of network units. A part or all of the modules may be selected based on an actual requirement to achieve the objectives of the solutions of the embodiments. A person of ordinary skill in the art may understand and implement the embodiments without creative efforts.

The foregoing descriptions are merely the embodiments, but are not intended to limit this disclosure. Any modification, equivalent replacement, or improvement made without departing from the spirit and principle of this disclosure shall fall within the protection scope of this disclosure.

What is claimed is:

1. A method implemented by an optical module and comprising:
    receiving, from a chip outside of the optical module, a first data stream encoded with a first forward error correction (FEC) code; and
    encoding, without FEC decoding the first data stream, the first data stream with a second FEC code to obtain a second data stream by:
        distributing the first data stream to obtain n third data streams, wherein n is a natural number greater than 1, and wherein data of a codeword in the first data stream is distributed to different third data streams; and
        encoding each of the n third data streams with the second FEC code to obtain the second data stream, wherein the second data stream is a concatenated FEC code stream based on a concatenation of the first FEC code and the second FEC code.

2. The method of claim 1, wherein the first FEC code is a Reed-Solomon (RS) code, a Bose-Chaudhuri-Hocquenghem (BCH) code, an extended BCH (eBCH) code, a Hamming code, an extended Hamming code, a staircase code, a low-density parity check (LDPC) code, a turbo code, or a turbo product code (TPC).

3. The method of claim 1, wherein the second FEC code is a Bose-Chaudhuri-Hocquenghem (BCH) code, an extended BCH (eBCH) code, a Hamming code, an extended Hamming code, a Reed-Solomon (RS) code, a staircase code, a low-density parity check (LDPC) code, a turbo code, or a turbo product code (TPC).

4. The method of claim 1, wherein distributing the first data stream comprises distributing k codewords from the first data stream to the third data streams, wherein k is a natural number greater than 1, and wherein re-encoding each of the third data streams comprises encoding data that belong to the k codewords into one codeword block in the second data stream, and wherein a total data volume comprised in the k codewords in the first data stream is equal to a payload data volume comprised in n second codewords in the second data stream.

5. The method of claim 1, wherein data in the first data stream is distributed at an FEC symbol granularity, and wherein data in an FEC symbol in the first data stream is encoded into a codeword in the second data stream.

6. The method of claim 1, wherein data in the first data stream are distributed at a bit granularity.

7. The method of claim 1, wherein the optical module and the chip are located in a same data transmission device.

8. The method of claim 1, further comprising further receiving the first data stream through an attachment unit interface (AUI).

9. The method of claim 1, further comprising further encoding each of the n third data streams with the second FEC code using FEC encoders.

10. The method of claim 1, wherein the FEC encoders comprise Bose-Chaudhuri-Hocquenghem (BCH) encoders.

11. An optical module comprising:
a receiver configured to receive, from a chip, a first data stream encoded with a first forward error correction (FEC) code; and
an encoder configured to encode, without FEC decoding the first data stream, the first data stream with a second FEC code to obtain a second data stream by:
distributing the first data stream to obtain n third data streams, wherein n is a natural number greater than 1, and wherein data of a codeword in the first data stream is distributed to different third data streams; and
encoding each of the n third data streams with the second FEC code to obtain the second data stream, wherein the second data stream is a concatenated FEC code stream based on a concatenation of the first FEC code and the second FEC code.

12. The optical module of claim 11, wherein the first FEC code is a Reed-Solomon (RS) code, a Bose-Chaudhuri-Hocquenghem (BCH) code, an extended BCH (eBCH) code, a Hamming code, an extended Hamming code, a staircase code, a low-density parity check (LDPC) code, a turbo code, or a turbo product code (TPC).

13. The optical module of claim 11, wherein the second FEC code is a Bose-Chaudhuri-Hocquenghem (BCH) code, an extended BCH (eBCH) code, a Hamming Code, an extended Hamming code, a Reed-Solomon (RS) code, a staircase code, a low-density parity check (LDPC) code, a turbo code, or a turbo product code (TPC).

14. The optical module of claim 11, wherein the encoder is further configured to:

further distribute the first data stream by distributing k codeword blocks from the first data stream to the third data streams wherein k is a natural number greater than 1; and
further re-encode the third data streams by encoding data that belong to the k codeword blocks into one codeword block in the second data stream, and wherein a total data volume comprised in the k codeword blocks in the first data stream is equal to a payload data volume comprised in n second codeword blocks in the second data stream.

15. The optical module of claim 11, wherein data in the first data stream is distributed at an FEC symbol granularity, and wherein data in an FEC symbol in the first data stream is encoded into a codework in the second data stream.

16. The optical module of claim 11, wherein data in the first data stream are distributed at a bit granularity.

17. The optical module of claim 11, wherein the chip comprises an Ethernet interface.

18. The optical module of claim 11, wherein the receiver is further configured to further receive the first data stream through an attachment unit interface (AUI).

19. The optical module of claim 11, wherein the encoder comprises FEC encoders, and wherein the encoder is further configured to further encode each of the n third data streams with the second FEC code using the FEC encoders.

20. The optical module of claim 11, wherein the FEC encoders comprise Bose-Chaudhuri-Hocquenghem (BCH) encoders.

21. A method implemented by a first circuit and comprising:
receiving, from a second circuit through an Ethernet interface, a first data stream that is based on encoding original data using a Reed-Solomon (RS) code; and
encoding the first data stream with a first forward error correction (FEC) code to obtain a second data stream by filling data of the first data stream into a first FEC codeword corresponding to the first FEC code,
wherein a reference quantity of consecutive RS-FEC symbols in the first FEC codeword are from different RS-FEC codewords, and
wherein the first FEC code is a Bose-Chaudhuri-Hocquenghem (BCH) code, an extended BCH (eBCH) code, a Hamming code, or an extended Hamming code.

22. The method of claim 21, further comprising:
further receiving the first data stream from a plurality of physical lanes; and
further performing, when a first quantity of first FEC encoders in the first circuit is the same as a second quantity of the physical lanes, the first FEC encoding using the first FEC encoders.

23. The method of claim 21, further comprising further receiving the first data stream from a plurality of physical lanes, wherein performing the first FEC encoding comprises scheduling, by a scheduler when a first quantity of first FEC encoders in the first circuit is not the same as a second quantity of the physical lanes, one of the first FEC encoders to perform the first FEC encoding.

24. The method of claim 21, further comprising:
further receiving the first data stream from a plurality of physical lanes;
interleaving the data based on a first quantity of RS codewords to obtain symbol stream data, wherein the first quantity is equal to the reference quantity;
outputting the symbol stream data to virtual lanes;

bit-multiplexing the symbol stream data based on a second quantity of the physical lanes to obtain bit-multiplexed symbol stream data;
transmitting the bit-multiplexed symbol stream data to the first circuit through the physical lanes;
demultiplexing, before the filling, the first data stream to restore data on all virtual lanes; and
aligning, before the filling, the data on all the virtual lanes to obtain aligned data,
wherein the filling comprises filling the aligned data into the corresponding first FEC codeword.

25. The method of claim 21, wherein the first data stream comprises a first quantity of first RS codewords, wherein each of the first RS codewords comprises a first target quantity of RS symbols, wherein the data is interleaved based on the first RS codewords, wherein each of the first FEC encoders corresponds to a second quantity of first FEC codewords and comprises a second target quantity of symbols, wherein the second target quantity is based on the first target quantity and the second quantity is based on the first quantity, wherein filling the data comprises:
sequentially filling a first half of the data in each row of the first data stream into a third quantity of the first FEC codewords; and
sequentially filling a second half of the data in each row of the first data stream into a fourth quantity of the first FEC codewords, wherein the fourth quantity is half of the third quantity.

26. The method of claim 25, wherein the first target quantity is 544, the first quantity is 2, the second quantity is 32, and the second target quantity is 360, and wherein the method further comprises:
further sequentially filling the first half into the first 16 first FEC codewords in 32 first FEC codewords; and
further sequentially filling the second half into the last 16 first FEC codewords in the 32 first FEC codewords, wherein two consecutive RS symbols in each first FEC codeword are from different RS codewords.

27. The method of claim 21, wherein the first data stream comprises a first quantity of RS codewords, wherein each of the RS codewords comprises a first target quantity of RS symbols, wherein the data is interleaved based on the RS codewords, wherein RS symbols at the beginning or the end of each column of data in the first data stream are permuted, wherein each of the first FEC encoders corresponds to a second quantity of first FEC codewords, wherein each of the first FEC codewords comprises a second target quantity of first FEC symbols, wherein the second target quantity is based on the first target quantity and the second quantity is based on the first quantity, wherein the filling comprises sequentially filling each column of data of the first data stream into the first FEC codewords, and wherein consecutive RS symbols in each first FEC codeword are from different RS codewords.

28. The method of claim 27, wherein the first target quantity is 544, the first quantity is 2, the second quantity is 32, and the second target quantity is 360, and wherein two consecutive RS symbols in each first FEC codeword are from different RS codewords.

29. The method of claim 21, wherein the first data stream comprises a first quantity of RS codewords, wherein each of the RS codewords comprises a first target quantity of RS symbols, wherein the data in the first data stream is interleaved based on the RS codewords, wherein each of the first FEC encoders corresponds to a second quantity of first FEC codewords, wherein each of the first FEC codewords comprises a second target quantity of first FEC symbols, wherein the second target quantity is based on the first target quantity and the second quantity is based on the first quantity, wherein filling the data comprises:
de-interleaving the data to obtain original RS codewords;
interleaving the original RS codewords based on a fourth quantity of RS codewords to obtain interleaved data, wherein the fourth quantity is greater than the first quantity; and
sequentially filling each row of data of the interleaved data into the first FEC codewords, wherein a fourth quantity of consecutive RS symbols comprised in each first FEC codeword are from different RS codewords.

30. The method of claim 21, wherein after performing the first FEC code encoding, the method further comprises transmitting the second data stream to a third circuit using a medium and through one or more physical lanes.

31. The method of claim 21, wherein the Ethernet interface is an attachment unit interface (AUI).

32. The method of claim 21, wherein the first circuit is an optical module.

33. The method of claim 21, further comprising further encoding the first data stream with the second FEC code using FEC encoders of the first circuit.

34. The method of claim 33, wherein the FEC encoders comprise Bose-Chaudhuri-Hocquenghem (BCH) encoders.

35. A method implemented by a third circuit and comprising:
receiving, from a first circuit, through a plurality of physical lanes or through one physical lane in a time-division multiplexing mode, and using a medium, second data streams encoded with a Reed-Solomon (RS) code and a first forward error correction (FEC) code, wherein the first FEC code is a Bose-Chaudhuri-Hocquenghem (BCH) code, an extended BCH (eBCH) code, a Hamming code, or an extended Hamming code;
demultiplexing the second data streams to form demultiplexed second data streams when receiving the second data streams through the one physical lane and in the time-division multiplexing mode;
decoding the demultiplexed second data streams using the first FEC code to obtain a first data stream; and
decoding the first data stream using the RS code to obtain original data.

36. The method of claim 35, wherein before decoding the demultiplexed second data streams, the method further comprises aligning the demultiplexed second data streams to obtain aligned second data streams, and wherein decoding the demultiplexed second data streams comprises decoding the aligned second data streams using the first FEC code.

37. A data transmission device comprising:
a first circuit configured to:
receive, from a second circuit through an Ethernet interface, a first data stream that is based on encoding original data using a Reed-Solomon (RS) code; and
encode the first data stream with a first forward error correction (FEC) code to obtain a second data stream by filling data of the first data stream into a first FEC codeword corresponding to the first FEC code,
wherein a reference quantity of consecutive RS-FEC symbols in the first FEC codeword are from different RS-FEC codewords, and
wherein the first FEC code is a Bose-Chaudhuri-Hocquenghem (BCH) code, an extended BCH (eBCH) code, a Hamming code, or an extended Hamming code.

38. The data transmission device of claim 37, wherein the first circuit further comprises first FEC encoders, wherein the first circuit is further configured to:
further receive the first data stream from a plurality of physical lanes; and
further perform, when a first quantity of the first FEC encoders is the same as a second quantity of the physical lanes, the first FEC encoding.

39. The data transmission device of claim 37, wherein the first circuit further comprises:
first FEC encoders; and
a scheduler,
wherein the first circuit is further configured to further receive the first data stream from a plurality of physical lanes, and
wherein the scheduler is configured to schedule, when a first quantity of the first FEC encoders is not the same as a second quantity of the physical lanes, one of the first FEC encoders to perform the first FEC code encoding.

40. The data transmission device of claim 37, wherein the first circuit is further configured to:
further receive the first data stream from a plurality of physical lanes;
interleave the data based on a first quantity of RS codewords to obtain symbol stream data, wherein the first quantity is equal to the reference quantity;
output the symbol stream data to virtual lanes;
bit-multiplex the symbol stream data based on a second quantity of the physical lanes to obtain bit-multiplexed symbol stream data;
transmit the bit-multiplexed symbol stream data to the data encoding apparatus through the physical lanes;
demultiplex, before the filling, the first data stream to restore data on all virtual lanes;
align, before the filling, the data on all the virtual lanes to obtain aligned data; and
fill the data by filling the aligned data into the corresponding first FEC codeword.

41. The data transmission device of claim 37, wherein the first data stream comprises a first quantity of first RS codewords, wherein each of the first RS codewords comprises a first target quantity of RS symbols, wherein the data is interleaved based on the first RS codewords, wherein each of the first FEC encoders corresponds to a second quantity of first FEC codewords and comprises a second target quantity of first FEC symbols, wherein the second target quantity is based on the first target quantity and the second quantity is based on the first quantity, and wherein the first circuit is further configured to fill the data by:
sequentially filling a first half of the data in each row of the first data stream into a third quantity of the first FEC codewords; and
sequentially filling a second half of the data in each row of the first data stream into a fourth quantity of the first FEC codewords, wherein the fourth quantity is half of the third quantity.

42. The data transmission device of claim 41, wherein the first target quantity is 544, the first quantity is 2, the second quantity is 32, and the second target quantity is 360, and wherein the first circuit is further configured to:
further sequentially fill the first half into the first 16 first FEC codewords in 32 first FEC codewords; and
sequentially fill the second half into the last 16 first FEC codewords in the 32 first FEC codewords, wherein two consecutive RS symbols in each BCH codeword are from different RS codewords.

43. The data transmission device of claim 37, wherein the first data stream comprises a first quantity of RS codewords, wherein each of the RS codewords comprises a first target quantity of RS symbols, wherein the data is interleaved based on the RS codewords, wherein RS symbols at the beginning or the end of each column of data in the first data stream are permuted, wherein each of the first FEC encoders corresponds to a second quantity of first FEC codewords, wherein each of the first FEC codewords comprises a second target quantity of first FEC symbols, wherein the second target quantity is based on the first target quantity and the second quantity is based on the first quantity, wherein the first circuit is further configured to fill the data by sequentially filling each column of data of the first data stream into the first FEC codewords, and wherein consecutive RS symbols in each first FEC codeword are from different RS codewords.

44. The data transmission device of claim 43, wherein the first target quantity is 544, the first quantity is 2, the second quantity is 32, and the second target quantity is 360, and wherein two consecutive RS symbols in each first FEC codeword are from different RS codewords.

45. The data transmission device of claim 37, wherein the first data stream comprises a first quantity of RS codewords, wherein each of the RS codewords comprises a first target quantity of RS symbols, wherein the data in the first data stream is interleaved based on the RS codewords, wherein each of the first FEC encoders corresponds to a second quantity of first FEC codewords, wherein each of the first FEC codewords comprises a second target quantity of first FEC symbols, wherein the second target quantity is based on the first target quantity and the second quantity is based on the first quantity, wherein the first circuit is further configured to fill the data by:
de-interleaving the data to obtain original RS codewords;
interleaving the original RS codewords based on a fourth quantity of RS codewords to obtain interleaved data, wherein the fourth quantity is greater than the first quantity; and
sequentially filling each row of data of the interleaved data into the first FEC codewords, wherein a fourth quantity of consecutive RS symbols comprised in each first FEC codeword are from different RS codewords.

46. The data transmission device of claim 37, wherein the first circuit is further configured to transmit the second data stream to a third circuit using a medium and through one or more physical lanes.

47. The data transmission device of claim 37, wherein the Ethernet interface is an attachment unit interface (AUI).

48. The data transmission device of claim 37, wherein the first circuit comprises FEC encoders, and wherein the first circuit is further configured to further encode the first data stream with the second FEC code using the FEC encoders.

49. The data transmission device of claim 48, wherein the FEC encoders comprise Bose-Chaudhuri-Hocquenghem (BCH) encoders.

50. The data transmission device of claim 37, wherein the first circuit is an optical module.

51. A data transmission device comprising:
a third circuit configured to:
receive, from a first circuit, through a plurality of physical lanes or through one physical lane in a time-division multiplexing mode, and using a medium, second data streams encoded with a Reed-Solomon (RS) code and a first forward error correction (FEC) code, wherein the first FEC code is a Bose-Chaudhuri-Hocquenghem (BCH) code, an extended BCH (eBCH) code, a Hamming code, or extended Hamming code;
demultiplex the second data streams to form demultiplexed second data streams when receiving the second data streams through the one physical lane and in the time-division multiplexing mode;
decode the demultiplexed second data streams using the first FEC code to obtain a first data stream; and
decode the first data stream using the RS code to obtain original data.

52. The data transmission device of claim 51, wherein the third circuit is further configured to:
align, before decoding the demultiplexed second data streams, the demultiplexed second data streams to obtain aligned second data streams; and
further decode the demultiplexed second data streams by decoding the aligned second data streams using the first FEC code.

53. A data transmission device comprising:
an optical module configured to:
receive, from a second chip outside of the optical module, a first data stream encoded with a first forward error correction (FEC) code; and
encode, without FEC decoding the first data stream, the first data stream with a second FEC code to obtain a second data stream by:
distributing the first data stream to obtain n third data streams, wherein n is a natural number greater than 1, and wherein data of a codeword in the first data stream is distributed to different third data streams; and
encoding each of the n third data streams with the second FEC code to obtain the second data stream,
wherein the second data stream is a concatenated FEC code stream based on a concatenation of the first FEC code and the second FEC code.

54. The data transmission device of claim 53, wherein the first FEC code is a Reed-Solomon (RS) code, a Bose-Chaudhuri-Hocquenghem (BCH) code, an extended BCH (eBCH) code, a Hamming code, an extended Hamming code, a staircase code, a low-density parity check (LDPC) code, a turbo code, or a turbo product code (TPC).

55. The data transmission device of claim 53, the second FEC code is a Bose-Chaudhuri-Hocquenghem (BCH) code, an extended BCH (eBCH) code, a Hamming code, an extended Hamming code, a Reed-Solomon (RS) code, a staircase code, a low-density parity check (LDPC) code, a turbo code, or a turbo product code (TPC).

56. The data transmission device of claim 53, wherein data in the first data stream is distributed at an FEC symbol granularity or at a bit granularity.

57. The data transmission device of claim 53, wherein the optical module comprises FEC encoders, and wherein the optical module is further configured to further encode each of the n third data streams with the second FEC code using the FEC encoders.

58. The data transmission device of claim 53, wherein the FEC encoders comprise Bose-Chaudhuri-Hocquenghem (BCH) encoders.

* * * * *